(12) United States Patent
Albrecht, III et al.

(10) Patent No.: US 9,408,327 B2
(45) Date of Patent: Aug. 2, 2016

(54) THERMAL MANAGEMENT SYSTEM AND METHOD

(71) Applicant: TDK-LAMBDA CORPORATION, Tokyo (JP)

(72) Inventors: L. Ray Albrecht, III, Heath, TX (US); Gordon K. Y. Lee, Allen, TX (US); Jin He, Plano, TX (US)

(73) Assignee: TDK-LAMBDA CORPORATION, Tokyo (JP)

( * ) Notice: Subject to any disclaimer, the term of this patent is extended or adjusted under 35 U.S.C. 154(b) by 0 days.

(21) Appl. No.: 14/800,374

(22) Filed: Jul. 15, 2015

(65) Prior Publication Data

US 2015/0319886 A1    Nov. 5, 2015

Related U.S. Application Data

(60) Division of application No. 13/659,066, filed on Oct. 24, 2012, now Pat. No. 9,119,327, which is a continuation-in-part of application No. 12/912,476, filed on Oct. 26, 2010, now Pat. No. 8,531,841.

(60) Provisional application No. 61/664,940, filed on Jun. 27, 2012.

(51) Int. Cl.
  *H05K 7/20*  (2006.01)
  *H05K 1/02*  (2006.01)
  (Continued)

(52) U.S. Cl.
  CPC .......... *H05K 7/20463* (2013.01); *H05K 1/0203* (2013.01); *H05K 1/144* (2013.01);
  (Continued)

(58) Field of Classification Search
  CPC . G06F 1/1601–1/1611; G06F 1/1613–1/1698; G06F 1/18–1/189; H05K 7/20218–7/20381; H05K 7/20409–7/20418; H05K 7/20009–7/202; H05K 5/00–5/069; H05K 7/00–7/186; H01L 23/46–23/3677
  USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
  See application file for complete search history.

(56) References Cited

U.S. PATENT DOCUMENTS

| | | | | |
|---|---|---|---|---|
| 4,222,090 A | * | 9/1980 | Jaffe | H01L 23/32 165/80.3 |
| 4,806,064 A | * | 2/1989 | Breese | H01L 23/40 24/453 |

(Continued)

*Primary Examiner* — Anthony Haughton
*Assistant Examiner* — Razmeen Gafur
(74) *Attorney, Agent, or Firm* — David W. Carstens; Kevin M. Klughart; Carstens & Cahoon LLP

(57) ABSTRACT

A thermal management system/method allowing efficient electrical/thermal attachment of heat sourcing PCBs to heat sinking PCBs using reflow/wave/hand soldering is disclosed. The disclosed system/method may incorporate a combination of support pins, spacer pads, and/or contact paste that mechanically attaches a heat sourcing PCB (and its associated components) to a heat sinking PCB such that thermal conductivity between the two PCBs can be optimized while simultaneously allowing controlled electrical conductivity between the two PCBs. Controlled electrical isolation between the two PCBs is provided for using spacer pads that may also be thermally conductive. Contact paste incorporated in some embodiments permits enhanced conductivity paths between the heat sourcing PCB, a thermally conductive plate mounted over the heat sourcing PCB, and the heat sinking PCB. The use of self-centering support pins incorporating out-gassing vents in some embodiments allows reflow/wave/hand soldering as desired.

21 Claims, 40 Drawing Sheets

(51) Int. Cl.
   *H05K 1/14*      (2006.01)
   *H01L 23/473*    (2006.01)

(52) U.S. Cl.
   CPC .......... *H05K 7/205* (2013.01); *H05K 7/20454*
           (2013.01); *H05K 1/0204* (2013.01); *H05K*
              *2201/042* (2013.01); *H05K 2201/1056*
           (2013.01); *H05K 2201/10303* (2013.01); *H05K*
              *2201/10409* (2013.01); *H05K 2201/10871*
                   (2013.01); *Y10T 29/49144* (2015.01)

(56) References Cited

U.S. PATENT DOCUMENTS

| | | | | |
|---|---|---|---|---|
| 5,280,412 | A * | 1/1994 | Podell | H05K 7/20509 174/16.3 |
| 6,195,267 | B1 * | 2/2001 | MacDonald, Jr. | H01L 23/42 174/377 |
| 7,842,607 | B2 * | 11/2010 | Tay | H01L 23/3677 257/720 |
| 2004/0218375 | A1 * | 11/2004 | Fronk | H05K 7/209 361/813 |
| 2005/0264998 | A1 * | 12/2005 | McCutcheon | H01L 23/4006 361/702 |
| 2006/0067041 | A1 * | 3/2006 | Kabadi | H05K 3/308 361/679.02 |
| 2006/0151801 | A1 * | 7/2006 | Doan | H01L 33/645 257/99 |
| 2006/0202325 | A1 * | 9/2006 | Coico | H01L 23/4006 257/718 |
| 2007/0115643 | A1 * | 5/2007 | Chen | H01L 23/4006 361/719 |
| 2008/0023691 | A1 * | 1/2008 | Jang | H01L 33/0079 257/13 |
| 2008/0112139 | A1 * | 5/2008 | Vinciarelli | H05K 1/141 361/709 |
| 2009/0268403 | A1 * | 10/2009 | Chen | G06F 1/203 361/692 |
| 2010/0027220 | A1 * | 2/2010 | Hughes | H05K 7/20445 361/702 |
| 2010/0091460 | A1 * | 4/2010 | Hinze | H01L 23/367 361/709 |
| 2010/0230804 | A1 * | 9/2010 | Kise | H01L 23/10 257/712 |
| 2010/0245179 | A1 * | 9/2010 | Puzella | H01Q 1/02 343/702 |
| 2010/0283062 | A1 * | 11/2010 | Hsieh | H01L 21/6835 257/79 |
| 2011/0090631 | A1 * | 4/2011 | Atkinson | G06F 1/203 361/679.26 |
| 2011/0113598 | A1 * | 5/2011 | Hofmann | B60R 13/0206 24/458 |
| 2011/0198570 | A1 * | 8/2011 | Venkatasubramanian | H01L 23/3677 257/30 |
| 2011/0242764 | A1 * | 10/2011 | Hill | G06F 1/203 361/705 |
| 2011/0242767 | A1 * | 10/2011 | Okamoto | H01P 1/218 361/714 |
| 2011/0310560 | A1 * | 12/2011 | Jarmany | H05K 7/2049 361/697 |
| 2012/0140413 | A1 * | 6/2012 | Rawson | H03F 3/189 361/688 |
| 2012/0140421 | A1 * | 6/2012 | Kirstine | H05K 7/20509 361/722 |
| 2012/0182693 | A1 * | 7/2012 | Boday | C09K 5/14 361/713 |
| 2012/0228757 | A1 * | 9/2012 | Kitami | H01L 23/36 257/713 |
| 2012/0236505 | A1 * | 9/2012 | Nishiuma | H05K 7/20481 361/709 |
| 2012/0281363 | A1 * | 11/2012 | Smith | F28F 13/00 361/709 |
| 2012/0300405 | A1 * | 11/2012 | Weeber | H01L 23/552 361/709 |

\* cited by examiner

*FIG. 1*
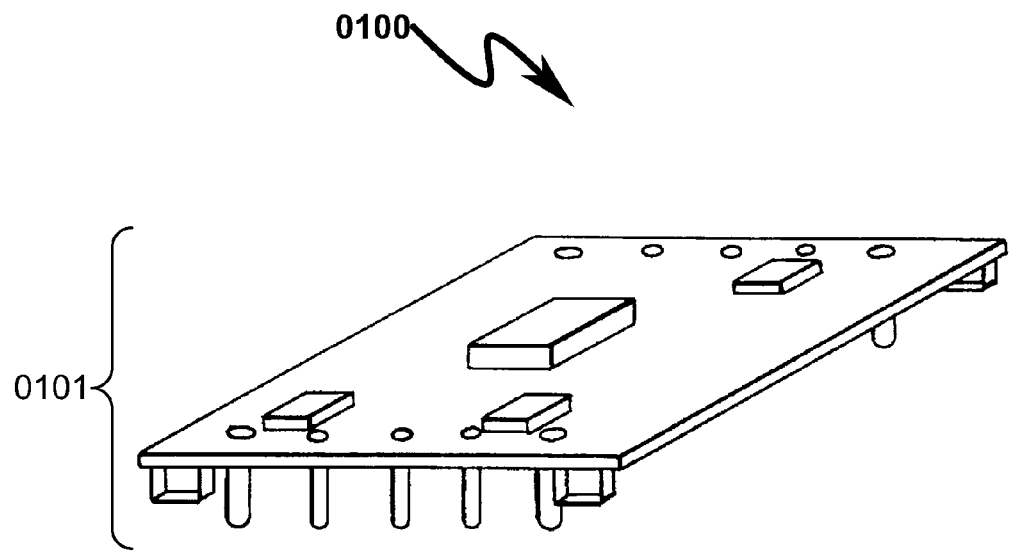
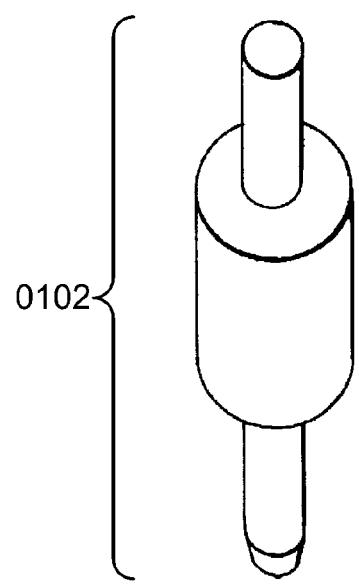
*Prior Art*

FIG. 2
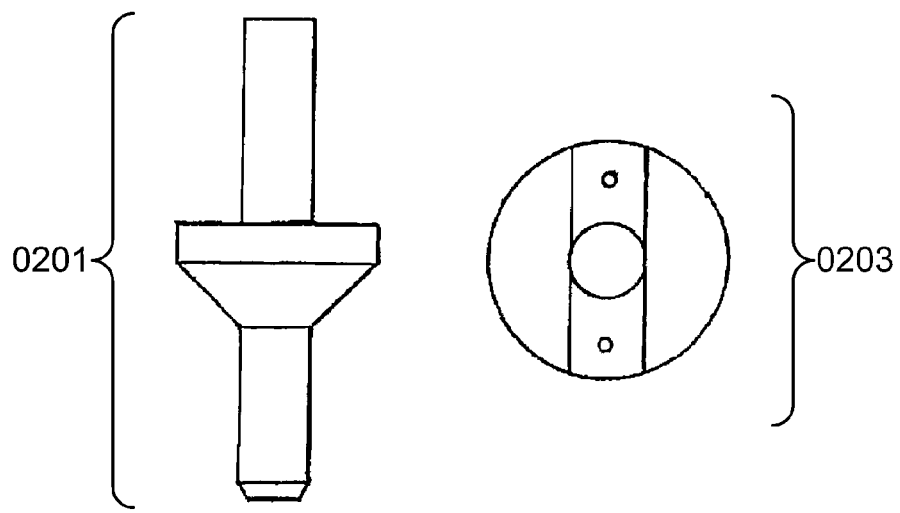
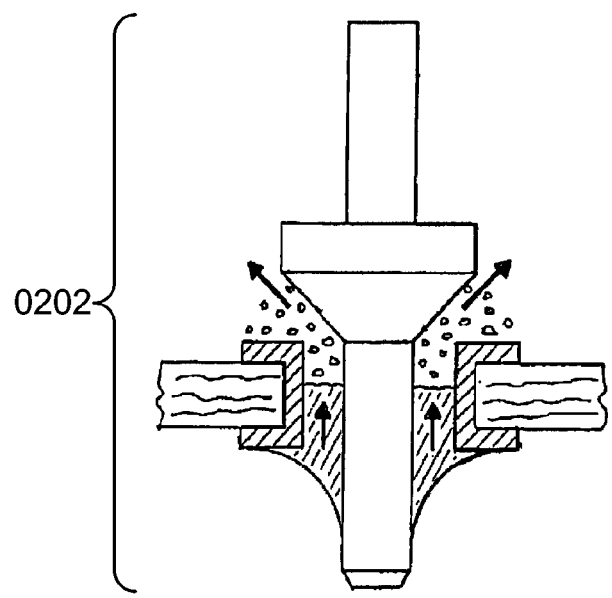
*Prior Art*

FIG. 3
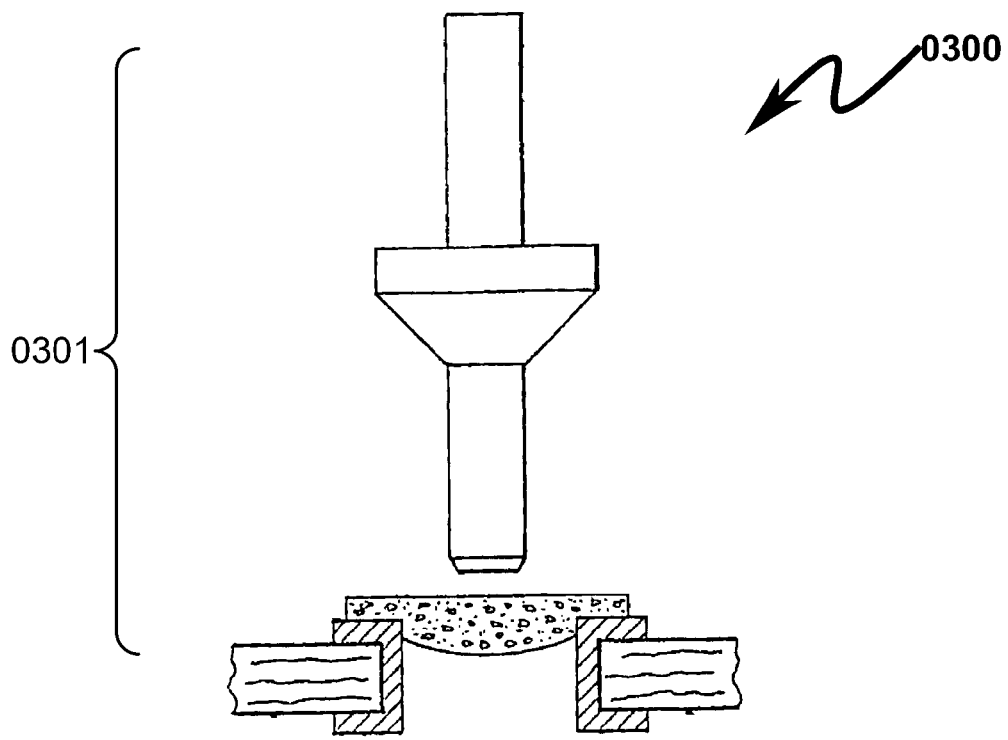
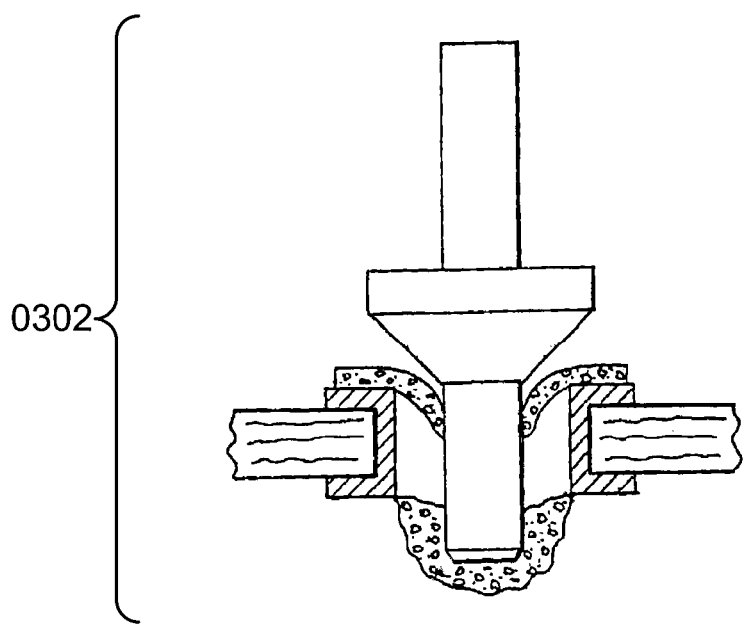
*Prior Art*

1100

FIG. 13
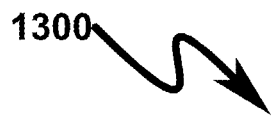
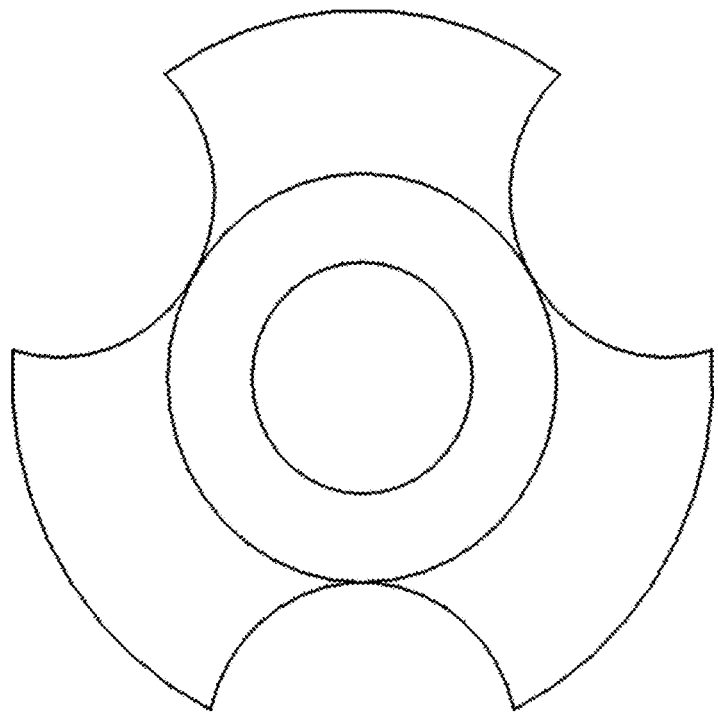

*FIG. 16*
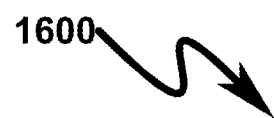
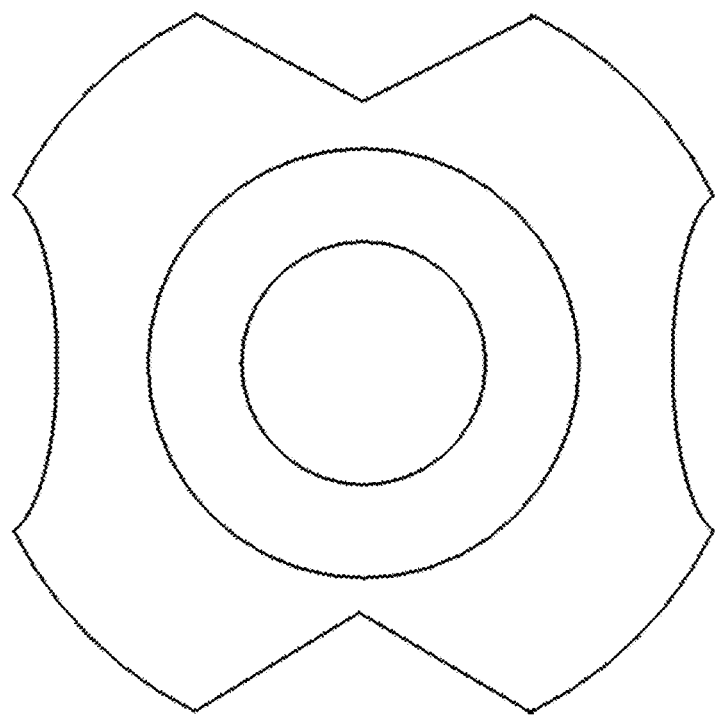

1700

1710
V-shape Inclusion Angle
$0° < \alpha \leq 180°$

V-shape Inclusion Angle
180°
1720

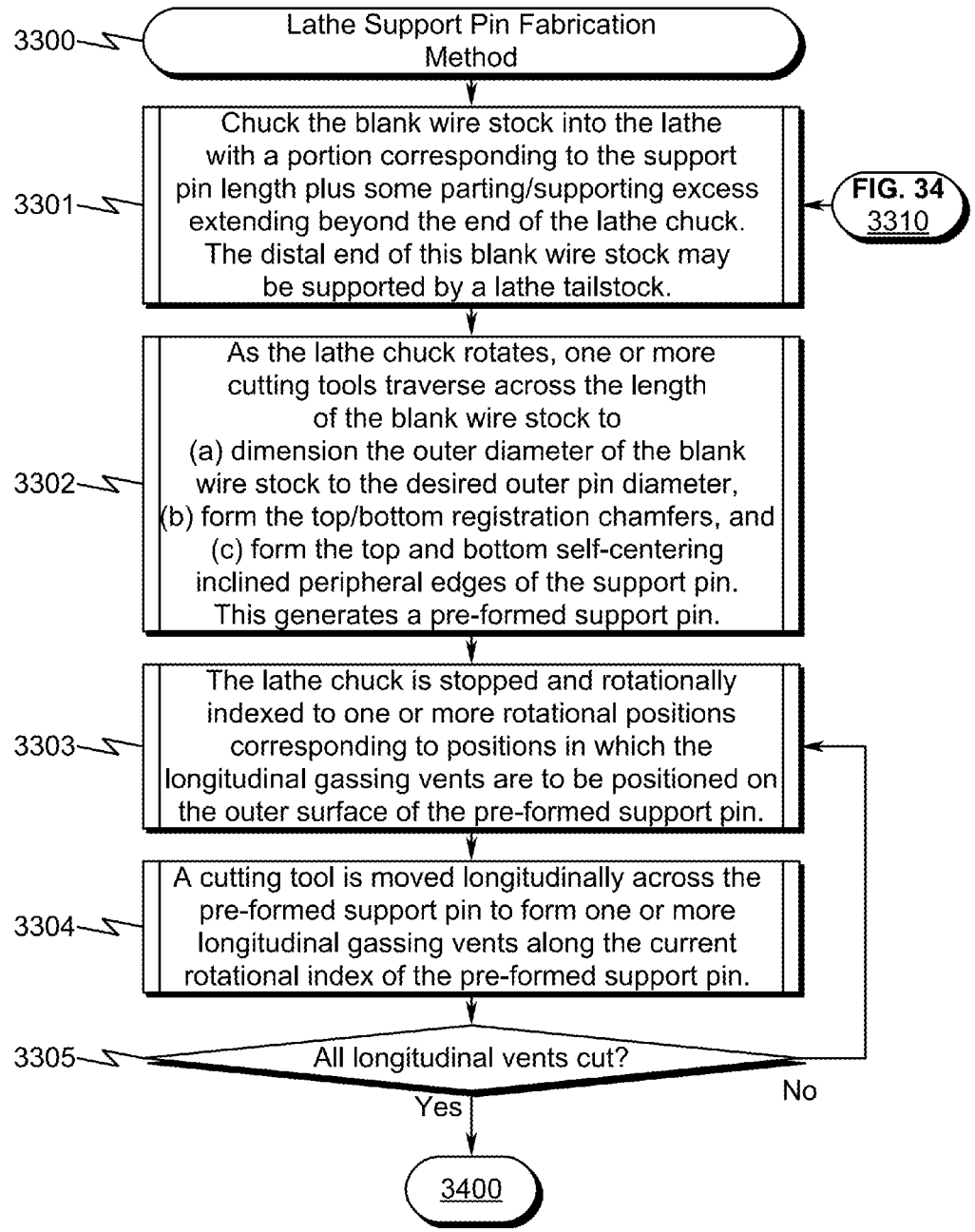

3306 — Pre-formed support pin is parted from remainder of the blank wire stock at the lathe tailstock end of the blank wire stock (if the blank wire stock is supported by a lathe tailstock) and at the lathe chuck end of the blank wire stock. Parting process is nominally implemented by rotating lathe chuck and using a parting tool to cut through desired portions of the blank wire.

↓

3307 — After the lathe chuck jaws have been released and the end of the blank wire stock has been extended beyond the end of the chuck in preparation for a new machining operation, the process repeats at step (1).

THERMAL MANAGEMENT SYSTEM AND METHOD

CROSS REFERENCE TO RELATED APPLICATIONS

Utility Patent Applications

This patent application is a divisional patent application of parent U.S. Utility Patent Application for THERMAL MANAGEMENT SYSTEM AND METHOD, Ser. No. 13/659,066, filed electronically with the USPTO on Oct. 24, 2012 with EFS ID 14062894 and Confirmation Number 1046.

Applicants claim benefit pursuant to 35 U.S.C. §120 and hereby incorporates by reference U.S. Utility Patent Application for THERMAL MANAGEMENT SYSTEM AND METHOD, Ser. No. 13/659,066, filed electronically with the USPTO on Oct. 24, 2012 with EFS ID 14062894 and Confirmation Number 1046.

The parent U.S. Utility Patent Application for THERMAL MANAGEMENT SYSTEM AND METHOD, Ser. No. 13/659,066, is a continuation-in-part (CIP) of parent U.S. Utility Patent Application for IC THERMAL MANAGEMENT SYSTEM, Ser. No. 12/912,476, filed electronically with the USPTO on Oct. 26, 2010 with EFS ID 8707113 and Confirmation Number 2130.

Applicants claim benefit pursuant to 35 U.S.C. §120 and hereby incorporates by reference U.S. Utility Patent Application for IC THERMAL MANAGEMENT SYSTEM, Ser. No. 12/912,476, filed electronically with the USPTO on Oct. 26, 2010 with EFS ID 8707113 and Confirmation Number 2130.

Provisional Patent Applications

Applicants claim benefit pursuant to 35 U.S.C. §119 and hereby incorporates by reference U.S. Provisional Patent Application for THERMAL MANAGEMENT SYSTEM AND METHOD, Ser. No. 61/664,940, filed electronically with the USPTO on Jun. 27, 2012 with EFS ID 13119127 and Confirmation Number 4912.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention generally relates to thermal management systems and methods. While not limitive of the invention teachings, the present invention may in some circumstances be advantageously applied to situations where DC-DC power converter modules are mounted to PCB motherboards using one or more soldering processes. General U.S. patent classifications that are associated with these application areas generally include but are not limited to 363/147; 29/852; 174/266; 439/83; and 439/84.

PRIOR ART AND BACKGROUND OF THE INVENTION

Overview

The reflow assembly of through-hole power modules is trending towards replacement of hand soldering or wave soldering as the preferred assembly technique for many customers in the DC-DC power converter market. Hand soldering of through-hole power modules is a slow, manually-intensive process, and requires that both the customer's main printed circuit board (PCB) and the DC-DC converter module be pre-heated in order to solder the through-hole pins to the customer's PCB. Wave soldering is much quicker, but requires separate equipment, special masking fixtures, large amounts of liquid flux, and in most cases a cleaning system to remove the flux residues. Additionally, there is also a significant amount of hazardous material treatment associated with wave soldering which also adds to the overall expense of the wave soldering process. Reflow soldering, in contrast, is fully automatic, requires no separate flux or cleaning, produces virtually no hazardous waste, and is a process which is already being done by many customer board assemblers as part of their normal fabrication process. All of these benefits of reflow soldering significantly reduce the cost of mounting operations in a production assembly environment.

Through-hole pins are generally preferred in the mounting of DC-DC converters to motherboard PCBs due to their superior heat and current carrying transfer capabilities versus SMT pin mounting configurations. Surface-mountable power modules (that do not use through-hole pins) are, in some applications, a viable alternative to through-hole modules. However, this option does not eliminate problems associated with assembling DC-DC modules with attached thermal base plates. This option also drives the cost of DC-DC power modules and the customer's PCB higher, since more expensive PWB fabrication techniques must be employed to deliver the electrical current from the top mounting layer of the customer PCB to the sub-surface thermally conducting layers of the PWBs.

Unfortunately, our present through-hole DC-DC power module designs that incorporate heat spreader plates (known generally as "base plates") cannot be reflow assembled. The prior art fails to describe any techniques and materials that can be used to fabricate base-plated power modules that can be reflow assembled, while, at the same time, provide other desirable features for the final assembly of modules with the customer's main PCB board.

Prior Art Thermal Management Techniques (0100, 0200, 0300)

The prior art teaches several thermal management techniques in conjunction with the implementation of DC-DC converters mounted to printed circuit boards (PCBs). Several of these implementations include U.S. Pat. No. 6,545,890 (generally illustrated in FIG. 1 (0100)), U.S. Pat. No. 6,896,526 (generally illustrated in FIG. 2 (0200)), and U.S. Pat. No. 7,085,146 (generally illustrated in FIG. 3 (0300)). All of these patents are entitled FLANGED TERMINAL PINS FOR DC/DC CONVERTERS and disclose a DC/DC converter that is mounted to a printed circuit board with rigid terminal pins which extend into a converter substrate to provide electrical connection to circuitry on the substrate. A terminal pin includes a flange which abuts the printed circuit board and spaces the converter substrate from the printed circuit board. Connection to the printed circuit board is made by solder provided between the flange and the circuit board.

Referencing FIG. 1 (0100), U.S. Pat. No. 6,545,890 details a power board assembly (0101) incorporating a number of different flange pin styles, one of which is illustrated (0102).

Referencing FIG. 2 (0200), U.S. Pat. No. 6,896,526 details a power board assembly incorporating a beveled flange pin style (0201), and also illustrates how this configuration may be utilized to advantage in a wave soldering environment (0202). Note that the beveled edge permits solder "wicking" on the outer edges of the flange pin at the upper circuit board surface to promote good electrical and thermal conductivity between the flange pin and the circuit board. Note that the flange pin includes cutouts necessary for out-gassing during the wave soldering process as shown by the flange pin detail of (0203).

Referencing FIG. 3 (0300) U.S. Pat. No. 7,085,146 details a method of soldering flange pins to a PCB main board using solder paste in a reflow process. As generally illustrated in FIG. 3 (0300), the process starts with application of solder paste to the PCB (0301) followed by insertion of the flange pin into the PCB (0302) and subsequent reflow soldering of the flange pin to the PCB. The pin structures detailed in this patent are generally those detailed in FIG. 2 (0201, 0202) as disclosed in U.S. Pat. No. 6,896,526. While this patent makes use of reflow soldering process technology, the wicking features of the flange pin described may not be sufficient to prevent voids and other structural anomalies from degrading the electrical/thermal characteristics of the flange/PCB junction.

Other prior art PWB connector pin technologies also exist, many of which incorporate elaborate machined surfaces to accomplish the wicking function and support the PWB connector stack. An example of one of these techniques is detailed in U.S. Patent Application Publication 2010/0122458 that describes a PWB connector pin having an acircular profile. This particular example includes an unmachined collar having an acircular configuration and side wall that further includes a series of machined cylindrical connector shafts formed with the collar along the longitudinal axis.

Deficiencies in the Prior Art

The prior art as detailed above suffers from the following deficiencies:

Insufficient Heat Dissipation Capability. In many challenging high density power conversion systems, the heat dissipation capability of the power conversion module when used in conjunction with heat conducting support pins and/or a top heat sink plate is insufficient. Furthermore, the prior art does not teach any methodology to improve the heat conduction from the heat source PCB to a connected heat sink PCB.

Thermal Transfer Compound Expansion. Currently available thermal transfer compound that is deposited (typically by dispensing) between the base plate and the components/PWB tends to expand during the reflow solder processing. Once the solder on the module melts, the expanding thermal transfer compound will displace the components from their intended positions, in some cases, moving them so far off their land pads that the unit becomes inoperable. Thermal pads can be used in place of the thermal transfer compound, but these pads tend to be more expensive, are not typically designed to survive reflow assembly operations, and are thickness-dependent (it most often requires two or more different pad thicknesses to compensate for the module's component topology). Another alternative to this approach would be to use high-temperature solder so that the components do not reflow during assembly. This approach, however, requires the components and the PWB to withstand much higher temperatures (often more than 300° C.), which drastically increases component cost. Most high-temperature solders also contain a very high percentage of lead (Pb), which is problematic from an environmental impact standpoint.

Clearance Height Tolerances. The prior art through-hole pins with shoulders used to connect the power module to the customer's main board (and to set the height of the power module above the customer's main board) can be difficult to solder properly in a reflow assembly process without special relief and/or venting features added to the pin. These features allow the flux and solvent vapors to escape and allow the molten solder a path into the barrel of the pin holes. These features are generally expensive and make the pins more complicated to manufacture. Additionally, if the power module PWB and/or the customer's main board is warped or bowed, the pin shoulders may not all rest on the main board, producing a possible hot spot if the pin carries a high current load.

Electrical Isolation. PCB Modules, which are mounted directly to the customer's main board through the use of these shoulder-type pins, employ the height of the pin shoulders to set the spacing between the customer's main board and the power module board. Depending on the lengths of the pin shoulders and variation in component heights, this may leave some of the components and/or the ferrite core pairs very close to the customer's main PCB board. This may result in insulation leakage and/or voltage isolation issues between the power module component and the main PCB board.

Parts Inventory Issues. The electrical isolation issues detailed above also require that for every different set of component heights required, a different pin shoulder length is needed. This ultimately results in a great number of pins needed to control the spacing between the components on the power module and the customer's main board.

Component Heat Tolerances. Conventional techniques often place excessive heat stress on components during the soldering process.

Construction Method Limitations. The prior art often places limits on construction methods, dual board assemblies, heavy bottom-side components, etc.

Pick-and-Place Assembly. Prior art PCB module configurations are not suitable for pick-and-place assembly techniques or automated handling.

While some of the prior art may teach some solutions to several of these problems, the core issue of creating a thermal management technique that is simultaneously compatible with wave/reflow/hand soldering techniques and also provides for efficient thermal management and robust electrical conductivity between the heat source PCB and the heat sink PCB has yet to be taught by the prior art.

OBJECTIVES OF THE INVENTION

Accordingly, the objectives of the present invention are (among others) to circumvent the deficiencies in the prior art and affect the following objectives:

(1) Provide for a thermal management system and method that is simultaneously compatible with wave/reflow/hand soldering techniques.
(2) Provide for a thermal management system and method that provides good thermal conductivity between a heat source PCB and a heat sink PCB while simultaneously providing high electrical conductivity between the PCBs.
(3) Provide for a thermal management system and method that provides good thermal conductivity between a heat source PCB and a heat sink PCB while simultaneously providing controlled electrical isolation between the PCBs.
(4) Provide for a thermal management system and method that provides good thermal conductivity between a heat source PCB and a heat sink PCB while simultaneously providing controlled mechanical isolation between the PCBs.
(5) Provide for a thermal management system and method that provides good thermal conductivity between a heat source PCB and a heat sink PCB while simultaneously providing minimum heat source PCB height over the heat sink PCB.
(6) Provide for a thermal management system and method that provides good thermal conductivity between a heat source PCB and a heat sink PCB while simultaneously allowing for system reliability in the face of thermal cycle age testing.
(7) Provide for a thermal management system and method that provides for additional dimensions of heat transfer from the heat source PCB to the heat sink PCB apart from connection pins or topside heat sinks.

While these objectives should not be understood to limit the teachings of the present invention, in general, these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

A thermal management system/method allowing efficient electrical/thermal attachment of heat sourcing PCBs to heat sinking PCBs using reflow/wave/hand soldering is disclosed. The disclosed system/method may incorporate a combination of support pins, spacer pads, and/or contact paste that mechanically attaches a heat sourcing PCB (and its associated components) to a heat sinking PCB such that thermal conductivity between the two PCBs can be optimized while simultaneously allowing controlled electrical conductivity between the two PCBs.

Controlled electrical isolation between the two PCBs is provided for using spacer pads that may also be thermal conductive. Contact paste incorporated in some embodiments permits enhanced conductivity paths between the heat sourcing PCB, a thermally conductive plate mounted over the heat sourcing PCB, and the heat sinking PCB. The use of self-centering support pins incorporating out-gassing vents in some embodiments allows reflow/wave/hand soldering as desired.

The system/method as disclosed is suitable for any combination of reflow/wave/hand soldering and thus permits conventional DC-DC power conversion modules to be assembled to customer PCB main boards using automated equipment. The enhanced thermal conductivity inherent in the various embodiments of the invention permits automated reflow assembly techniques to be utilized while maintaining thermal safety margins for components on both the heat sourcing PCB and the heat sinking PCB. Integration of the various thermal conductivity methodologies within a single thermal management system also permits higher power densities to be achieved in the heat sourcing PCB, an especially important advantage when applied to applications in which the heat sourcing PCB is a DC-DC converter.

BRIEF DESCRIPTION OF THE DRAWINGS

For a fuller understanding of the advantages provided by the invention, reference should be made to the following detailed description together with the accompanying drawings wherein:

FIG. 1 illustrates a prior art thermal management system as taught by U.S. Pat. No. 6,545,890;

FIG. 2 illustrates a prior art thermal management system as taught by U.S. Pat. No. 6,896,526;

FIG. 3 illustrates a prior art thermal management system as taught by U.S. Pat. No. 7,085,146;

FIG. 13 illustrates a top view of an exemplary support pin used in some preferred invention embodiments that incorporates a 4-channel V-shaped longitudinal gassing vent;

FIG. 16 illustrates a top view of an exemplary support pin used in some preferred invention embodiments that incorporates a 4-channel mixed-mode V-shaped/curve-shaped longitudinal gassing vent;

FIG. 33 illustrates an exemplary invention method embodiment flowchart directed to an automated lathe-based method of fabricating support pins;

FIG. 34 illustrates an exemplary invention method embodiment flowchart directed to an automated lathe-based method of fabricating support pins;

DESCRIPTION OF THE PRESENTLY PREFERRED EXEMPLARY EMBODIMENTS

Figure 4:
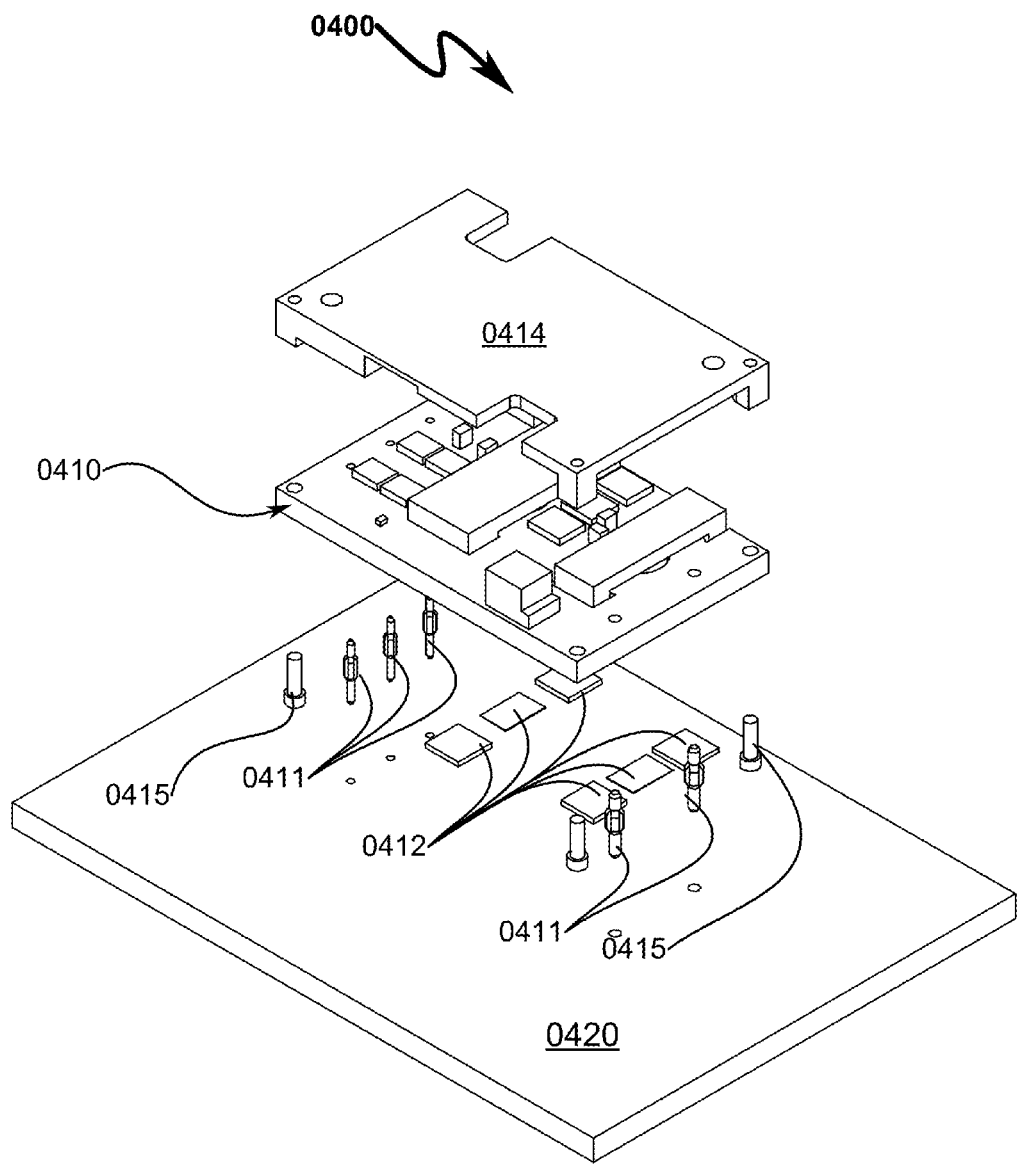
FIG. 4 illustrates an assembly perspective view of an exemplary system context for a preferred embodiment of the present invention.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a THERMAL MANAGEMENT SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

PCB Not Limitive

The present invention anticipates a wide variety of application environments in which the disclosed system/method may operate. In many preferred applications, a heat source PCB is electrically and/or thermally attached to a heat sink PCB. Within this context, the term "printed circuit board"/"printed wiring board" or "PCB"/"PWB" should be given its broadest possible interpretation to include not only conventional printed circuit board technologies but also printed wiring boards and other technologies well known in the art in which electrical connections are implemented on a fixed or flexible substrate.

DC-DC Converter Not Limitive

The present invention anticipates a wide variety of application environments in which the disclosed system/method may operate. In many preferred applications, a heat source PCB assembly comprises a DC-DC converter subsystem that is electrically and/or thermally attached to a heat sink PCB, often referred to as a customer main board. While this is anticipated as a typical preferred application of the disclosed invention, the present invention is not limited to this application and may be applied to a variety of situations where a heat source PCB is connected to a heat sink PCB with the goal of offloading heat from the heat source PCB (and its associated components) to the heat sink PCB (and its associated components). Within this context the term "DC-DC converter" and "heat source PCB" are synonymous and the term "main board" and "heat sink PCB" are synonymous.

Power Module/Main Board Not Limitive

The present invention anticipates a wide variety of application environments in which the disclosed system/method may operate. In many preferred applications, a heat source PCB assembly may comprise a power module subsystem that is electrically and/or thermally attached to a heat sink PCB, often referred to as a customer main board. Within this context, the term "power module" and "heat source PCB" are synonymous and the term "main board" and "heat sink PCB" are synonymous.

Heat Source PCB/Heat Sink PCB Not Limitive

References to the surfaces of the heat source PCB and the heat sink PCB for the purposes of heat transfer dynamics, using contact paste and phase change material as described herein, may include the components placed on the surface of the heat source PCB and the heat sink PCB.

Heat Source PCB/Heat Sink PCB Not Limitive

The present invention anticipates many configurations in which the heat source PCB is the dominant heat generator when mated with a corresponding heat sink PCB. However, the invention as disclosed is symmetric and in some circumstances the heat source PCB may actually act as a thermal sink to the heat sink PCB. In this context, the heat sink PCB may actually be the dominant heat generator or operate at the same temperature as the heat source PCB.

Thermally Conductive Plate Not Limitive

The present invention anticipates a wide variety of configurations in which a thermally conductive plate is attached to or mated with a heat source PCB in order to remove heat from the heat source PCB. This thermally conductive plate may be equivalently referred to as a heat sink, heat plate, base plate, etc. with no loss of generality in the teachings of the invention. Within this context, these terms should be generically identified as any heat sinking mechanism that is attached to or mated with the heat source PCB in these configurations. Note that the use of the disclosed pliable thermal contact paste may in some circumstances obviate the need for screw fasteners between the thermally conductive plate and the heat source PCB. One skilled in the art will recognize that there are a wide variety of methodologies available to connect the thermally conductive plate and the heat source PCB within this context.

Thermal Enhancement Plate Not Limitive

The present invention anticipates that the use of a thermal enhancement plate as depicted herein between the heat source PCB and the heat sink PCB may incorporate a wide variety of solid materials, including those that are thermally conductive but which may in some circumstances be electrically insulating or in others electrically conductive. A wide variety of electrically insulating coverings for this thermal enhancement plate are anticipated to ensure electrical isolation between the heat source PCB and the heat sink PCB.

Heat Sink PCB Surface Not Limitive

The heat sink PCB as depicted herein may include optional topside insulating material as depicted herein in a wide variety of circumstances to ensure electrical isolation between the heat source PCB and the conductive traces/components on the surface of the heat sink PCB. While this variant may not be illustrated in every invention embodiment illustrated herein, it will be assumed that every invention embodiment may incorporate this as an optional feature.

V-Shaped Angle Not Limitive

Various embodiments of the present invention may utilize V-shaped longitudinal gassing vents in the support pin structures. These one or more longitudinal gassing vents may be V-shaped at an angle greater than zero (0) degrees and less than or equal to 180 degrees with respect to the longitudinal axis of the cylindrical shaft. In the extreme case of the gassing vents being configured at 180 degrees, they are essentially flat but are still described herein as V-shaped.

Element Combinations Not Limitive

The present invention may incorporate any combination of elements detailed herein, including but not limited to: support pins, contact paste, spacer pads, thermally conductive plates, and heat source PCBs. The configurations presented herein only represent exemplary combinations of these system elements.

System Context Overview

The present invention in general provides an integrated solution for thermally enhanced power assemblies that can easily be mounted using reflow assembly processes. To resolve the issue of reflowability of modules with heat spreader plates, the present invention utilizes one or more of the following thermal management techniques. These may be employed separately or in any combination.

Thermal Contact Paste

The present invention replaces the commonly used two-part thermal transfer compound with a one-part, highly compliant material which does not set up or harden with either temperature or time. This material, although it may undergo thermal expansion or contraction as its temperature changes, does not apply any force to the components in which it comes in contact while the solder joints are molten. This eliminates the movement of the components from their designated positions during reflow assembly. This thermal contact paste material also has similar thermal properties to existing thermal transfer compound so as to maintain the same thermal performance as that in conventional two-part thermal transfer compound.

Support Pins

The present invention replaces the industry-standard shoulder pins with beveled or filleted self-centering pins. These pins may or may not have relief or venting features in them, depending on the application in which they are being used.

In a wave solder assembly application, the relief/venting features may be desirable, since the pin joints in the power module PWB do not reflow during the mounting. The relief/venting features would then leave open a path for the liquid solder to form a fillet around the pin. In a reflow assembly process, however, the venting features can be removed. The pins will center themselves in the receiving holes, both horizontally (within the receiving hole itself) and vertically (between the two PWBs), especially if spacer pads as described below are simultaneously employed. This "3D" self-centering behavior results from surface tension balancing between the forming solder joints on the customer's main PWB and the power module's PCB/PWB. A significant advantage to this approach is that the solder "wetting" of the interface between the shoulder pin and the PCB/PWB will result in lower resistivity in the electrical connection, higher thermal conductivity, and greater overall mechanical strength of the connection between the power module and the main board.

Self-centering, "shoulder-less" pins can also reduce module cost. Because of their simpler design, these pins can be fabricated on a lathe, instead of a special screw machine, and can therefore use less expensive alloys in their construction (the more involved machining of the shoulder pins with venting features require harder alloys, which, for high current applications, can be significantly more expensive).

Spacer Pads

To provide electrical insulation (or isolation) between the power module PWB and the customer's main PWB and to reduce the number of different pins required for the different power module variations, the present invention may attach spacer pads in multiple (typically three or more) locations to the power module's pin side. These pads can vary in thickness, depending on the height desired, and can be cut or punched to whatever shapes are required. The spacer pads may be mounted to the PWB itself or to one or more of the components' surfaces. The pads are made of a heat resistant, high temperature material and may be adhesive-backed for easy assembly. In one embodiment of the spacer pads, an electrically insulating, yet thermally conductive material can be selected for the pads. This also allows the spacer pads to function as a conduit for heat transfer. The pads may be rectangular and of uniform size and thickness, or their shapes and thicknesses can be varied from module to module or even on the same module, depending on the components on which they are mounted. This allows the spacing between the components on the power module and customer's main board to be determined by the spacers, and not the pin shoulders, thus reducing the number of pin sizes needed, and provides a guaranteed safety clearance for controlled electrical isolation between the power module and main board.

Spacer pads can be made to various thicknesses, and more than one thickness can be used on a given module, depending on the topology of the module and the elevation of the surfaces on which the pads rest. In a convective cooling application, where a finned heat sink is mounted on the top side of a base plate (heat sink) associated with the power board, the spacers can raise the power module off the main board PWB and allow airflow under the power module.

In the case where the power module is used in a conduction cooling application where heat is transferred from module to heatsink/chassis above via thermal material, the thermal material (typically a pad) fills the space between the power module and the above heatsink/chassis and serves as a conduit for heat transfer. The pads require some compression to work effectively. The spacers can be used to finely adjust the power module height to compress the thermal pads in critical areas to optimize the conduction cooling.

The self-centering support pin design described above may work in conjunction with spacer pads, permitting the pins to center themselves between the two PWBs, even if the PWB-to-PWB spacing at each pin site is different (such as would be the case if one or both the PWBs were bowed or warped).

System Context Overview (0400, 0500)

The present invention system context may be broadly described as depicted in FIG. 4 (0400). In this typical application, a heat source PCB (0410) is mated to a heat sink PCB (0420) using one or more support pins (0411) that are soldered to both PCBs (0410, 0420) using through-hole techniques. Spacer pads (0412) are placed between the heat source PCB (0410) (and/or components mounted to it) and serve to raise the heat source PCB (0410) over the heat sink PCB (0420) and thus maintaining a known clearance between the PCBs (0410, 0420) irrespective of the configuration of the support pins (0411). Not shown is the thermal contact paste that may be applied between the heat source PCB (0410) and the heat plate (0414) that serves to transfer heat from the heat source PCB (0410) to the heat plate (0414) and through this entity to the heat sink PCB (0420) through fasteners (0415) or other heat conductive attachment means.

Figure 5:
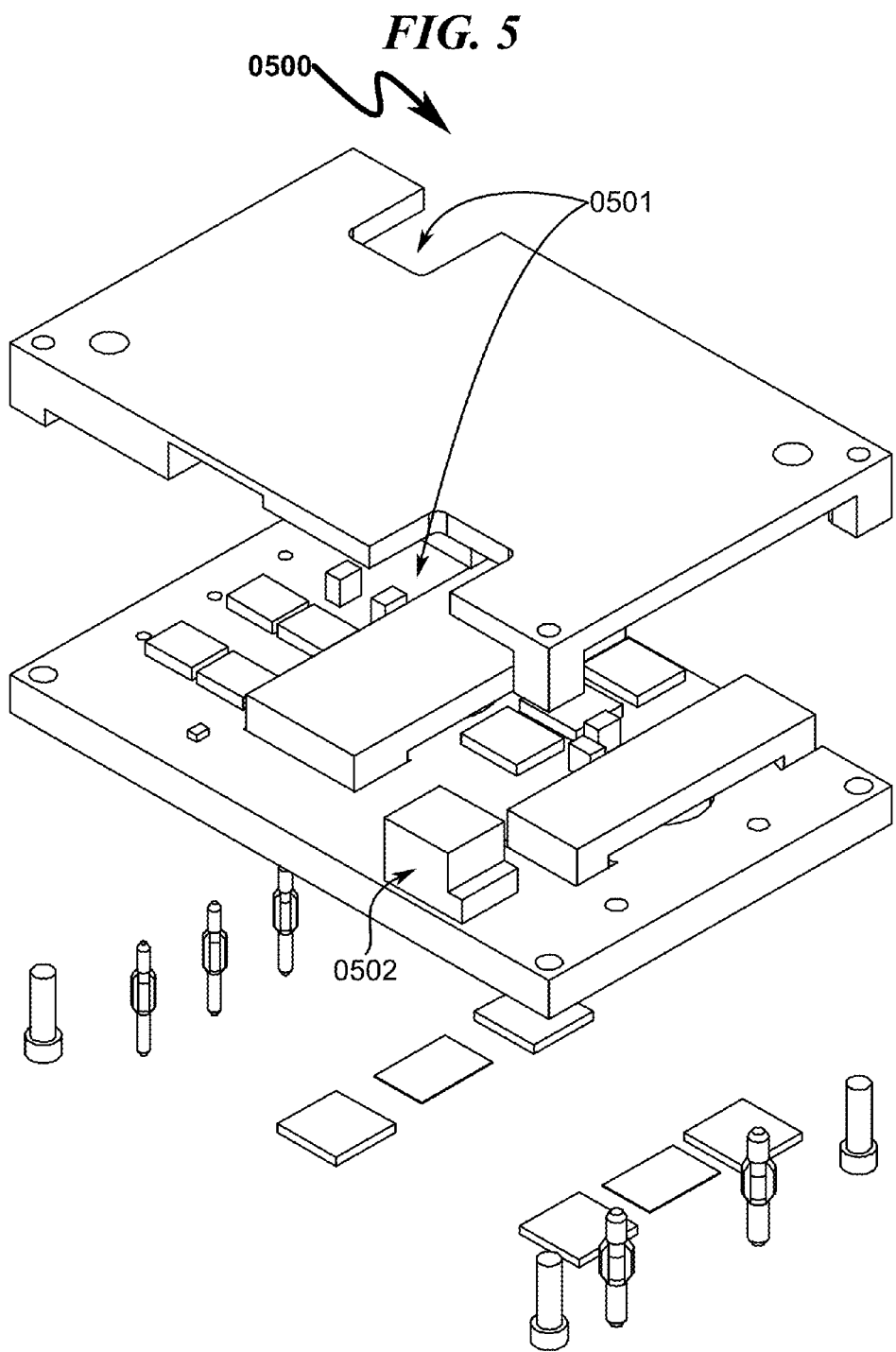
FIG. 5 illustrates an exploded perspective assembly view of an exemplary heat source PCB assembly associated with a preferred embodiment of the present invention.

An exploded assembly view of the heat source PCB and heat plate assembly is generally illustrated in FIG. 5 (0500). The heat plate assembly may take a wide variety of forms and may include variants as shown that incorporate top cutouts (0501) to permit convection cooling of components or forced cooling of components (0502) through these openings during the reflow soldering process.

Heat Plate Clearance Using Spacer Pads (0600)

Figure 6:
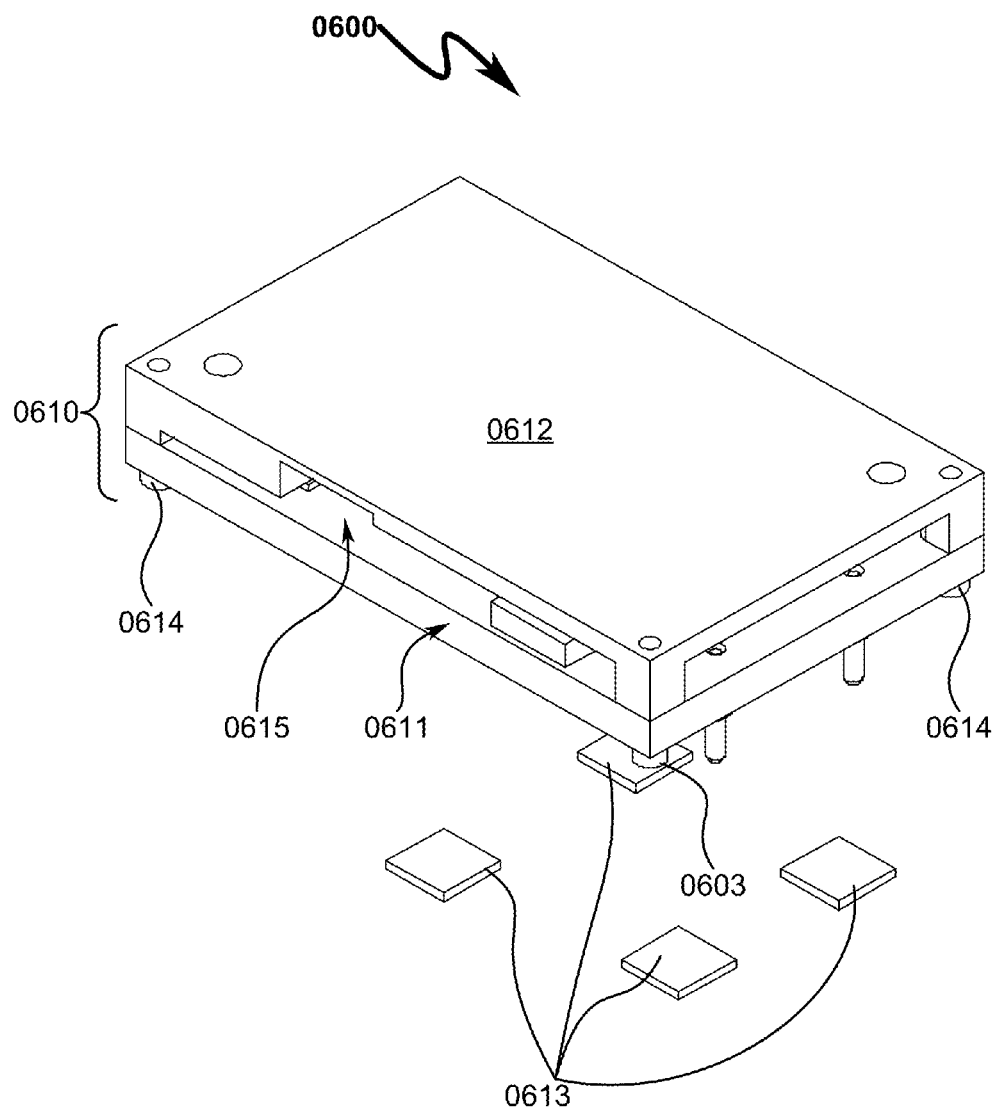
FIG. 6 illustrates a perspective view of an exemplary heat source PCB assembly associated with a preferred embodiment of the present invention.

The present invention may utilize spacer pads as generally illustrated in FIG. 6 (0600) to ensure that the combination (0610) of the heat source PCB (0611)/heat plate (0612) maintains a minimum clearance distance above the heat sink PCB (not shown). This is accomplished by placing spacer pads (0613) beneath the fasteners (0614) used to tie the heat source PCB (0611) to the heat plate (0612). Equivalently, the spacers (0613) could be placed beneath portions of the heat plate (0612) that do not contain fasteners (0614) to the heat source PCB (0611). For example, it is possible for the heat plate (0612) to have extrusions that extend directly to the heat sink PCB (0611) and as such permit screw attachment of the heat plate directly to the heat sink PCB to affect better thermal transfer from the heat source PCB to the heat sink PCB. While this is not specifically illustrated in FIG. 6 (0600), one skilled in the art would be easily capable of generating such an embodiment variant given this diagram.

Note that within this assembled view, the cavity (0615) between the heat source PCB (0611) and the heat plate (0612) may be filled with the pliable thermal contact paste as described herein to affect optimal thermal transfer between the heat source PCB (0611) and the heat plate (0612) while maintaining electrical isolation between these two elements and also ensuring that components placed on the heat source PCB (0611) do not shift/move during reflow soldering processes.

Spacer Pad Variations (0700, 0800)

Figure 7:
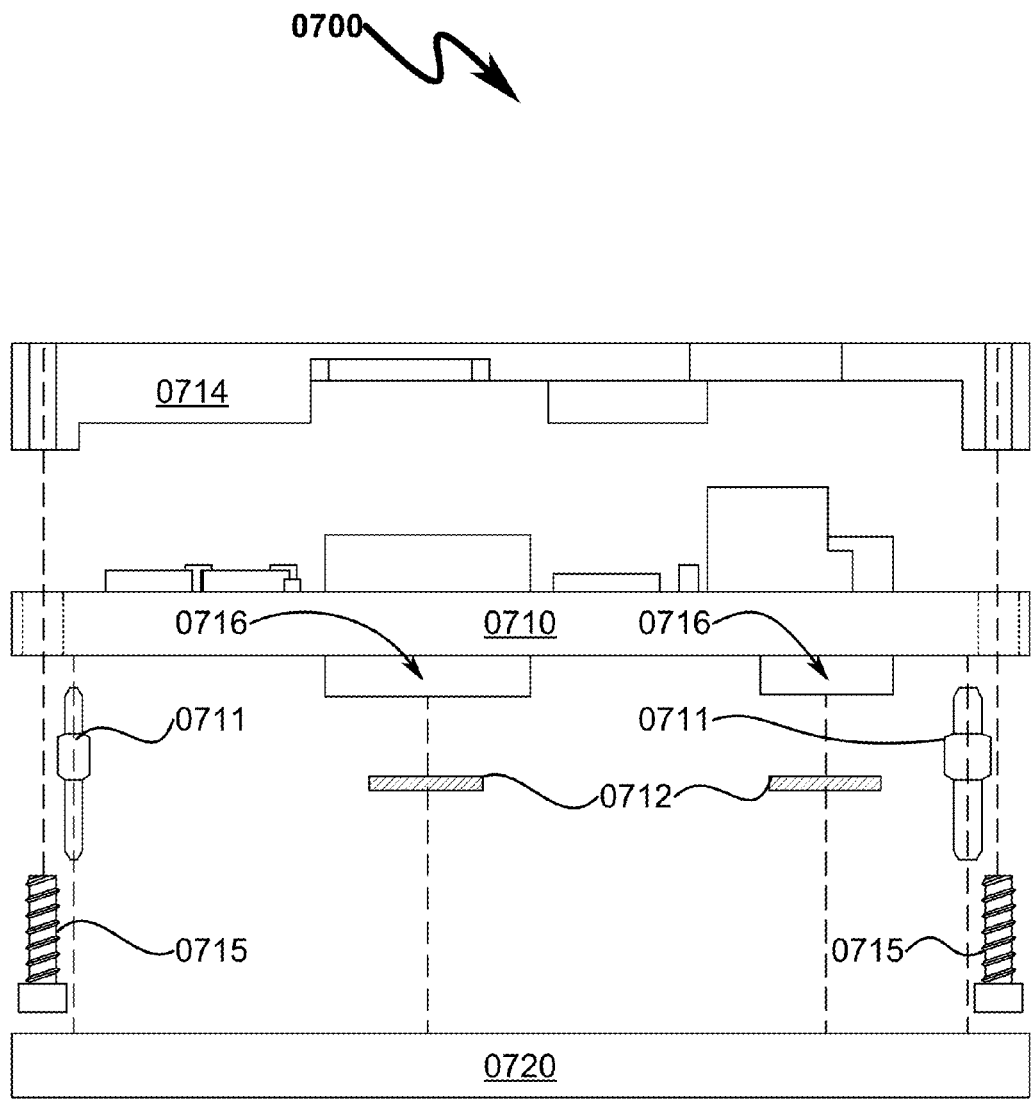
FIG. 7 illustrates a side assembly view of an exemplary heat source PCB assembly associated with a preferred embodiment of the present invention.

As generally illustrated in FIG. 7 (0700), the heat source PCB (0710) may be electrically/thermally attached to the heat sink PCB (0720) using one or more support pins (0711). These support pins (0711) may be fabricated with a cylindrical shoulder length that is shorter than the desired minimum assembly distance between the heat source PCB (0710) and the heat sink PCB (0720). Also, note that the support pins (0712) need not be identical in size. Spacer pads (0712) may be used to set the minimum distance between the heat source PCB (0710) and the heat sink PCB (0720) by fixing a minimum distance between components (0716) on the heat source PCB (0710) and the surface of the heat sink PCB (0720).

Within this context, the use of foam spacer pads (0712) is preferred but not a requirement. These spacer pads (0712) may be thermally conductive to aid in the heat conduction from the heat source PCB (0710) to the heat sink PCB (0720), but this feature is not a required characteristic of the spacer pads (0712). Additionally, the spacer pads (0712) may have an adhesive backing on one or more of the pad surfaces, but this feature is not a required characteristic of the spacer pads (0712). This minimum clearance spacing methodology ensures that electrical isolation between the components on the heat source PCB (0710) and the surface (or components) of the heat sink PCB (0720) is maintained.

Figure 8:
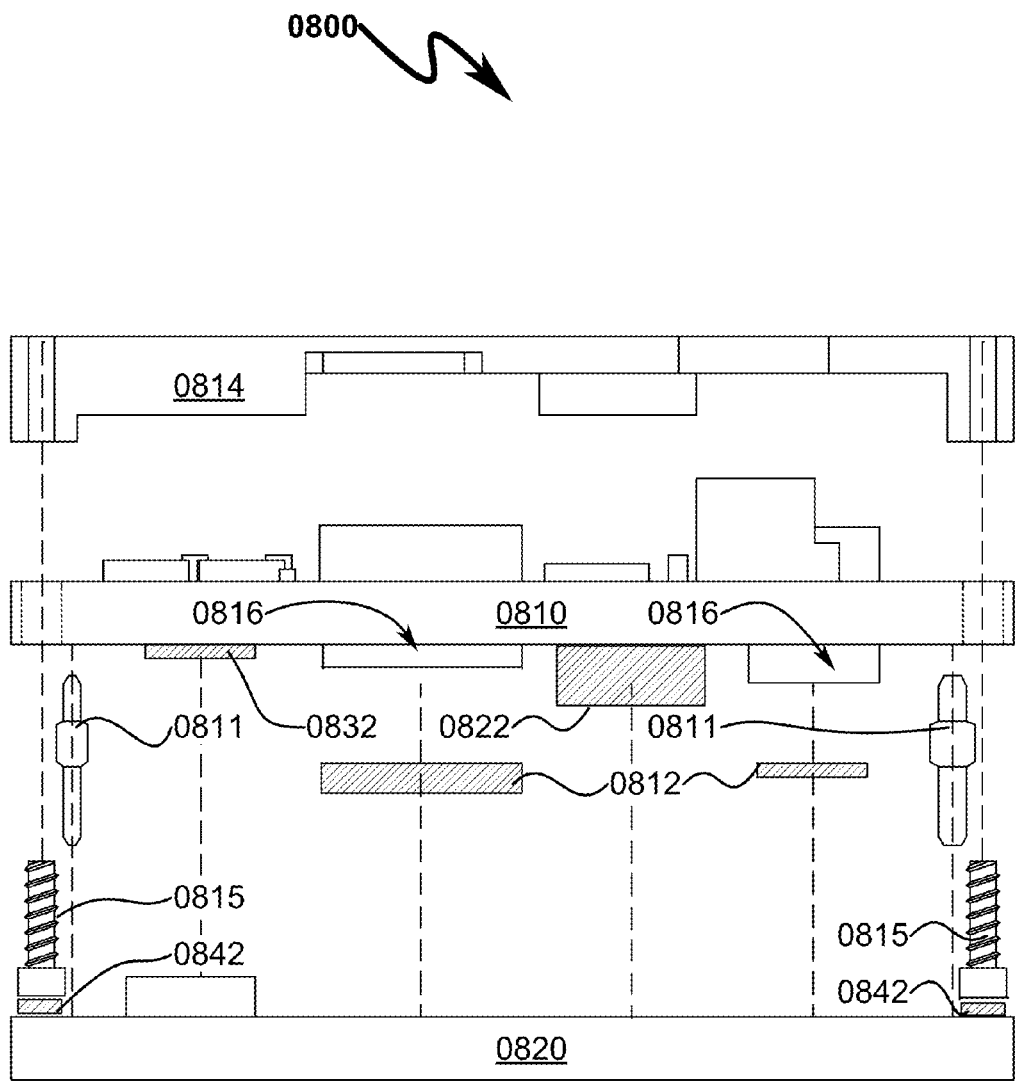
FIG. 8 illustrates a side assembly view of an exemplary heat source PCB assembly associated with a preferred embodiment of the present invention.

As generally illustrated in FIG. 8 (0800), the spacer pads (0812) may have varying thicknesses, be positioned for direct contact (0822) between the heat source PCB (0810) and the heat sink PCB (0820), be positioned for contact (0832) between components on the heat sink PCB (0820) and the heat source PCB (0810), or be used to set the spacing (0842) between the heat source PCB (0810), fasteners (0815), and the heat sink PCB (0820).

The spacer pads in some preferred embodiments are constructed of low electrical conductivity material and may in some circumstances comprise low electrical conductivity foam as the construction material. One skilled in the art will recognize that the spacer pad placement options illustrated in FIG. 7 (0700) and FIG. 8 (0800) and materials discussed herein represent only a few of the placement/construction possibilities to affect minimum clearance distances between the heat source PCB (0710, 0810) and the heat sink PCB (0720, 0820).

Support Pin Description (0900, 1000)

Figure 9:
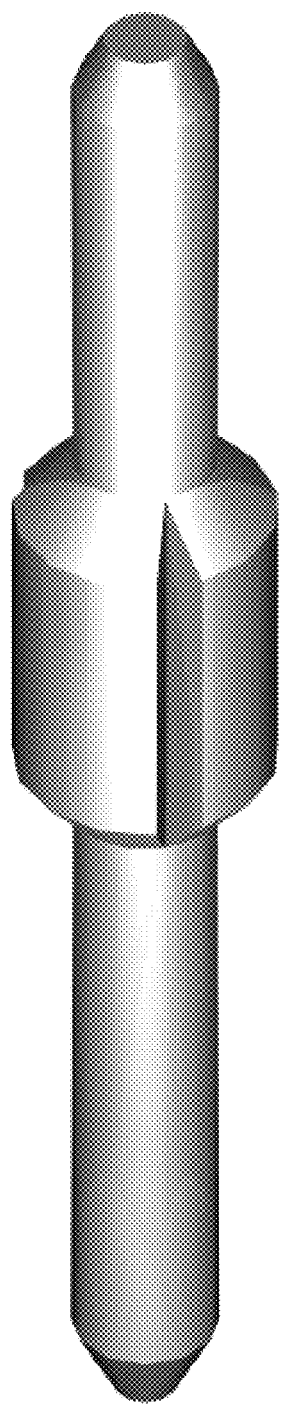
FIG. 9 illustrates a perspective view of an exemplary support pin used in some preferred invention embodiments.
Figure 10:
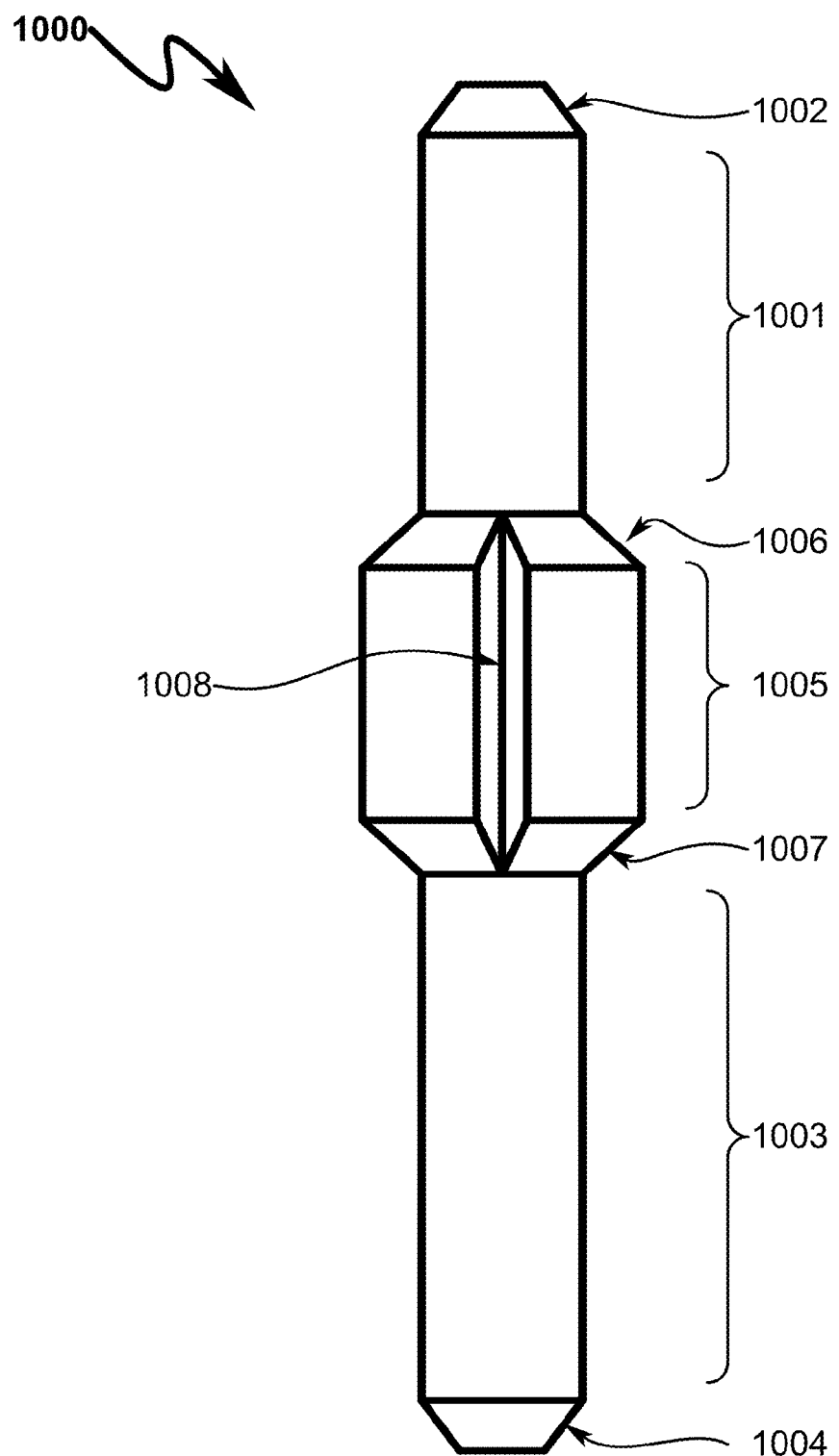
FIG. 10 illustrates a side view of an exemplary support pin used in some preferred invention embodiments.

A perspective view of an exemplary support pin is generally illustrated in FIG. 9 (0900). A side view of an exemplary support pin is generally illustrated in FIG. 10 (1000). The support pins typically comprise a top heat source PCB insertion shaft (1001) further comprising a top registration chamfer (1002), a bottom heat sink PCB insertion shaft (1003) further comprising a bottom registration chamfer (1004), and a center support shaft (1005) section further comprising top (1006) and bottom (1007) self-centering inclined peripheral edges, and one or more longitudinal gassing vents (1008).

Within this context, note that the length of the top heat source PCB insertion shaft (1001) and the bottom heat sink PCB insertion shaft (1003) may differ, as this may be an application specific modification to the basic support pin structure to accommodate differing thicknesses of heat source PCBs and/or heat sink PCBs.

Support Pin Gassing Vents (1100)-(1700)

Figure 11:
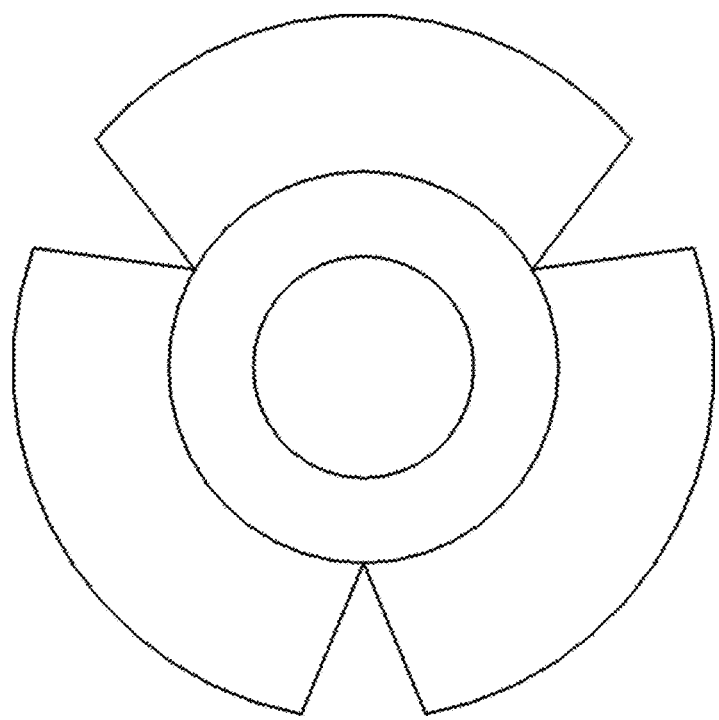
FIG. 11 illustrates a top view of an exemplary support pin used in some preferred invention embodiments that incorporates a 3-channel V-shaped longitudinal gassing vent.

It is instructive to note that the type, spacing, and number of longitudinal gassing vents may vary by application. For example, FIG. 9 (0900) and FIG. 10 (1000) illustrate a preferred embodiment wherein three gassing vents (1008) are equidistantly positioned around the periphery of the center support shaft (1005). The present invention anticipates that these longitudinal gassing vents (1008) may be V-shaped or U-shaped with optimal inclusion angles between 30 and 60 degrees. Furthermore, the spacing angle of these longitudinal gassing vents may be 120 degrees as generally illustrated in FIG. 11 (1100) or positioned at other preferred spacing angles including but not limited to 45 degrees, 90 degrees, 180 degrees, etc.

Figure 12:
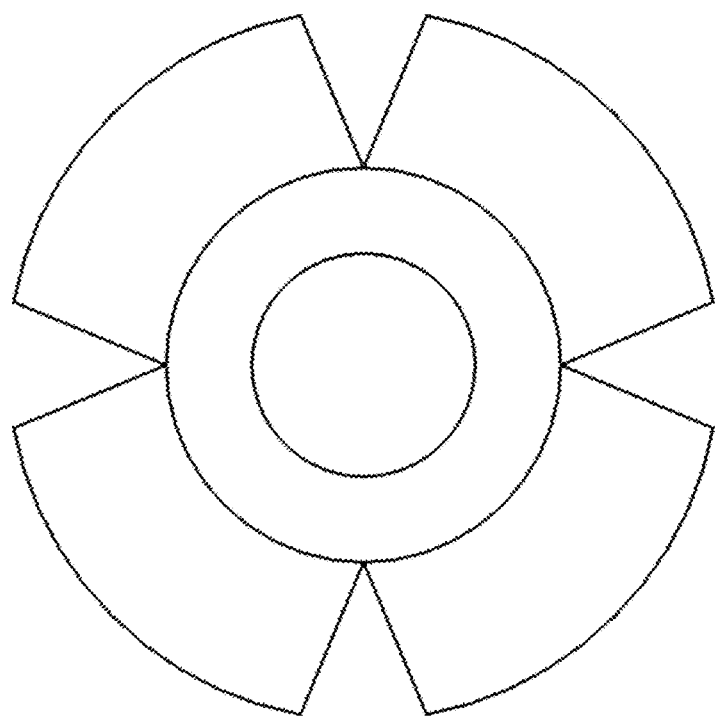
FIG. 12 illustrates a top view of an exemplary support pin used in some preferred invention embodiments that incorporates a 3-channel U-shaped longitudinal gassing vent.
Figure 14:
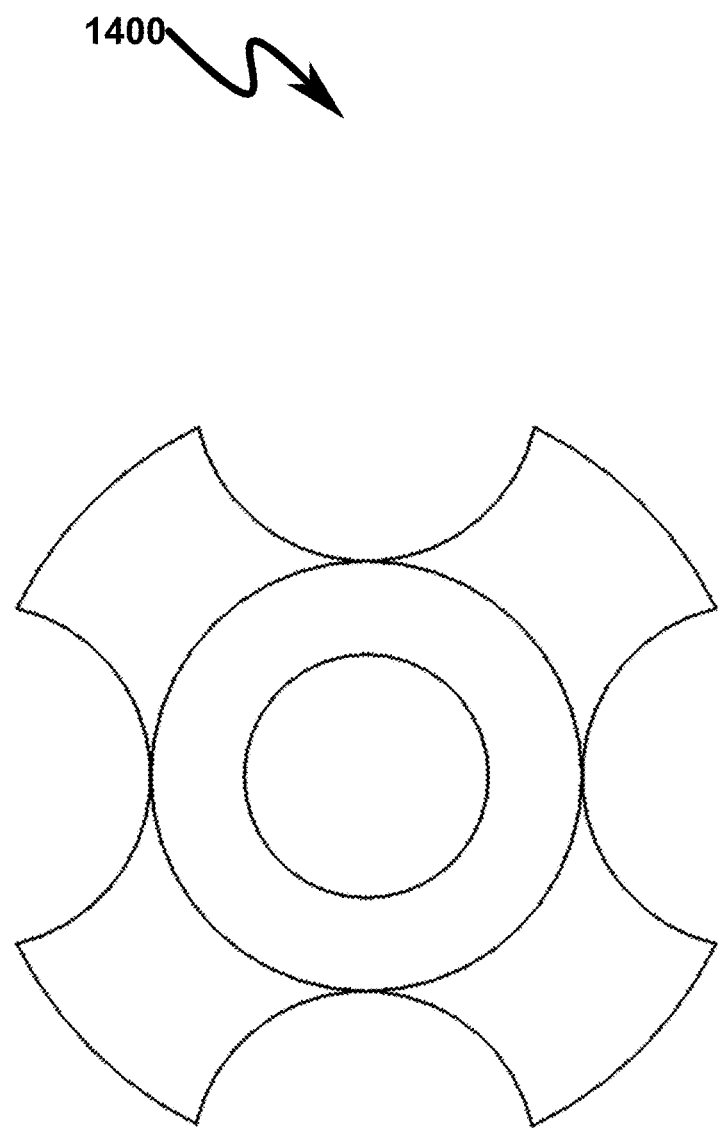
FIG. 14 illustrates a top view of an exemplary support pin used in some preferred invention embodiments that incorporates a 4-channel U-shaped longitudinal gassing vent.
Figure 15:
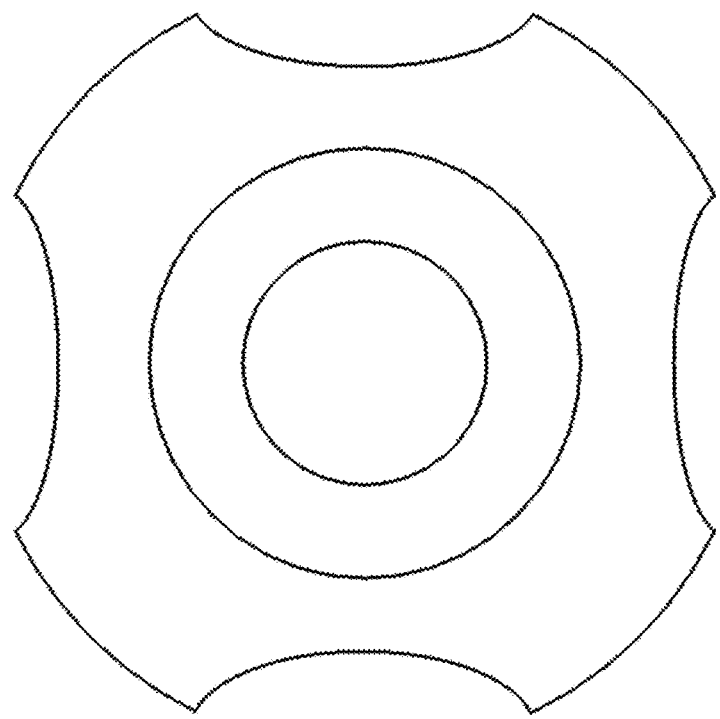
FIG. 15 illustrates a top view of an exemplary support pin used in some preferred invention embodiments that incorporates a 4-channel curve-shaped longitudinal gassing vent.
Figure 17:
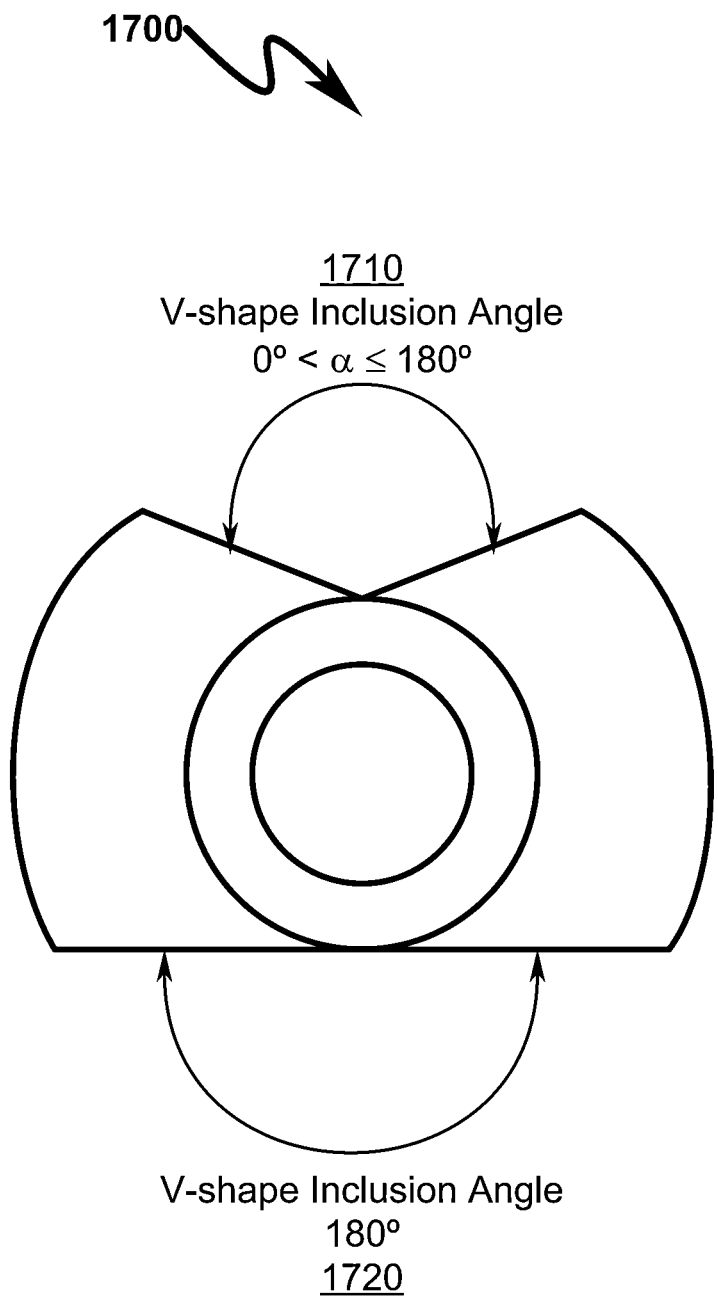
FIG. 17 illustrates a top view of an exemplary support pin used in some preferred invention embodiments that depicts V-shaped longitudinal gassing vents comprising arbitrary inclusion angles.

Examples of variations in the type and spacing of the longitudinal gassing vents are generally illustrated in the top views provided in FIG. 12 (1200), FIG. 13 (1300), FIG. (1400), FIG. 15 (1500), FIG. 16 (1600), and FIG. 17 (1700). FIG. 11 (1100) and FIG. 12 (1200) illustrate that the venting ports may vary in number and position around the periphery of the pin. FIG. 13 (1300) and FIG. 14 (1400) illustrate that the venting ports may be U-shaped in construction. FIG. 15 (1500) illustrates that the U-shaped ports may have differing depths. FIG. 16 (1600) illustrates that the venting ports may be mixed in construction within the same pin structure. FIG. 17 (1700) illustrates that the V-shaped inclusion angle may vary from greater than zero (0) degrees (1710) to 180 degrees (1720) which represents an essentially flat V-shape.

Support Pin Fabrication

A significant advantage to the construction details for the support pins as generally depicted in FIG. 9 (0900)-FIG. 17 (1700) is the fact that all of these support pin configurations can be easily fabricated using extruded metal that is then turned on an automated CNC lathe (or other machine tool such as a screw machine) to generate the required registration chamfers and self-centering inclined peripheral edges. This is in contrast to the construction methodologies that are used for the prior art as generally illustrated in FIG. 1 (0100) and FIG. 2 (0200, 0203). These prior art support pin configurations are not amenable to such automated methods of fabrication. Note particularly the top pin view (0203) in FIG. 2 (0200) that indicates a non-planar top surface of the pin that cannot be fabricated using traditional lathe turning techniques, resulting in a significantly increased manufacturing cost for this prior art configuration. Thus, the prior art teaches away from the type of cost-effective manufacturing technique that may be utilized with the present invention construction.

Support Pin Materials

While the present invention anticipates that a wide range of metals may be used to fabricate the support pin structures, several metals and alloys are currently considered preferred, including copper, copper alloys, C11000 copper alloy, C11000 half-hard copper alloy, tin-plated-copper, tin-plated-copper-alloy, tin-over-nickel plated C11000 half-hard copper alloy, gold-over-nickel plated C11000 half-hard copper alloy, copper-tellurium alloy, and brass alloys. A presently preferred exemplary pin construction comprises C11000 copper alloy, half-hard, or equivalent with plating comprising 200 microinches of 100% matte tin over 100 microinches minimum of nickel.

Support Pin Assembly View (1800)

Figure 18:
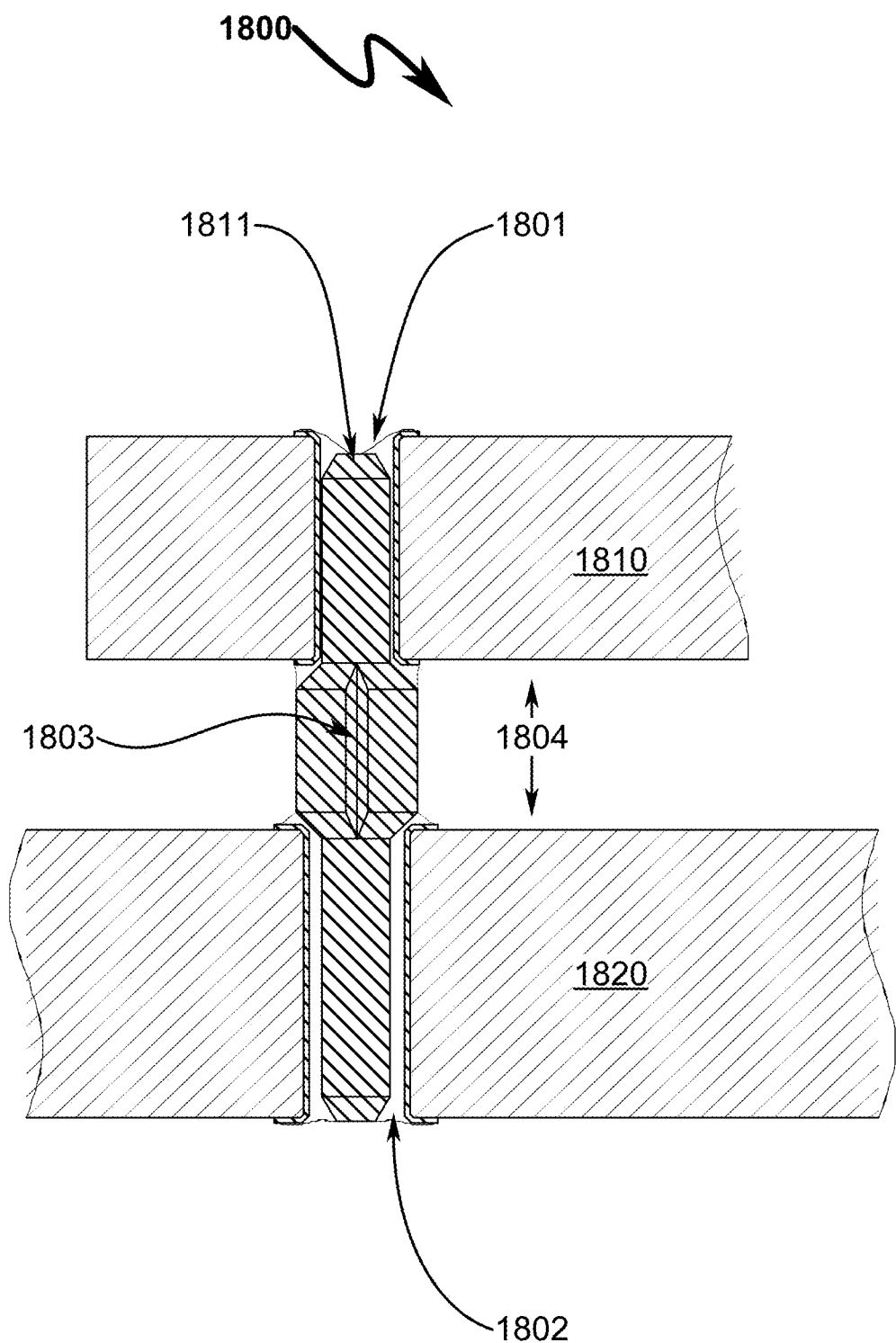
FIG. 18 illustrates a side assembly view of an exemplary support pin used in some preferred invention embodiments.

As generally illustrated in FIG. 18 (1800), reflow assembly of the heat source PCB (1810) to the heat sink PCB (1820) using the support pins (1811) permits wicking of the solder to the through-holes in the heat source PCB (1801) and the heat sink PCB (1802) as supported by the out-gassing port vents (1803) on the center support shaft section of the support pin (1811). The out-gassing port vents (1803) in this configuration enable the assembly as shown to provide sufficient solder wicking action for reflow, wave, and hand soldering operations. The top and bottom self-centering inclined peripheral edges on the center support shaft section of the support pin (1811) permit the support pin to slide within the through-holes in the heat source PCB (1810) and heat sink PCB (1820) and support varying distances (1804) between these PCBs as determined by the spacing pads (not shown) that have been placed between the heat source PCB (1810) and heat sink PCB (1820).

Spacer Pad Floating Alignment (1900, 2000)

Figure 19:
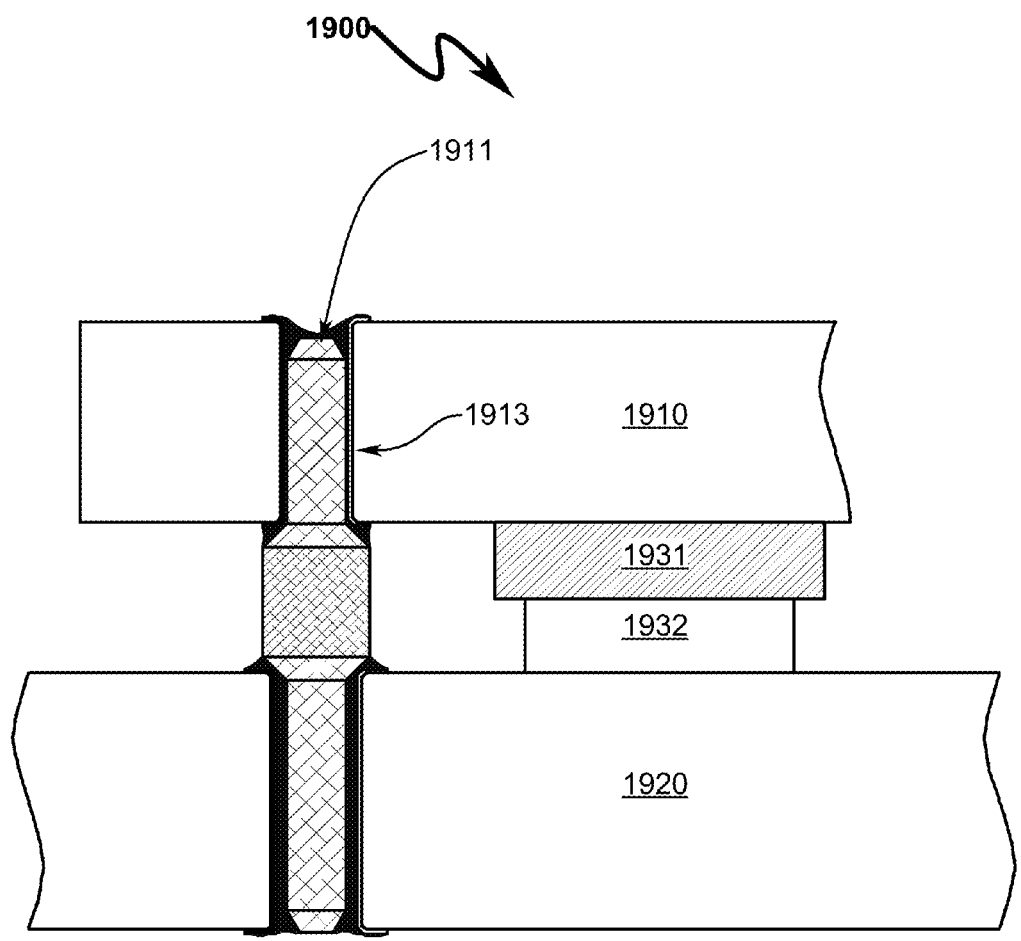
FIG. 19 illustrates a side assembly view of an exemplary support pin used in some preferred invention embodiments in conjunction with inter-board spacing and isolation techniques.

As generally illustrated in FIG. 19 (1900), the present invention may be embodied in applications wherein "spacer pads" (1931) or other height determining media are used to space the heat source PCB (1910) from the heat sink PCB (1920) and its components (1932). This technique may equivalently function to space heat source PCB (1910) components from the board surface (or other components fastened to the surface) of the heat sink PCB (1920).

Figure 20:
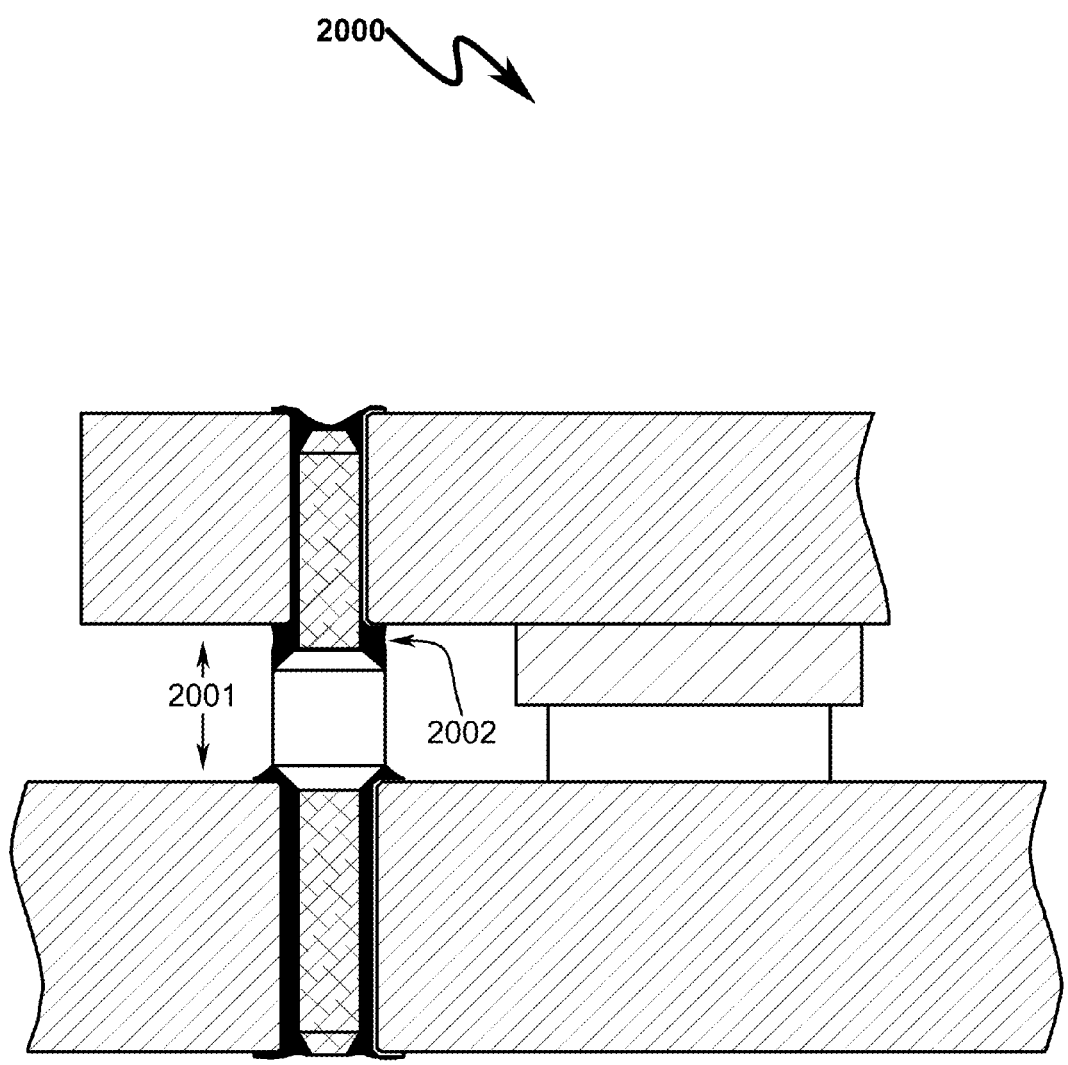
FIG. 20 illustrates a side assembly view of an exemplary support pin used in some preferred invention embodiments depicting "floating" pin placement.

This construction technique permits the support pin (1911) to "float" between the heat source PCB (1910) and the heat sink PCB (1920) within the plated-through hole (1932) during the soldering process and as such allows warpage of either PCB to be accommodated in conjunction with guarantees of minimum board-to-board distances via the use of spacing pads or other gap generation devices. This behavior is depicted in FIG. 20 (2000) wherein the board-to-board distance (2001) varies based on a number of tolerance and manufacturing variables, but the "floating" pin configuration still permits solder wicking (2002) to both PCBs even though there is not necessarily surface contact between the spacer pin and each PCB via the top and bottom self-centering inclined peripheral edges.

Independent PCB Floating Alignment

Overview (2100)

Figure 21:
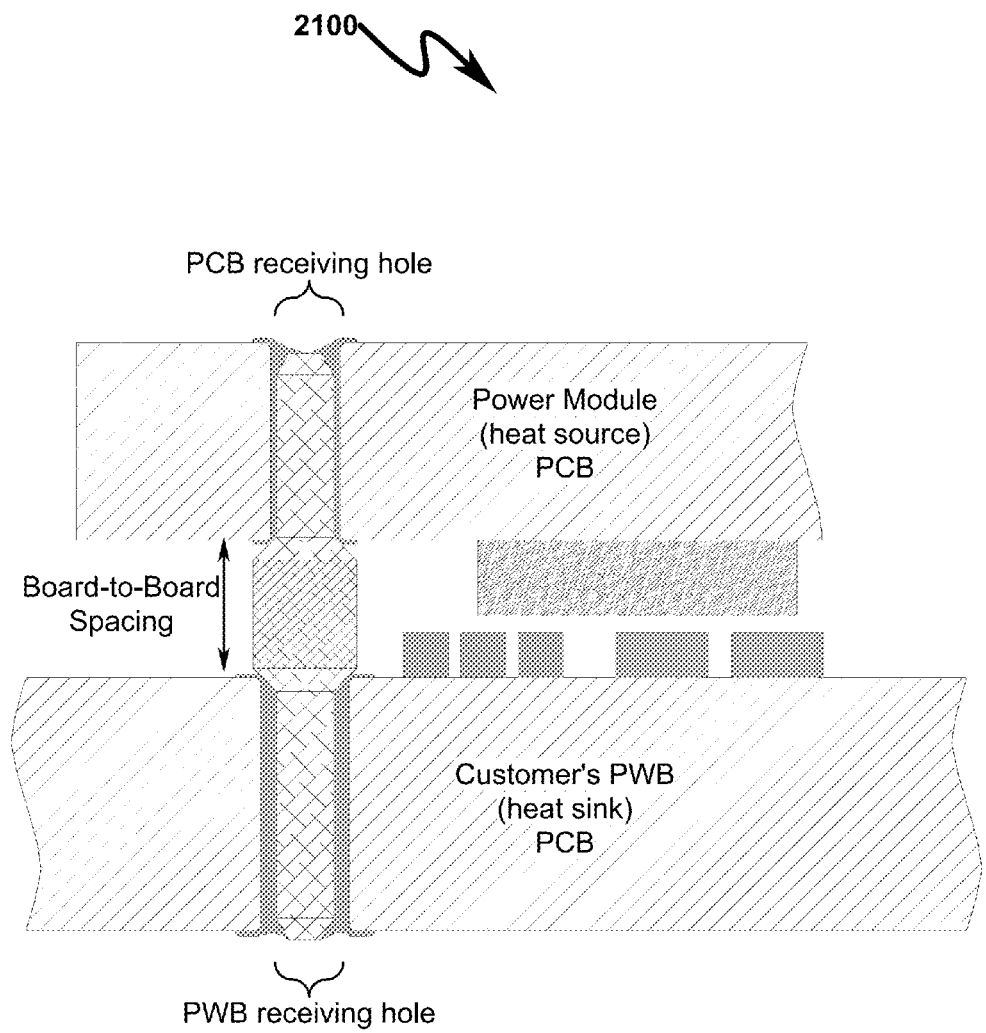
FIG. 21 illustrates a side assembly view of an exemplary support pin used in some preferred invention embodiments depicting a PWB "floating" pin placement configuration without spacer pads.

As generally depicted in FIG. 21 (2100), the present invention may utilize the support pins in conjunction with varying hole size patterns in the PCB/PWB to allow the self-centering support pin to set the board-to-board distance.

When the pin is placed in the PCB receiving hole in the upper power module PWB, the chamfered transition regions of the pin allow the pin to settle into the hole to a depth that is determined by the hole size and the chamfer angle. By defining D=hole diameter, S=pin shaft diameter, and A=chamfer angle, then the penetration depth 'P', to which the pin will settle in the PCB receiving hole, is given by the expression $$P=0.5*\tan(90°-A)*(D-S).$$

The larger the hole diameter, the deeper the pin will settle into the hole. The pin will make contact with the inner side wall of the hole and not the flat, plated surface of the power module PWB.

When the power module is mounted onto the customer's PWB, the board-to-board spacing will also be determined by the customer's board receiving hole diameter and the pin transition region chamfer angle, just as above. And, again, the same depth relationship applies.

Variations in PCB Hole Sizing (2200)

Figure 22:
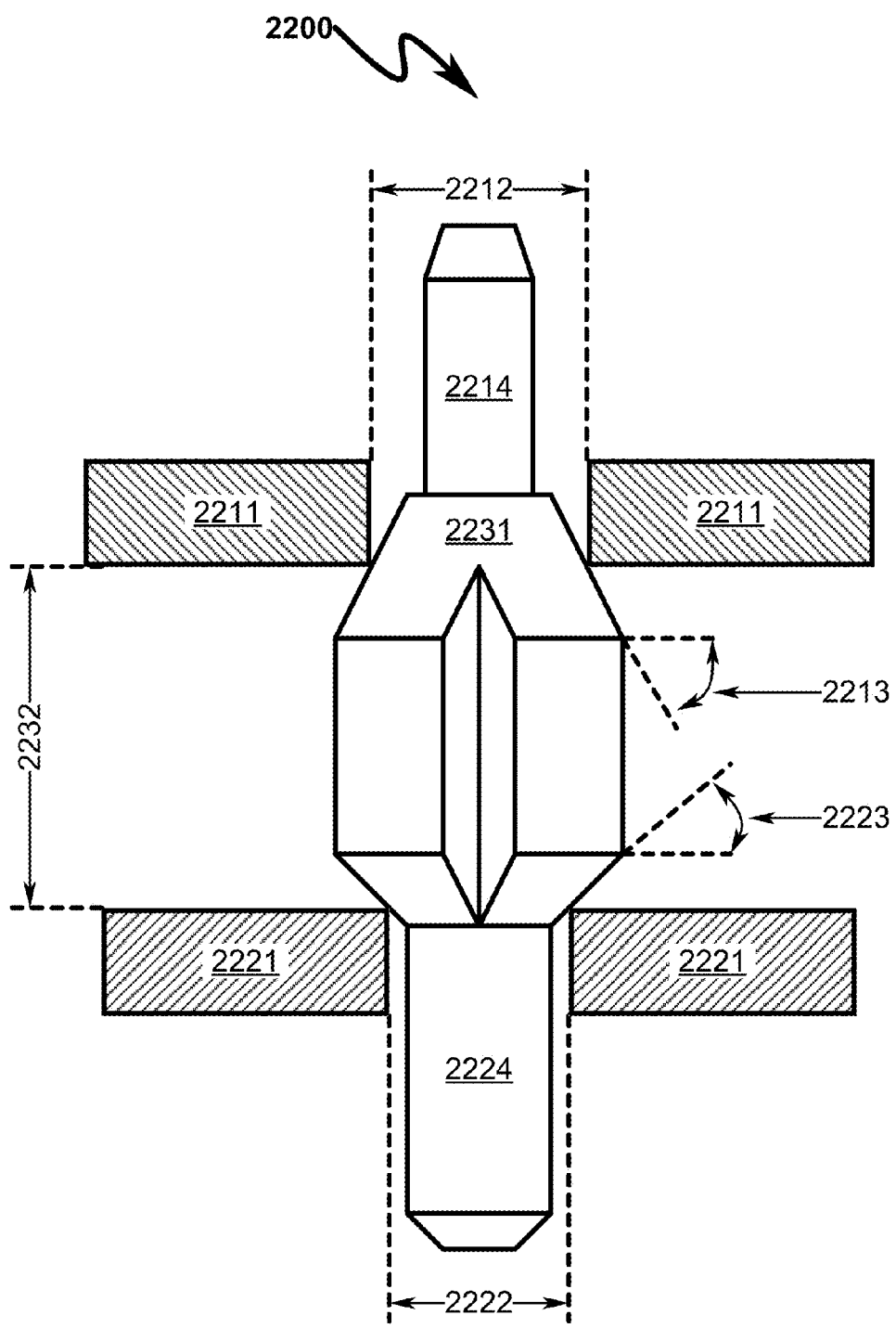
FIG. 22 illustrates a side assembly view of an exemplary support pin used in some preferred invention embodiments depicting adjustable PWB spacing using differential though-hole sizing.

As generally illustrated in FIG. 22 (2200), the support pin (2231) may be utilized in scenarios where the heat source PCB hole size (2212) is different than that of the heat sink PCB hole size (2222) but wherein the support pin chamfer angles (2213, 2223) vary to permit the distance (2232) from the heat source PCB (2211) to the heat sink PCB (2221) to be adjusted. This variation in chamfer angle (2213, 2223) may also be utilized to adjust the solder wicking characteristics to the support pin (2231) as it relates to the individual heat source PCB (2211) and the heat sink PCB (2221). This exemplary configuration also indicates that the insertion shaft sizing (2214, 2224) may vary and be defined by the application with variations in this insertion shaft sizing dictated in part by the requirements for pin "wobble" within the PCB holes as well as board-to-board registration specifications and pin insertion efficiency.

Variations in Support Pin Angle (2300)

Figure 23:
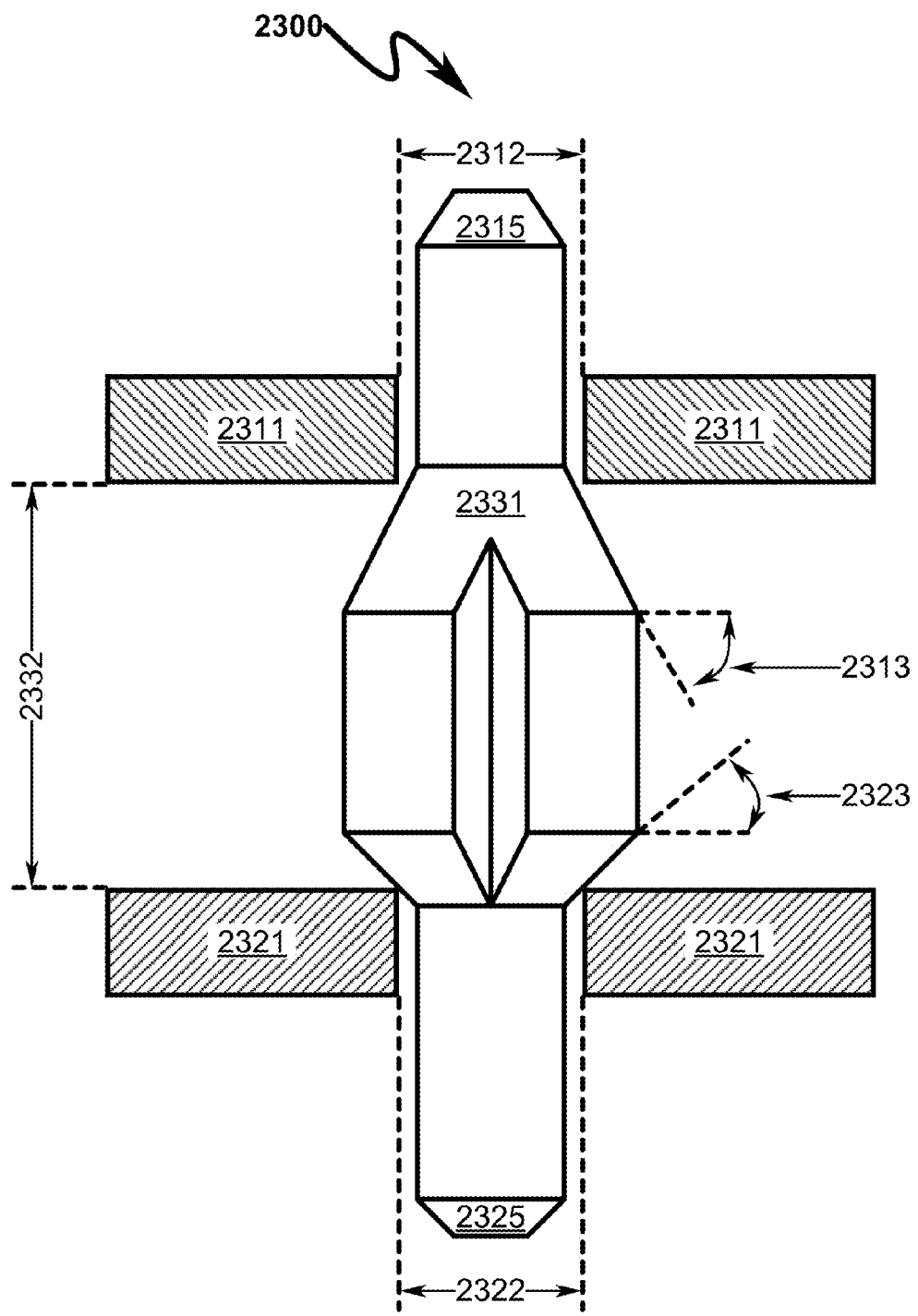
FIG. 23 illustrates a side assembly view of an exemplary support pin used in some preferred invention embodiments depicting adjustable PWB spacing using differential spacer pin inclusion angles.

As generally illustrated in FIG. 23 (2300), the support pin (2331) may be utilized in scenarios where the heat source PCB hole size (2312) is identical to that of the heat sink PCB hole size (2322) but wherein the support pin chamfer angles (2313, 2323) vary to permit the distance (2332) from the heat source PCB (2311) to the heat sink PCB (2321) to be adjusted. This variation in chamfer angle (2313, 2323) may also be utilized to adjust the solder wicking characteristics to the support pin (2331) as it relates to the individual heat source PCB (2311) and the heat sink PCB (2321). This exemplary configuration also indicates that the top (2315) and bottom (2325) registration chamfers may vary and be defined by the application with variations in the registration chamfers dictated in part by the requirements of board-to-board registration specifications and pin insertion efficiency.

Configuration Combinations

As mentioned previously, the support pin chamfer angle, support pin insertion sizing, support pin chamfer angle (inclined peripheral edge), and heat source/sink hole sizing may be varied in any combination to affect the self-centering alignment and board-to-board spacing characteristics desired by the particular application. This ability to vary the characteristics of the overall system without the use of other components can in some circumstances significantly improve manufacturing yields and reduce manufacturing costs, while allowing a greater degree of compatibility between heat source PCB manufacturers (often power supply converter manufacturers) and their respective customers.

Configuration Advantages

This design approach provides a number of advantages over a prior art "shoulder-type" support pin, including but not limited to:

Self-centering and alignment that improves centering in the holes and keeps pins perpendicular to the mounting board for better overall alignment. This feature helps provide reliable mating between the upper heat source module and the heat sink motherboard.

Hole size can be used to fine tune spacing between the boards. It allows a single pin to be used for multiple board spacing requirements (for example, accommodating different component heights on bottom of module or fine tuning total module height for conduction cooling applications), reducing tooling and inventory costs.

Spacing sensitivity to hole size can be adjusted by changing the chamfer angle between 0 and 90 degrees. A shallow angle allows a much wider range of adjustment but is more sensitive.

Smaller possible annular ring diameters can be used. Shoulder-type pins require an annular ring surrounding the PWB receiving hole in order to allow solder fillets to form on the side of the pin. This annular ring must be larger than the pin's collar width (the widest part of the pin) to form the fillets. This uses PWB space, which is always at a premium. With the self-centering pin approach, the solder fillets can form on the transition region faces instead of the pin side walls, thus reducing the required size of the annular rings (it does not eliminate them, but it does reduce their required diameters).

One skilled in the art will recognize that this list is only exemplary of the advantages of the present invention as applied in this context.

System Assembly Overview

While many forms of assembly between the heat source PCB and heat sink PCB are anticipated, the present invention specifically anticipates a "pin-in-paste" or "pin-in-hole" assembly process to be used in many preferred embodiments.

In general terms, the "pin-in-paste" or "pin-in-hole" process are fairly simple and involve the following steps:

The receiving PWB is printed with solder paste.

The power modules and all other components are placed on or in the PWB.

The PWB and components are reflow soldered in an in-line oven.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

Specifications for Spacer Pads

While the present invention anticipates that a wide variety of spacer pad materials may be used in construction, some materials are preferred. With respect to the spacer pad materials, the spacer pad may be in some preferred embodiments source from a "STOCKWELL ELASTOMERICS, INC.", part number "STAND OFF SPACERS." These spacer embodiments are constructed of Rogers Corporation BISCO HT-6360 Flame Retardant Silicone Rubber Sheeting, 65 durometer (the HT indicates High Temperature). This material is then kiss-cut into 0.25"×0.25" squares, 0.032" thick, and backed with an adhesive on one side. The spacer material is typically black and complies with the UL 94V-0 standard.

While this spacer material is not thermally conductive, other equivalent materials may be thermally conductive. These may include spacer pads from the BERGQUIST COMPANY (18930 West 78th Street, Chanhassen, Minn. 55317, (952) 835-2322) under their Part number "Gap Pad 2500S20". Other suitable thermal pad materials are available from the BERGQUIST COMPANY under their SIL-PAD® and POLY-PAD® brands.

Specifications for Thermal Contact Paste

While the present invention anticipates that a wide variety of thermal contact paste materials may be used in construction, some materials are preferred. With respect to the thermal contact paste materials, a preferred material is source from the BERGQUIST COMPANY (18930 West 78th Street, Chanhassen, Minn. 55317, (952) 835-2322) under their part number "LF2000".

Method Overview (2400)

Figure 24:
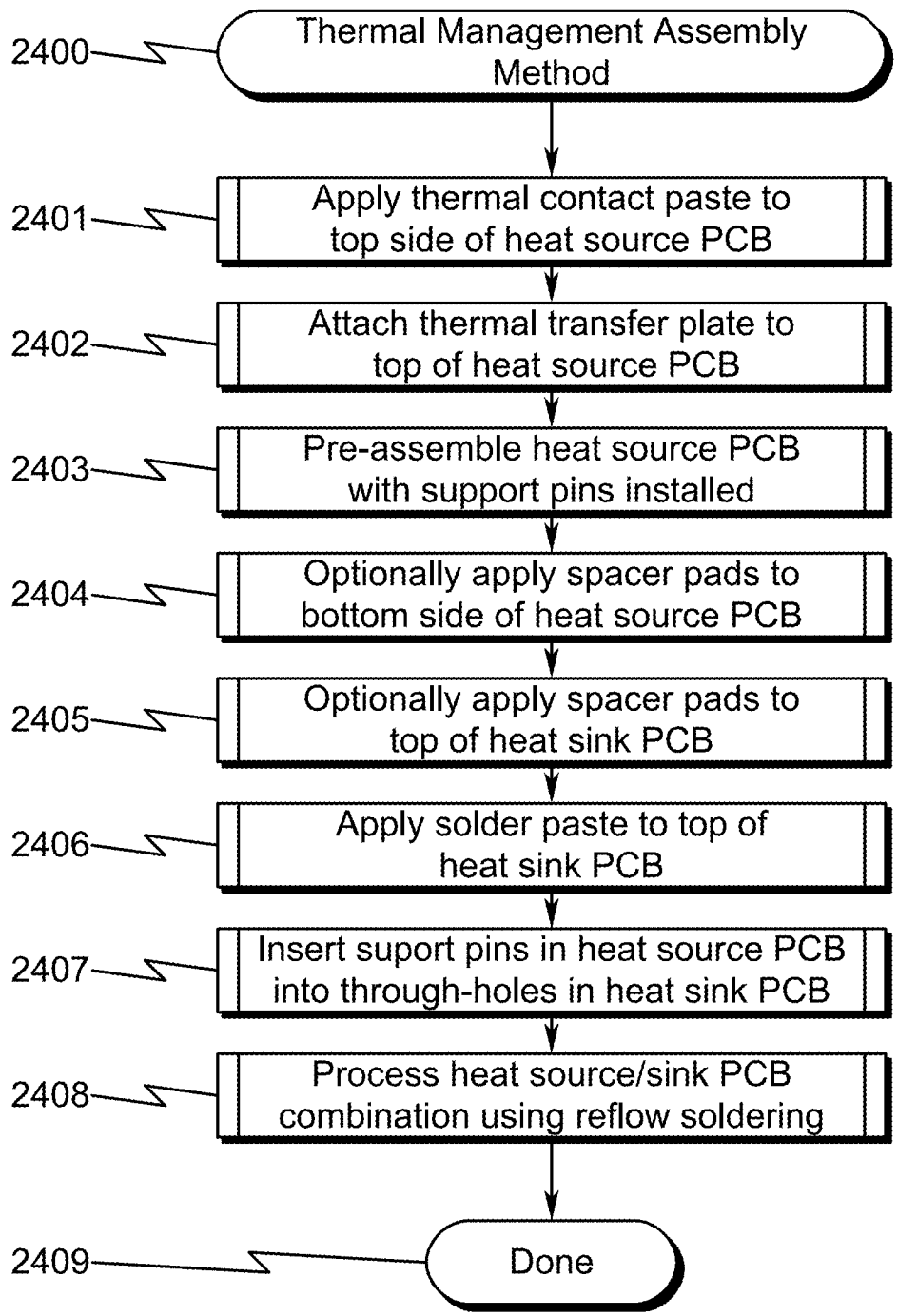
FIG. 24 illustrates an exemplary invention method embodiment flowchart.

The present invention system described above may be utilized in conjunction with an assembly method, as generally described in the flowchart illustrated in FIG. 24 (2400). The steps in this thermal management assembly method generally comprise:

(1) Applying thermal contact paste to the top side of a heat source PCB (or alternatively, applying thermal contact paste to the bottom side of a thermal transfer plate) (2401);

(2) Attaching a thermal transfer plate to the top of the heat source PCB (2402);

(3) Pre-assembling the heat source PCB with support pins installed in through-holes in the heat source PCB (2403);

(4) Optionally applying spacer pads to the bottom side of the heat source PCB (or, equivalently, to components placed on the bottom side of the heat source PCB) (2404);

(5) Optionally applying spacer pads to the top side of the heat sink PCB (or, equivalently, to components placed on the top side of the heat sink PCB) (2405);

(6) Applying solder paste to the top side of the heat sink PCB (2406);

(7) Inserting the support pins attached to the heat source PCB into the through-holes in the heat sink PCB (2407); and (8) Processing the heat source PCB/heat sink PCB combination using reflow soldering (2408).

This general method may be modified heavily depending on a number of factors with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

Thermal Cycle Age Testing

The present invention has many preferred application contexts, but one application involves assembly of DC-DC converter modules in environments wherein the assembled system is subject to high differential thermal cycling. The utilization of the support pins, spacer pads, and contact paste in this context permits the overall assembled system (heat source PCB and heat sink PCB) to be mechanically rigid, yet withstand repeated thermal cycling. This result is directly related to the high mechanical stability of the soldered top/bottom self-centering inclined peripheral edges of the support pin center shaft that tend to "wick" solder at the contact surface of the heat source PCB and heat sink PCB soldering points. Additionally, the spacer pads, being comprised of a foam material, withstand vibration without inducing component-to-PCB solder failures that are associated with traditional potting compound and the like. The contact paste, being pliable and of a non-setting nature, retains its pliability over time and temperature variations and as such "gives" in response to variations in thermal cycling, reducing stress on surface-mounted components and their associated PCB solder pads.

Given that many applications of the present invention require successful testing of 700 or more thermal cycles to meet customer reliability standards, the incorporation of the above techniques provides for a very robust overall thermal management system/method when applied as taught herein. This resilience in the face of thermal shock is also an advantageous characteristic in the application of wave/reflow/hand soldering techniques used to mechanically/electrically attach the heat source PCB to the heat sink PCB in a modern manufacturing environment.

Support Pin Fabrication (2500, 2600, 2700, 2800, 2900)

Figure 25:
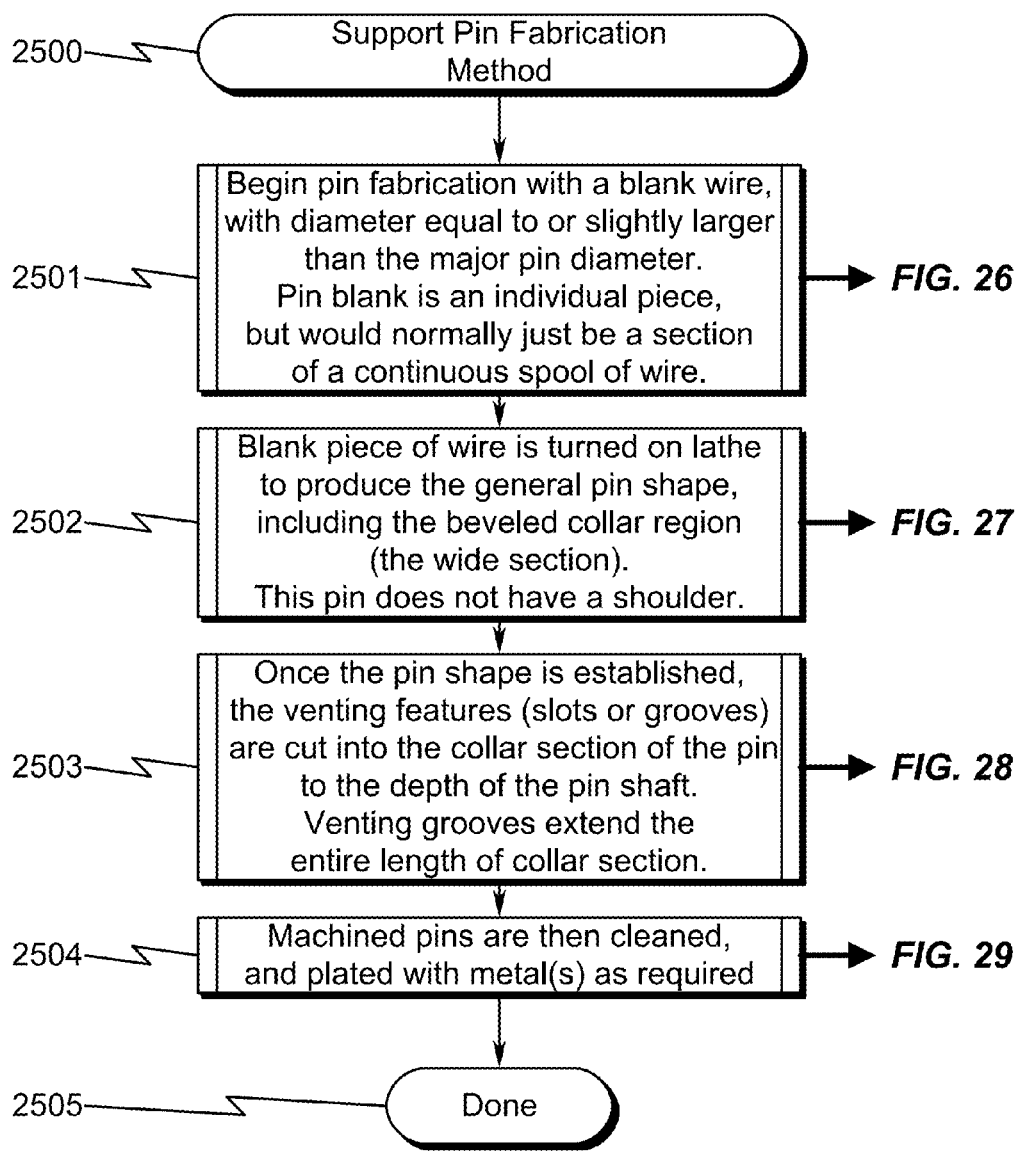
FIG. 25 illustrates an exemplary invention method embodiment flowchart directed to a method of fabricating support pins.
Figure 26:
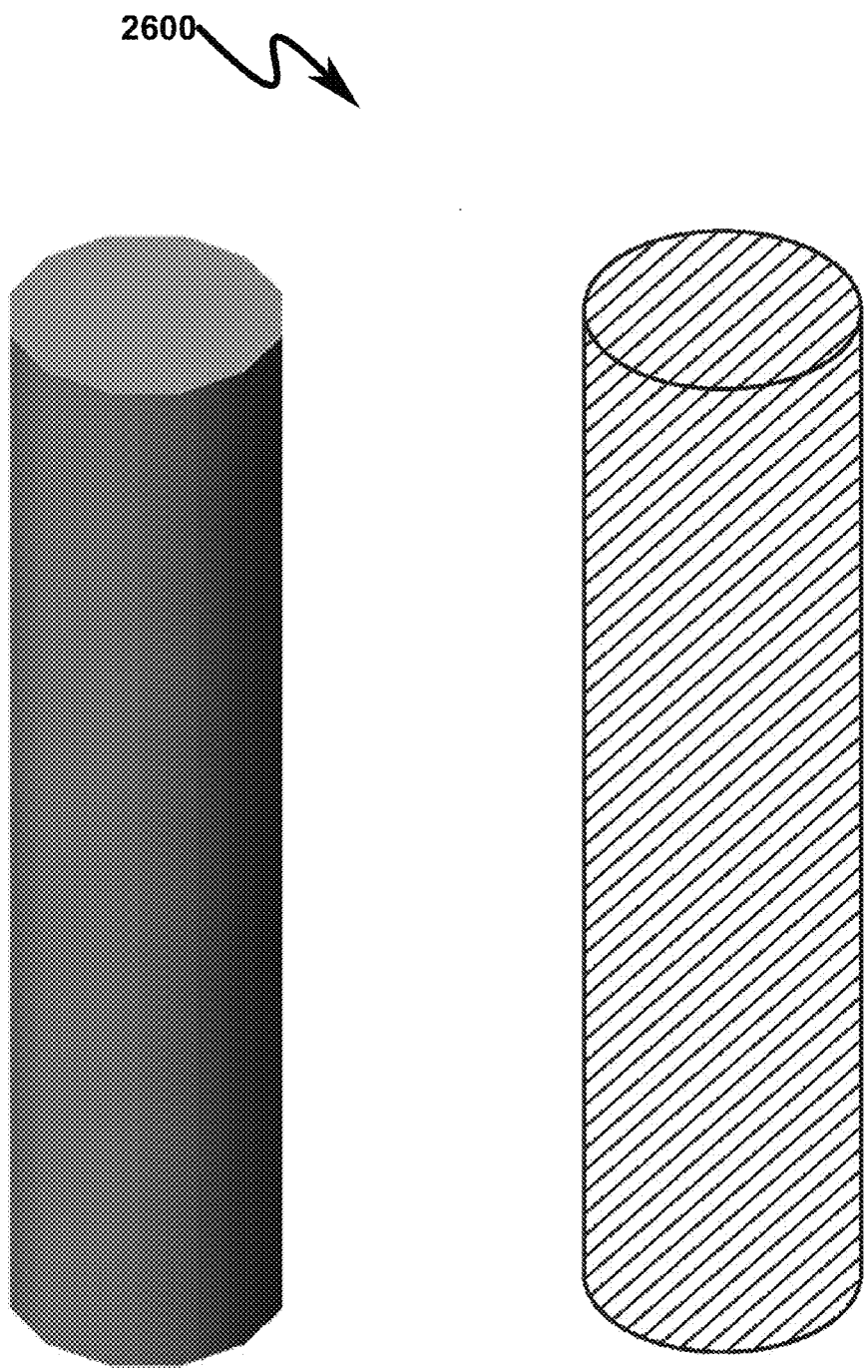
FIG. 26 illustrates an exemplary support pin fabrication step depicting raw material used in support pin fabrication.
Figure 27:
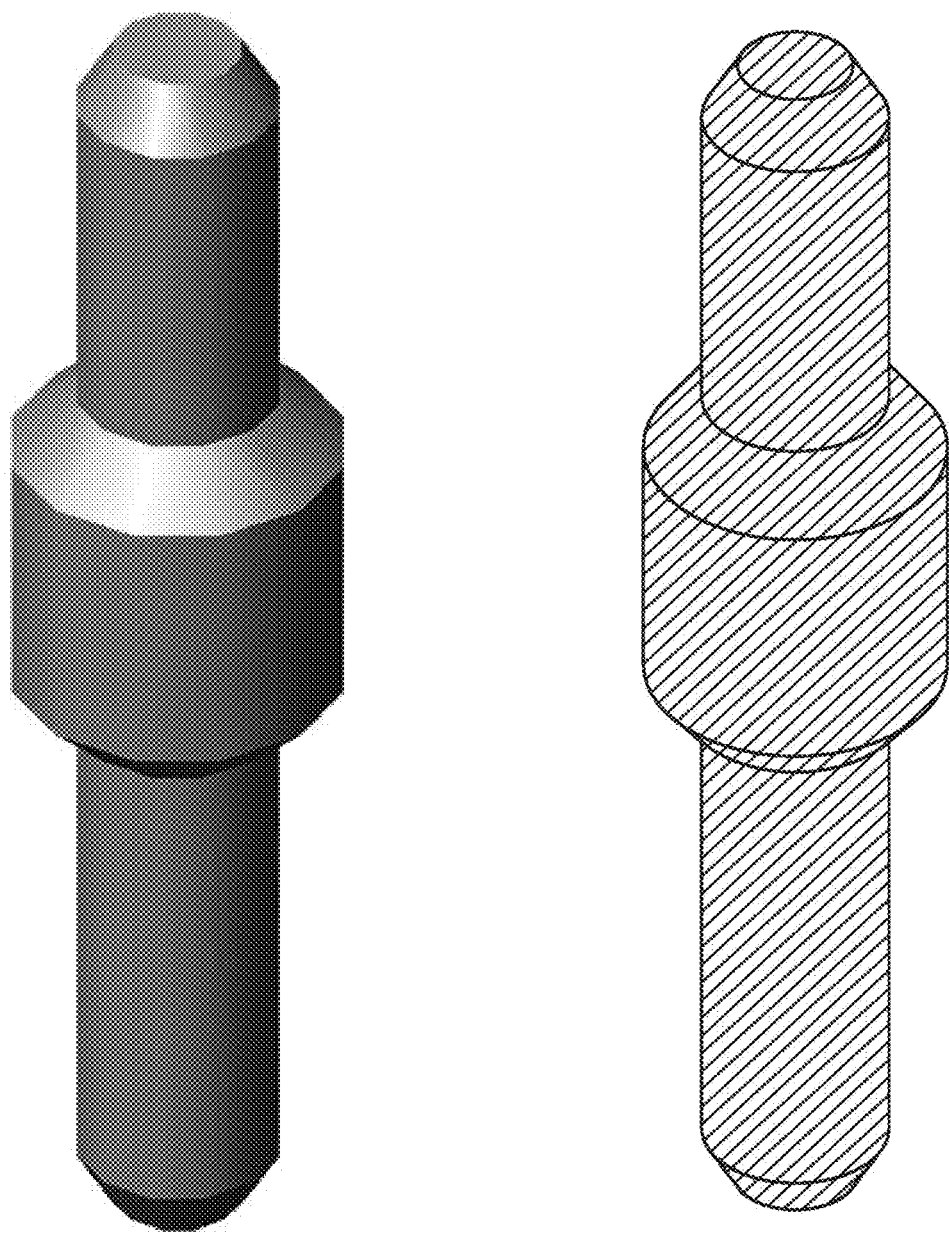
FIG. 27 illustrates an exemplary support pin fabrication step depicting initial turning of the support pin form.
Figure 28:
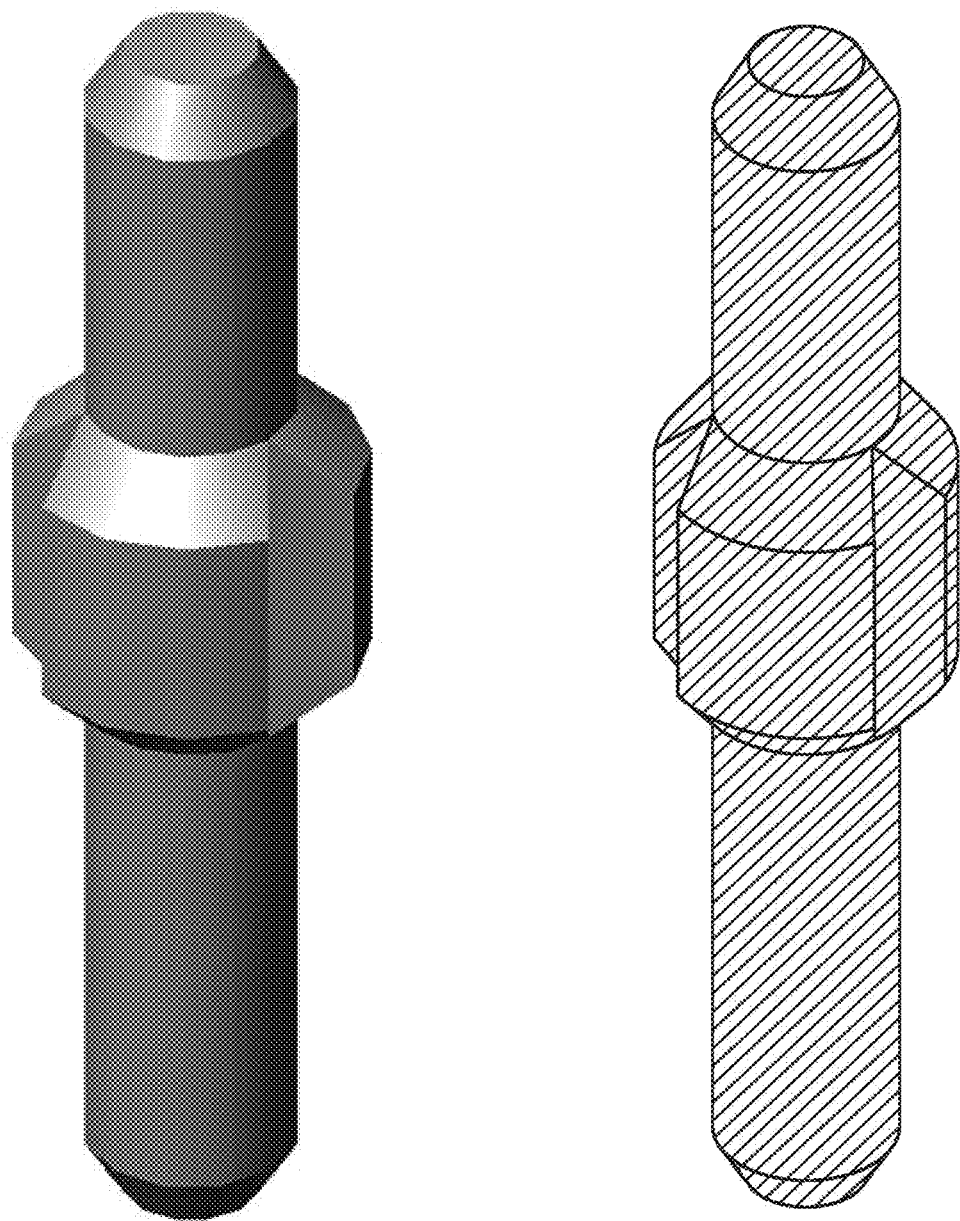
FIG. 28 illustrates an exemplary support pin fabrication step depicting creation of the venting features within the support pin form.
Figure 29:
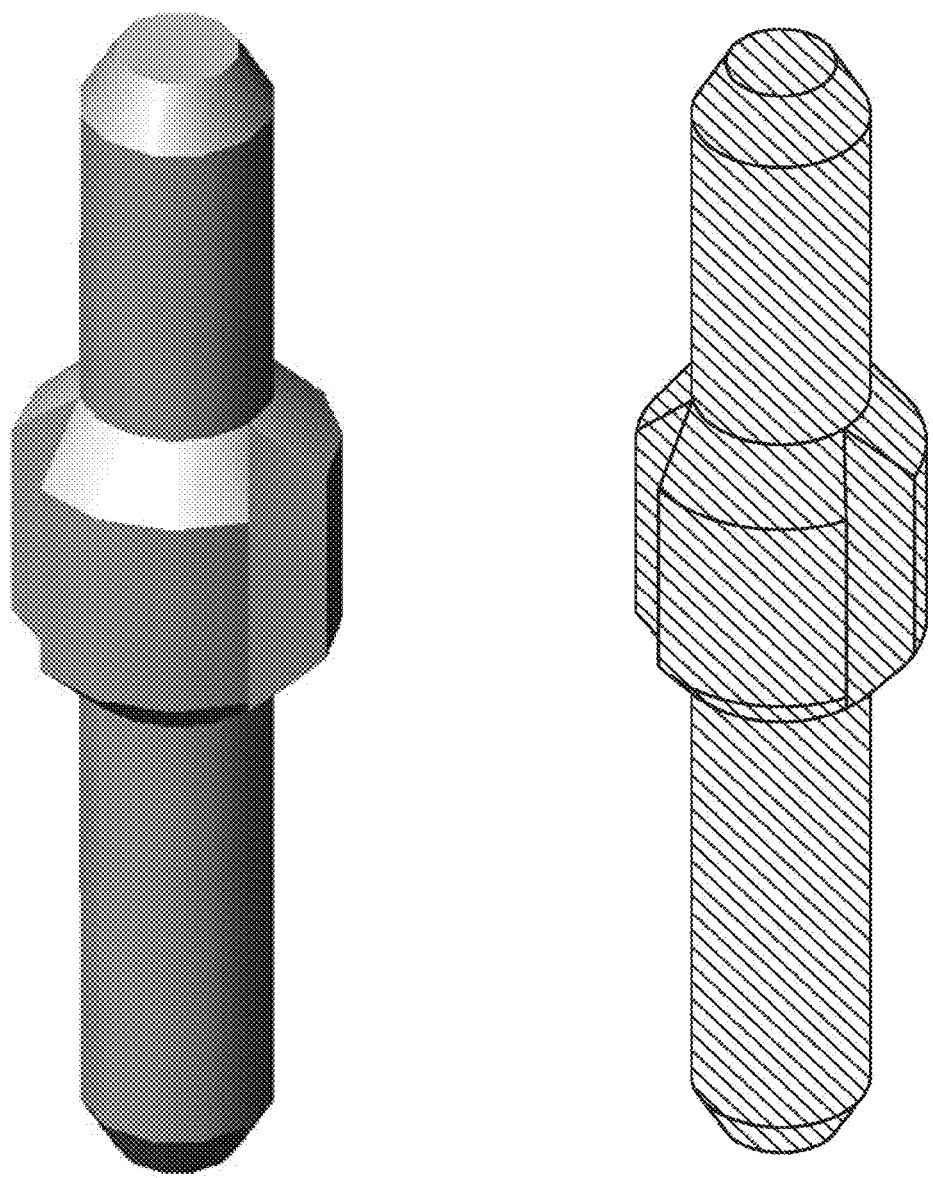
FIG. 29 illustrates an exemplary support pin fabrication step depicting final plating of the support pin form.

The support pins used in various embodiments of the present invention may be fabricated in a wide variety of ways. However, in order to achieve economic manufacturing while maintaining optimal solder wicking features, several support pin manufacturing methods are preferred. As generally illustrated in FIG. 25 (2500), a preferred exemplary fabrication methodology comprises the following steps:

(1) Begin pin fabrication with a blank wire, whose diameter is equal to or slightly larger than the widest part of the pin. As shown in FIG. 26 (2600), the blank is an individual piece, but this would normally just be a section of a continuous spool of wire. In high volume applications, the blank wire itself may be pre-grooved, eliminating the need to make the cuts shown later in this procedure. (2501);

(2) The blank piece of wire is turned on a lathe (or other machine tool such as a screw machine) to produce the pin shape, including the beveled collar region (the wide section). As can be seen in the image depicted in FIG. 27 (2700), this pin form does not have a shoulder. (2502);

(3) Once the pin shape is established, the venting features (also known as slots or grooves) are cut into the collar section of the pin to the depth of the pin shaft. As shown in FIG. 28 (2800), the venting grooves extend the entire length of the collar section. In some invention embodiments, this process may be one of deformation (as in rotational knurling) rather than removal of stock material. (2503); and (4) The machined pins are then cleaned and plated with whatever metal(s) is (are) required, as shown in FIG. 29 (2900). This plating can comprise Tin, Tin over Nickel, Gold over Nickel, or a variety of other films. (2504).

This general method may be modified heavily depending on a number of factors with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention. One skilled in the art will recognize that this fabrication methodology is only exemplary of many possible methods to manufacture the support pins.

Support Pin Alternate Fabrication (3000, 3100, 3200)

Figure 30:
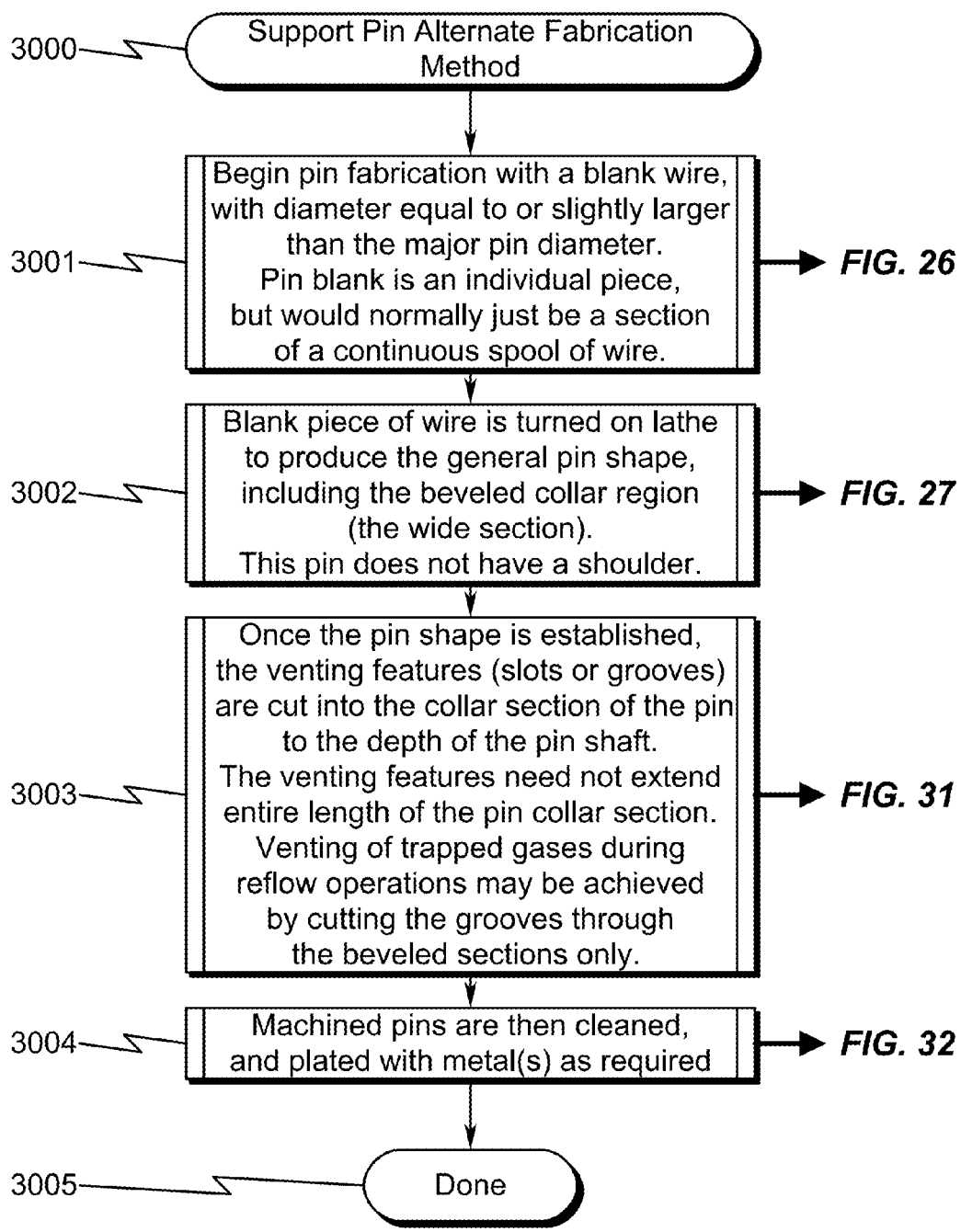
FIG. 30 illustrates an exemplary invention method embodiment flowchart directed to an alternate method of fabricating support pins.
Figure 31:
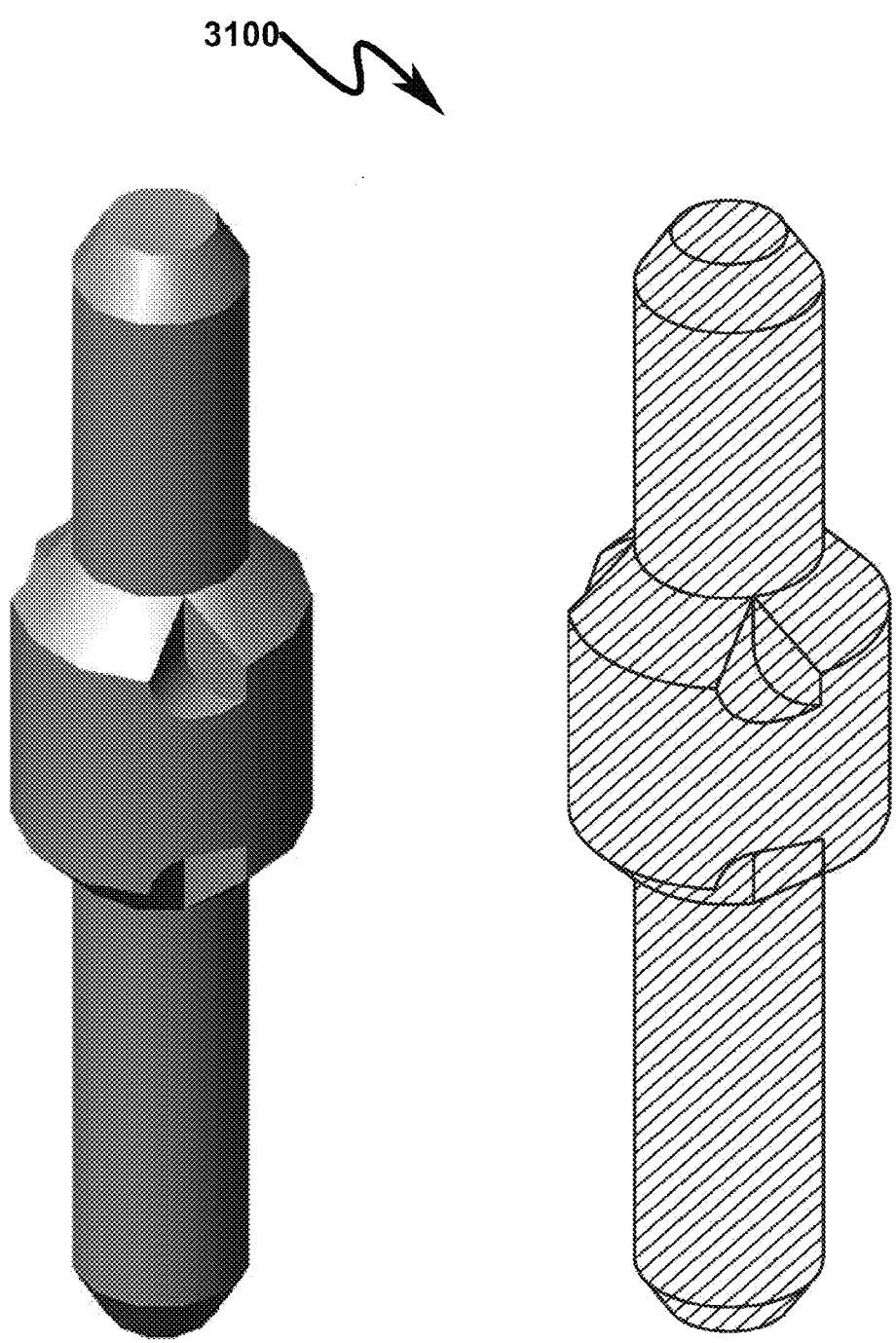
FIG. 31 illustrates an exemplary support pin fabrication step depicting creation of alternative venting features within the support pin form.
Figure 32:
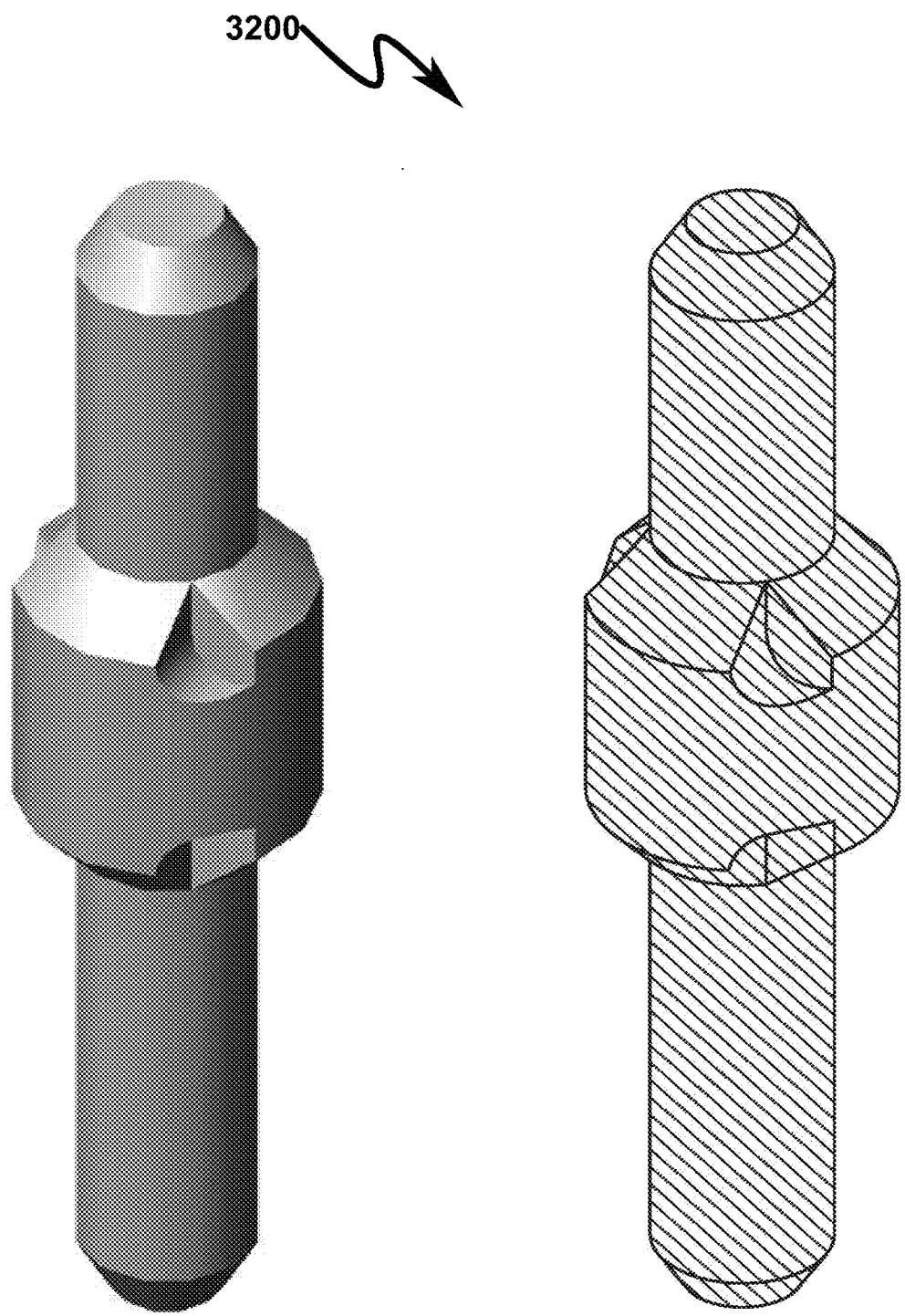
FIG. 32 illustrates an exemplary support pin fabrication step depicting final plating of the support pin form.

The support pins used in various embodiments of the present invention may be fabricated in a wide variety of ways. However, in order to achieve economic manufacturing while maintaining optimal solder wicking features, several support pin manufacturing methods are preferred. As generally illustrated in FIG. 30 (3000), a preferred alternate fabrication methodology comprises the following steps:

(1) Begin pin fabrication with a blank wire, whose diameter is equal to, or slightly larger than the widest part of the pin. As shown in FIG. 26 (2600), the blank is an individual piece, but this would normally just be a section of a continuous spool of wire. (3001);

(2) The blank piece of wire is turned on a lathe (or other machine tool such as a screw machine) to produce the pin shape, including the beveled collar region (the wide section). As can be seen in the image depicted in FIG. 27 (2700), this pin form does not have a shoulder. (3002);

(3) As an alternate machining approach to the full length grooves shown in FIG. 28 (2800), the venting features need not extend the entire length of the collar section of the pin. The venting of the trapped gases during the reflow operations may be accomplished by cutting the grooves through the beveled sections only as depicted in FIG. 31 (3100). Although this does result in less total machining (and less material removal), it may not reduce the machining costs, as the cutting bit still has to move across the entire collar section to make the end cuts. In some invention embodiments, this process may be one of deformation (as in rotational knurling) rather than removal of stock material. (3003); and (4) The machined pins are then cleaned and plated with whatever metal(s) is (are) required, as shown in FIG. 32 (3200). This plating can comprise Tin, Tin over Nickel, Gold over Nickel, or a variety of other films. (3004).

This general method may be modified heavily depending on a number of factors with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

Support Pin Lathe Fabrication Techniques (3300, 3400)

The fabrication techniques depicted in FIG. 25 (2500) and FIG. 30 (3000) generally may be implemented using a lathe or other machine tool, implementing a fabrication method as generally depicted in the flowcharts of FIG. 33 (3300) and FIG. 34 (3400) and comprising the following steps:

(1) The blank wire stock is chucked into the lathe (or other machine tool such as a screw machine) with a portion corresponding to the support pin length plus some parting/supporting excess extending beyond the end of the lathe chuck. The distal end of this blank wire stock may be supported by a lathe tailstock. (3301)

(2) As the lathe chuck rotates, one or more cutting tools traverse across the length of the blank wire stock to (a) dimension the outer diameter of the blank wire stock to the desired outer pin diameter, (b) form the top and bottom registration chamfers, and (c) form the top and bottom self-centering inclined peripheral edges of the support pin. These operations generate a pre-formed support pin structure. (3302)

(3) The lathe chuck is stopped and rotationally indexed to one or more rotational positions corresponding to positions in which the longitudinal gassing vents are to be positioned on the outer surface of the pre-formed support pin. (3303)

(4) A cutting tool is moved longitudinally across the entire length (as detailed in FIG. 25 (2500)) (or a portion of the entire length as detailed in FIG. 30 (3000)) of the pre-formed support pin to form one or more longitudinal gassing vents along the current rotational index of the pre-formed support pin. This longitudinal gassing vent generation step may alternatively be performed in some embodiments using a deformation process (such as rotational knurling) with a knurling tool or similar machining deformation process. (3304)

(5) The lathe chuck is rotated to the next rotational index and steps (3) and (4) are repeated for each rotational index in which a longitudinal gassing vent is to be formed in the pre-formed support pin. (3305)

(6) The pre-formed support pin is parted (cut/removed) from the remainder of the blank wire stock at the lathe tailstock end of the blank wire stock (if the blank wire stock is supported by a lathe tailstock) and at the lathe chuck end of the blank wire stock. This parting process is normally implemented by rotating the lathe chuck and using a parting tool to cut through the desired portions of the blank wire stock. (3306)

(7) After the lathe chuck jaws have been released and the end of the blank wire stock has been extended beyond the end of the chuck in preparation for a new machining operation, the process repeats at step (1). (3307)

This general method may be modified heavily depending on a number of factors with rearrangement and/or addition/deletion of steps anticipated by the scope of the present invention. The use of CNC milling or other 4-axis lathe techniques may be integrated within this methodology. Integration of this and other preferred exemplary embodiment methods in conjunction with a variety of preferred exemplary embodiment systems described herein is anticipated by the overall scope of the present invention.

These exemplary steps may be used to automate the process of the support pin manufacture and thus reduce the overall cost of the support pins and improve their manufacturability. The use of raw blank wire stock sourced in reel form may in some circumstances permit this process to be totally automated if incorporated with an automated feed system and pneumatic chucking system (as may be used with a conventional 5C collet chuck). The use of CNC controls within this overall methodology is anticipated by the present invention. The automated nature of this support pin fabrication permits a wide variety of "just-in-time" support pin configurations to be generated in support of a wide variety of motherboard/daughterboard combinations, soldering profiles, and board-to-board alignment/spacing variations.

Thermal Enhancement Plate (3500, 3600, 3700)

Figure 35:
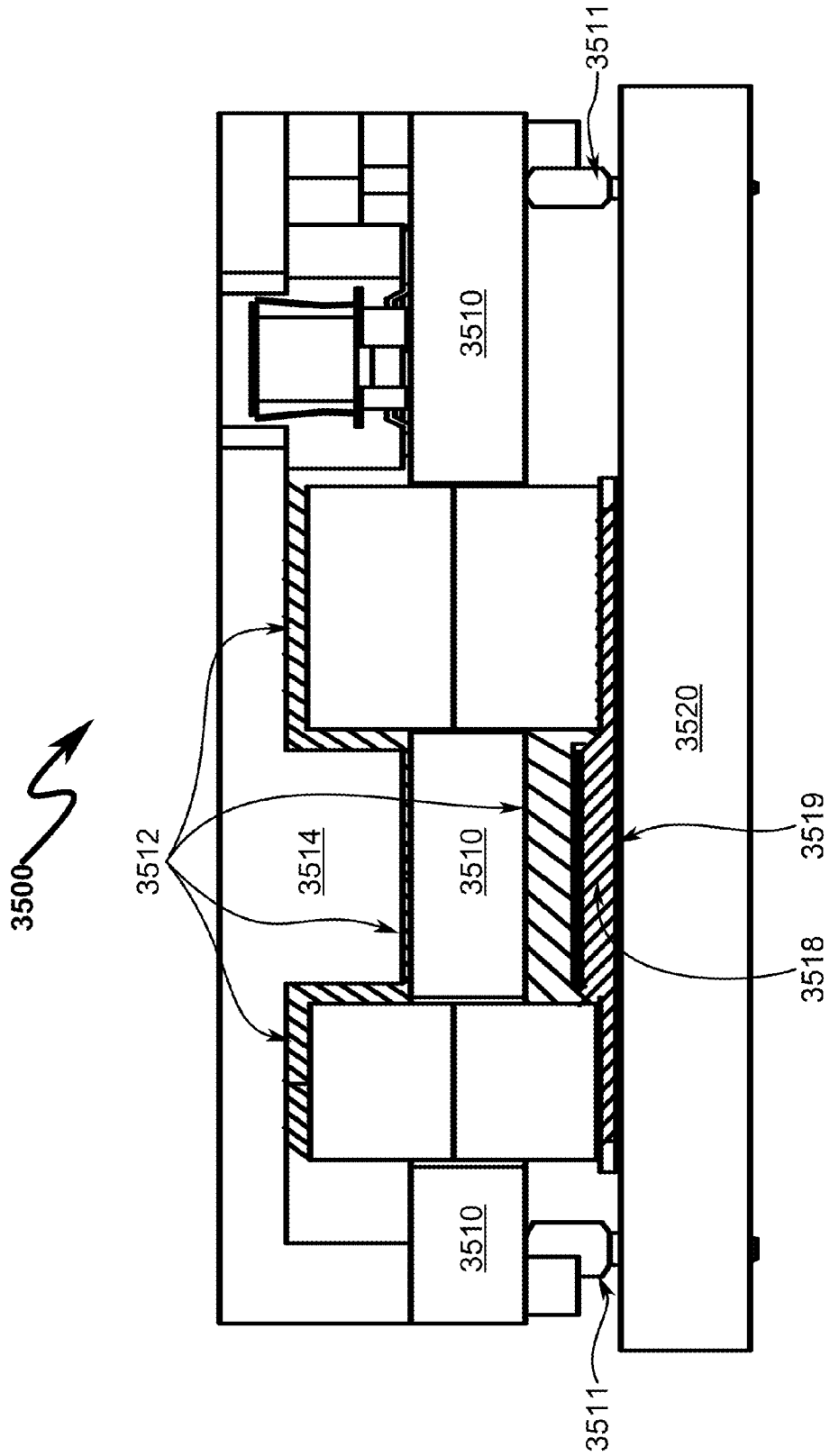
FIG. 35 illustrates a side view of a preferred exemplary invention embodiment in which a bottom-side thermal enhancement plate is utilized to improve thermal conductivity between the heat source PCB and the heat sink PCB.
Figure 36:
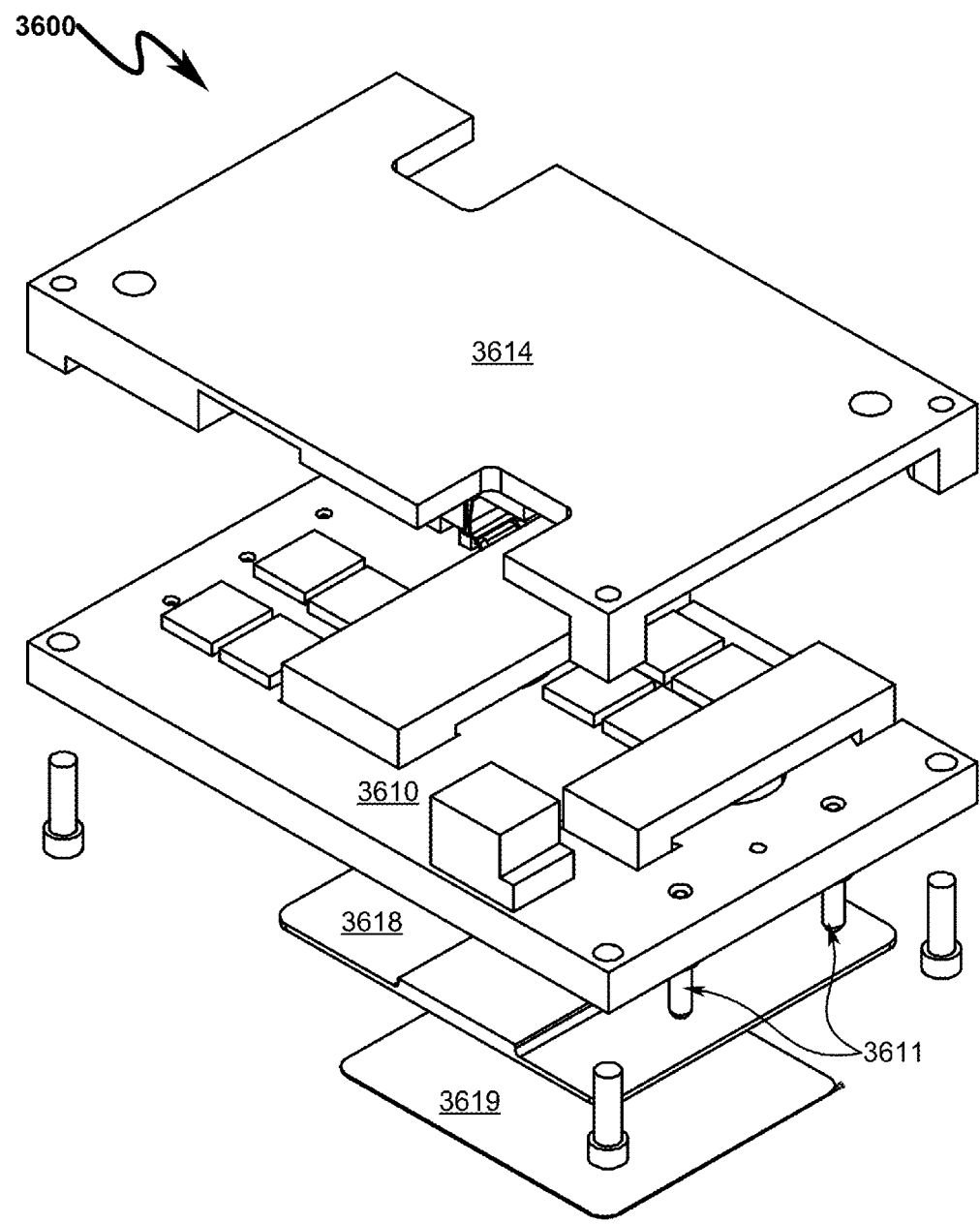
FIG. 36 illustrates a perspective assembly view of a preferred exemplary invention embodiment in which a bottom-side thermal enhancement plate is utilized to improve thermal conductivity between the heat source PCB and the heat sink PCB.
Figure 37:
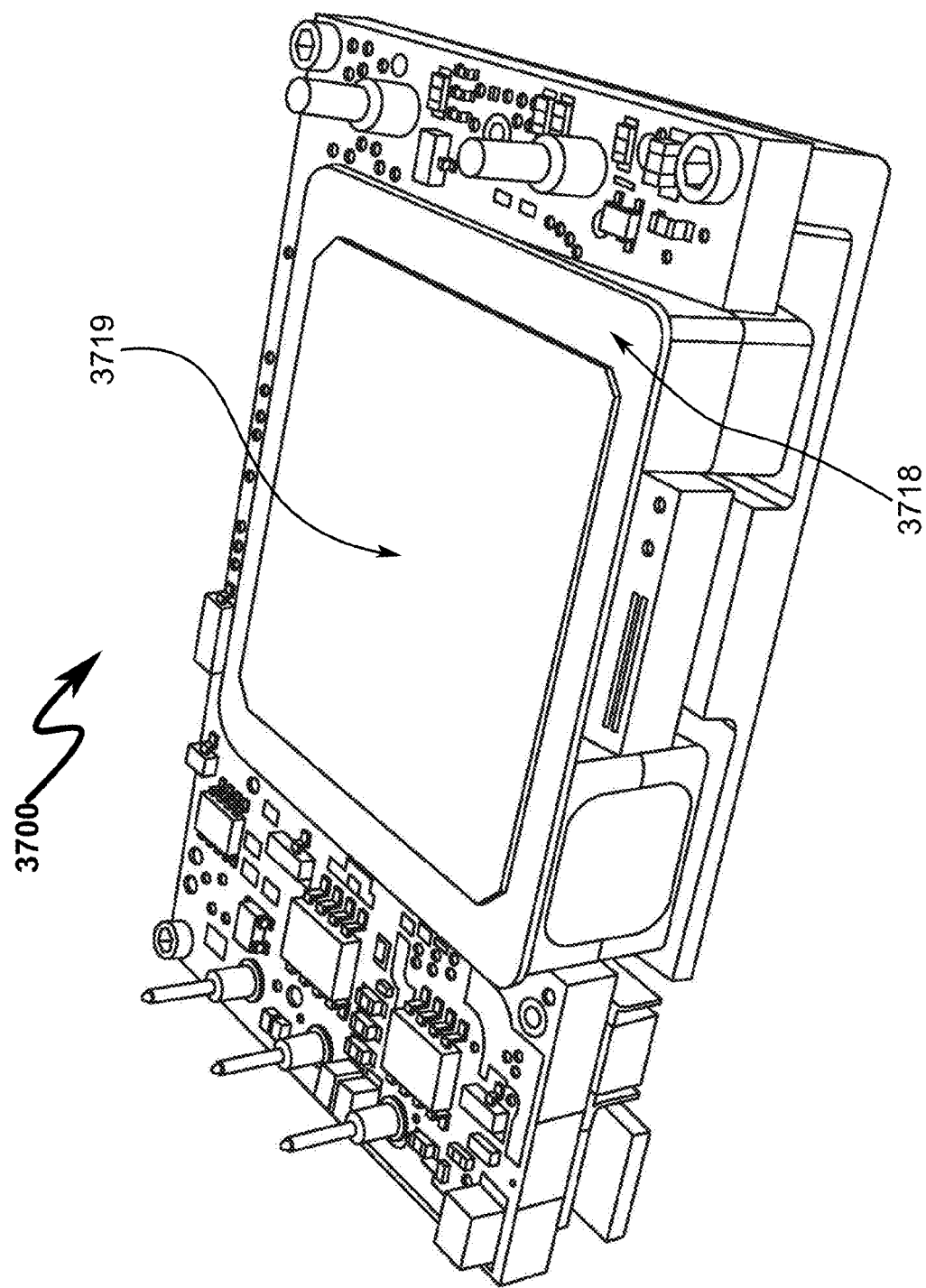
FIG. 37 illustrates a perspective assembled bottom-side view of a preferred exemplary invention embodiment in which a bottom-side thermal enhancement plate is utilized to improve thermal conductivity between the heat source PCB and the heat sink PCB.

The present invention may incorporate, as an additional feature, a thermal enhancement plate, as generally depicted in FIG. 35 (3500), FIG. 36 (3600), and FIG. 37 (3700), that is mated to the bottom side of the heat source PCB assembly to permit improved thermal heat transfer from the heat source PCB to the heat sink PCB.

As generally illustrated in the side view of FIG. 35 (3500) and the perspective view of FIG. 36 (3600), the heat source PCB (3510, 3610) is electrically connected to the heat sink PCB (3520) using support pins (3511, 3611) as taught herein. Conductive filler material (thermally conductive spacer pads and/or contact paste) (3512) is used to thermally link the heat source PCB (3510) and/or its components to the thermally conductive plate (3514, 3614). In addition to this heat transfer mechanism, a lower thermal enhancement plate (3518, 3618, 3718) may utilize conductive filler material (thermally conductive spacer pads and/or contact paste) (3512) to thermally link the heat source PCB (3510, 3610) and/or its components to the heat sink PCB (3520) via a layer of phase change material (3519, 3619, 3719). In an exemplary embodiment, the conductive filler material (3512) is BERGQUIST model LF2000 and the phase change material (3519, 3619, 3719) is BERGQUIST model HF300G.

The thermal enhancement plate (3518, 3618, 3718) is electrically insulating, yet thermally conductive, and may be made of metal with an insulating coating or a ceramic. In certain applications, the thermal enhancement plate (3518, 3618, 3718) may be electrically conductive if it doesn't contact live metal on either the heat source PCB (3510, 3610) or the heat sink PCB (3520) and if there are no additional isolation requirements.

The phase change material (3519, 3619, 3719) serves as an interface between the thermal enhancement plate (3518, 3618, 3718) and the heat sink PCB (3520) and may be applied directly to components on the heat sink PCB (3520) as well as the thermal enhancement plate (3518, 3618, 3718). The phase change material (3519, 3619, 3719) wets to the heat sink PCB (3520) at a relatively low pressure and temperature to fill any gaps between the thermal enhancement plate (3518, 3618, 3718) and the heat sink PCB (3520).

It should be noted that the use of the thermal enhancement plate (3518, 3618, 3718) with or without the use of the phase change material (3519, 3619, 3719) may be used to set the spacing distance between the heat source PCB (3510, 3610) and the heat sink PCB (3520) in the same way that various embodiments of the support pins and/or spacer pads described herein may be used to set this board-to-board spacing distance. Thus, the thermal enhancement plate (3518, 3618, 3718), with or without the use of the phase change material (3519, 3619, 3719), may be used to define the seating plane of the heat source PCB (3510, 3610) with respect to the heat sink PCB (3520).

Thermal Conduction Methodologies (3800, 3900)

Thermal Conduction to Heat Sink PCB

The present invention promotes a holistic approach to heat transfer from the heat source PCB to the heat sink PCB. The basis for heat conduction between the heat source PCB and the heat sink PCB is the use of additional conduction paths that exhibit greater thermal conductivity than that provided by simple radiation or ambient air heat transfer. The following table illustrates the relative thermal conductivities of various materials as compared to ambient air:

| Materials | K(W/m° K) | K(W/in° C.) |
|---|---|---|
| Copper | 355 | 9 |
| Aluminum | 175 | 4.44 |
| FR4 | 0.25 | 0.0064 |
| Solder 63/67 | 39 | 1 |
| Air | 0.0275 | 0.0007 |

The significant fact to be observed from this data is that while a typical heat sink PCB may be constructed of FR4 (which is an electrical insulator), this material has a thermal conductivity which is approximately an order of magnitude greater than ambient air. Thus, significant thermal transfer can occur between the thermal enhancement plate and a heat sink PCB constructed of FR4 material, even if there are no copper traces on the surface of the heat sink PCB mating area.

Heat Sink PCB Topside Conductive Traces (3800)

Figure 38:
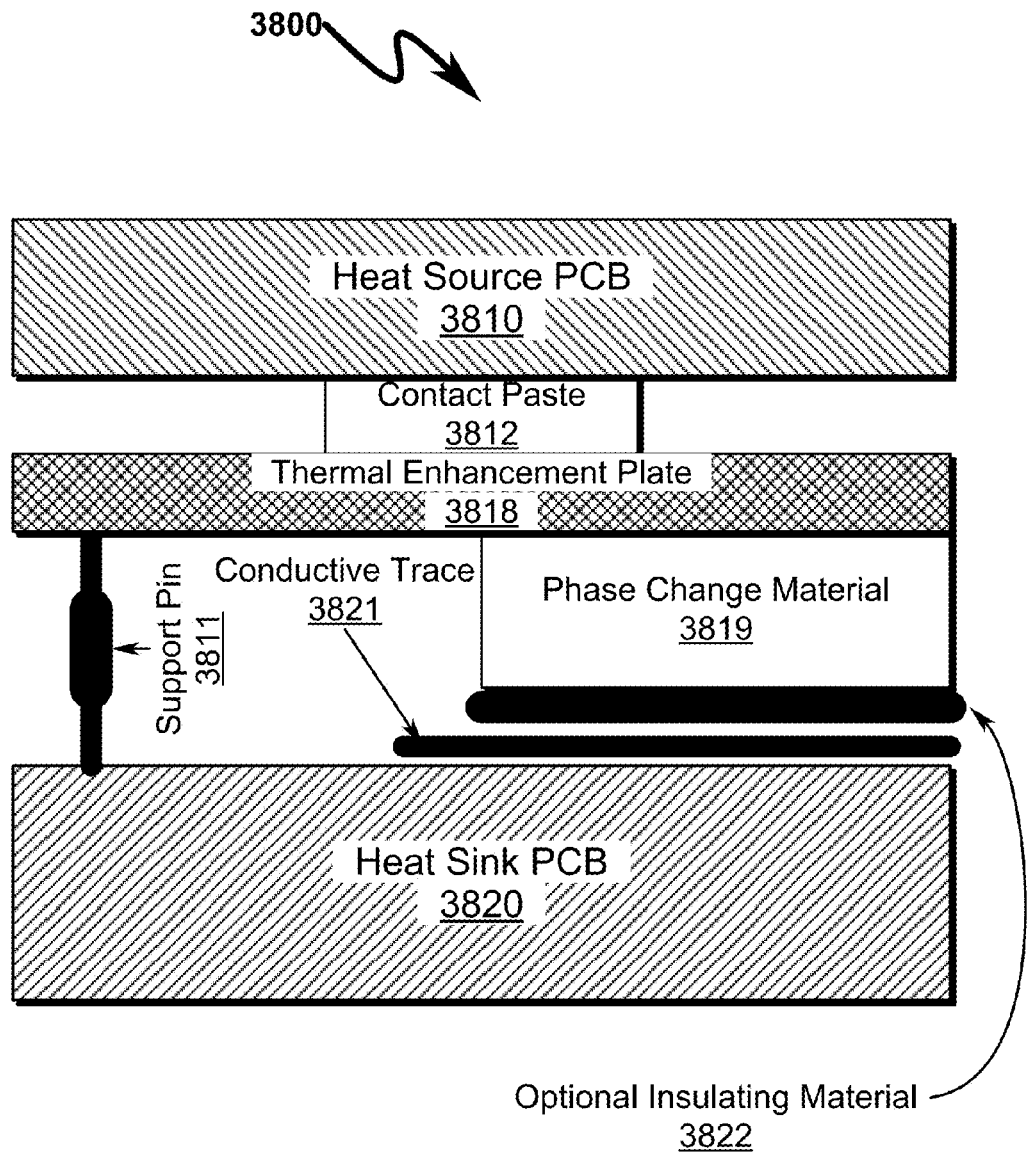
FIG. 38 illustrates a side view of a preferred exemplary invention embodiment in which a bottom-side thermal enhancement plate is utilized to improve thermal conductivity between the heat source PCB and the heat sink PCB having topside conductive traces.

As generally illustrated in FIG. 38 (3800), the use of the thermal enhancement plate (3818) in conjunction with the phase change material (3919) permits heat conduction from the heat source PCB (3810) through the contact paste (3812) through the thermal enhancement plate (3818) through the phase change material (3819) to a conductive trace (3821) on the heat sink PCB (3820). Since the conductive trace is typically comprised of copper, heat conduction to the remainder of the heat sink PCB (3820) is promoted by this configuration.

Note that in this context, an optional insulating material (3822) may be placed between the phase change material (3819) and the top of the heat sink PCB (3820) conductive trace (3821). This insulating material may have many configurations, including but not limited to ceramic, paper, MYLAR®, KAPTON®, FIBERGLASS®, or other known electrically insulating materials. Additionally, in some circumstances the thermal enhancement plate (with or without the optional insulating material (3822)) may be placed directly on top of the heat sink PCB (3820) with or without the use of the phase change material (3819).

Heat Sink PCB Internal Conductive Traces (3900)

Figure 39:
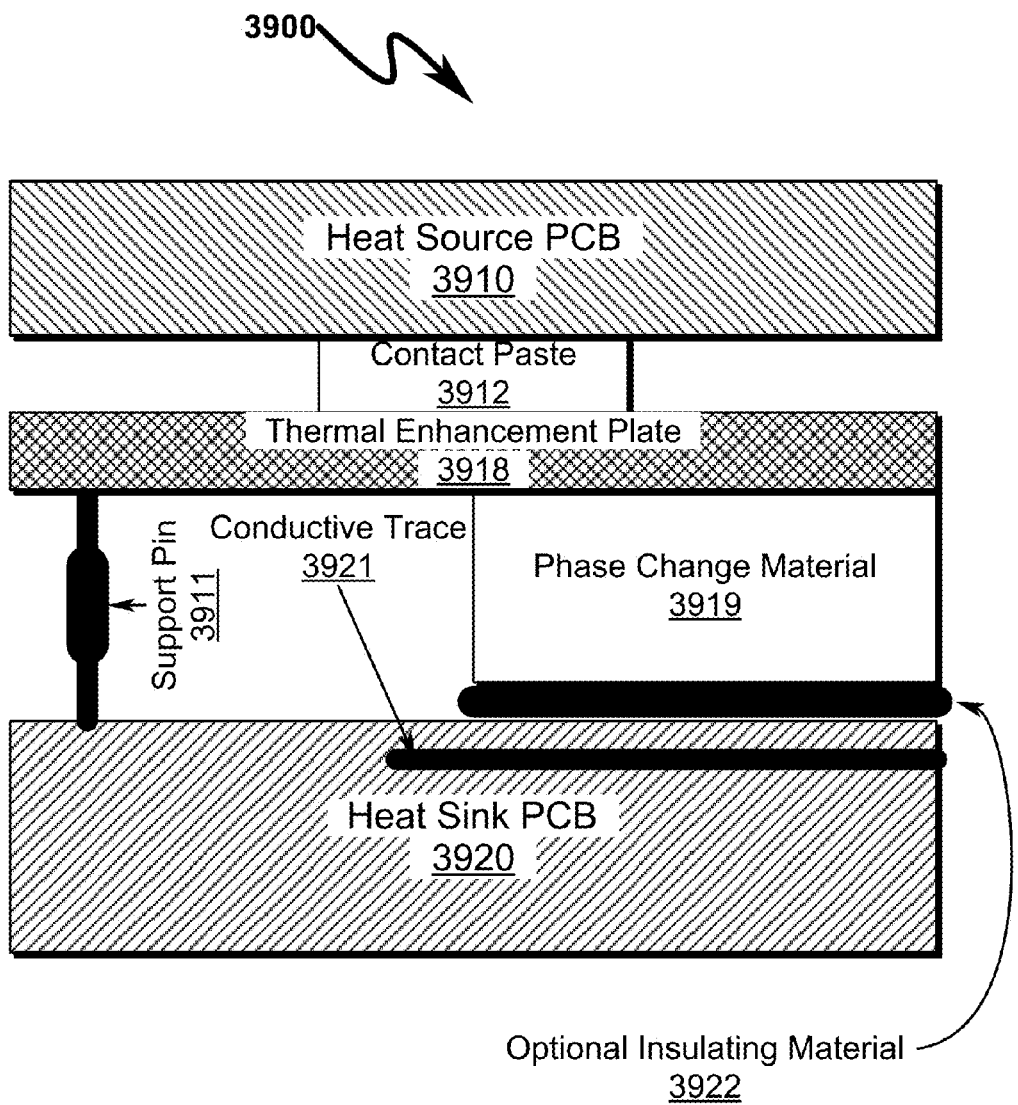
FIG. 39 illustrates a side view of a preferred exemplary invention embodiment in which a bottom-side thermal enhancement plate is utilized to improve thermal conductivity between the heat source PCB and the heat sink PCB having buried conductive traces.

As generally illustrated in FIG. 39 (3900), the conduction mechanism to the heat sink PCB (3920) does not necessarily require that the conductive trace (3921) be present on the top of the heat sink PCB (3920). Since the PCB material used for the heat sink PCB (3920) is thermally conductive, it may be used to promote heat conduction through the FR4 material at the surface of the PCB to an internal conductive trace (or power plane) and thus achieve significant improvements in overall thermal heat transfer from the heat source PCB (3910) to the heat sink PCB (3920).

As generally illustrated in FIG. 39 (3900), the use of the thermal enhancement plate (3918) in conjunction with the phase change material (3919) permits heat conduction from the heat source PCB (3910) through the contact paste (3912) through the thermal enhancement plate (3918) through the phase change material (3919) through the insulating top surface of the heat PCB (3920) to an inner conductive trace (3921) within the heat sink PCB (3920). Since the conductive trace is typically comprised of copper, heat conduction to the remainder of the heat sink PCB (3920) is promoted by this configuration.

Note that in this context, an optional insulating material (3922) may be placed between the phase change material (3919) and the top of the heat sink PCB (3920) to provide additional electrical isolation to the conductive trace (3921). Additionally, in some circumstances the thermal enhancement plate (with or without the optional insulating material (3922)) may be placed directly on top of the heat sink PCB (3920) with or without the use of the phase change material (3919).

Invention Variants Heat Flow Summary (4000)

Figure 40:
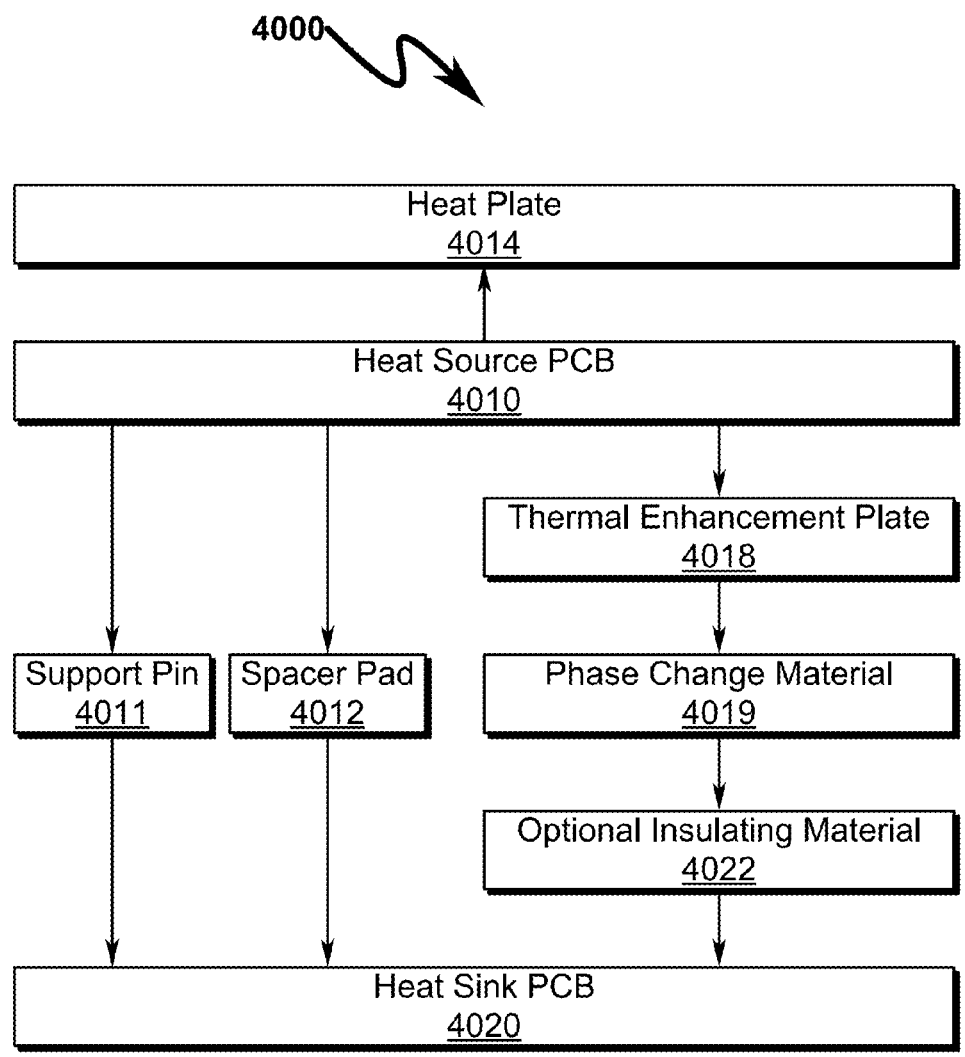
FIG. 40 illustrates a system block diagram depicting system embodiment variations of the present invention and their related heat flows.

A schematic diagram illustrating how heat flows within various combinations of various invention embodiments is generally illustrated in FIG. 40 (4000), where the heat source PCB (4010) transfers heat to a heat plate (4014) through thermally conductive filler material (spacer pads or contact paste). Thermal conduction between the heat source PCB (4010) to the heat sink PCB (4020) may occur through support pins (4011), spacer pads (4012), thermal enhancement plate (4018) (with or without phase change material (4019) and/or optional electrically insulating material (4022)). Any of these thermal contact interfaces may be optionally optimized via the use of thermal contact paste and/or thermally conductive spacer pads.

System Summary

The present invention system anticipates a wide variety of variations in the basic theme of construction, but can be generalized as a thermal management system comprising:
 (a) support pin;
 (b) spacer pad; and
 (c) contact paste;
 wherein
 the support pin comprises metal;
 the spacer pad comprises low electrical conductivity material;
 the contact paste comprises a thermally conductive pliable material that has low electrical conductivity;
 the support pin comprises a cylindrical shaft further comprising:
  (a) top heat source PCB insertion shaft further comprising a top registration chamfer;
  (b) bottom heat sink PCB insertion shaft further comprising a bottom registration chamfer; and
  (c) center support shaft section further comprising:
   top and bottom self-centering inclined peripheral edges, and
   one or more longitudinal gassing vents;
 the top and bottom self-centering inclined peripheral edges of the support pin, when making contact with the surface of a heat source PCB and a heat sink PCB, create a low electrical impedance conduction path from the heat source PCB to the heat sink PCB through the support pin;
 the top and bottom self-centering inclined peripheral edges of the support pin, when making contact with the surface of a heat source PCB and a heat sink PCB, create a low thermal impedance conduction path from the heat source PCB to the heat sink PCB through the support pin;
 the spacer pad, when making contact with the bottom-side components attached to the heat source PCB and the top-side components attached to the heat sink PCB, creates a low thermal impedance conduction path from the heat source PCB to the heat sink PCB through the bottom-side and the top-side components through the spacer pad;
 the spacer pad, when making contact with the bottom-side components attached to the heat source PCB and the top-side components attached to the heat sink PCB, fixes the minimum distance between the bottom-side components attached to the heat source PCB and the top-side components attached to the heat sink PCB;
 the spacer pad, when making contact with the bottom-side components attached to the heat source PCB and the top-side components attached to the heat sink PCB, sets the total height of the heat source PCB above the heat sink PCB; and
 the contact paste, when making contact with the top-side components of the heat source PCB and the bottom surface of a thermally conductive plate covering the heat source PCB, creates a low thermal impedance conduction path from the top-side components of the heat source PCB to the thermally conductive plate covering the heat source PCB through the contact paste.

This general system summary may be augmented by the various elements described herein to produce a wide variety of invention embodiments consistent with this overall design description.

Contact Paste Alternative System Summary

The present invention as embodied in a contact paste assembly alternative system anticipates a wide variety of variations in the basic theme of construction but can be generalized as a thermal management system comprising:
 (a) heat source PCB;
 (b) thermally conductive plate; and
 (c) contact paste;
 wherein
 the contact paste comprises a one-part, pliable, non-curable, thermally conductive material that has low electrical conductivity;
 the contact paste makes contact with the top-side components of the heat source PCB and the bottom surface of the thermally conductive plate covering the heat source PCB; and
 the contact paste creates a low thermal impedance conduction path from the top-side components of the heat source PCB to the thermally conductive plate covering the heat source PCB through the contact paste.

This general system summary may be augmented by the various elements described herein to produce a wide variety of invention embodiments consistent with this overall design description.

Support Pin Alternative System Summary

The present invention as embodied in a support pin assembly alternative system anticipates a wide variety of variations in the basic theme of construction but can be generalized as a thermal management system comprising:
- (a) heat source PCB; and
- (b) support pin;

wherein the support pin comprises metal;

the support pin comprises a cylindrical shaft further comprising:
- (a) top heat source PCB insertion shaft further comprising a top registration chamfer;
- (b) bottom heat sink PCB insertion shaft further comprising a bottom registration chamfer; and
- (c) center support shaft section further comprising:
  - top and bottom self-centering inclined peripheral edges, and
  - one or more longitudinal gassing vents;

the top and bottom self-centering inclined peripheral edges of the support pin, when making contact with the surface of the heat source PCB and a heat sink PCB, create a low electrical impedance conduction path from the heat source PCB to the heat sink PCB through the support pin; and the top and bottom self-centering inclined peripheral edges of the support pin, when making contact with the surface of the heat source PCB and a heat sink PCB, create a low thermal impedance conduction path from the heat source PCB to the heat sink PCB through the support pin.

This general system summary may be augmented by the various elements described herein to produce a wide variety of invention embodiments consistent with this overall design description.

Support Pin Combined Alternative System Summary

The present invention as embodied in a support pin assembly combined alternative system anticipates a wide variety of variations in the basic theme of construction, but can be generalized as a thermal management system comprising:
- (a) heat source PCB;
- (b) thermally conductive plate;
- (c) support pin; and
- (d) contact paste;

wherein the support pin comprises metal;

the support pin comprises a cylindrical shaft further comprising:
- (a) top heat source PCB insertion shaft further comprising a top registration chamfer;
- (b) bottom heat sink PCB insertion shaft further comprising a bottom registration chamfer; and
- (c) center support shaft section further comprising:
  - top and bottom self-centering inclined peripheral edges, and
  - one or more longitudinal gassing vents;

the top and bottom self-centering inclined peripheral edges of the support pin, when making contact with the surface of the heat source PCB and a heat sink PCB, create a low thermal impedance conduction path from the heat source PCB to the heat sink PCB through the support pin;

the contact paste comprises a one-part, pliable, non-curable, thermally conductive material that has low electrical conductivity;

the contact paste makes contact with the top-side components of the heat source PCB and the bottom surface of the thermally conductive plate covering the heat source PCB; and the contact paste creates a low thermal impedance conduction path from the top-side components of the heat source PCB to the thermally conductive plate covering the heat source PCB through the contact paste.

This general system summary may be augmented by the various elements described herein to produce a wide variety of invention embodiments consistent with this overall design description.

Spacer Pad Alternative System Summary

The present invention as embodied in a spacer pad assembly alternative system anticipates a wide variety of variations in the basic theme of construction but can be generalized as a thermal management system comprising:
- (a) heat source PCB;
- (b) thermally conductive plate;
- (c) spacer pad; and
- (d) contact paste;

wherein the spacer pad comprises low electrical conductivity material;

the spacer pad, when making contact with the bottom-side components attached to the heat source PCB and the top-side components attached to the heat sink PCB, creates a low thermal impedance conduction path from the heat source PCB to the heat sink PCB through the bottom-side and the top-side components through the spacer pad;

the spacer pad, when making contact with the bottom-side components attached to the heat source PCB and the top-side components attached to the heat sink PCB, fixes the minimum distance between the bottom-side components attached to the heat source PCB and the top-side components attached to the heat sink PCB;

the spacer pad, when making contact with the bottom-side components attached to the heat source PCB and the top-side components attached to the heat sink PCB, sets the total height of the heat source PCB above the heat sink PCB;

the contact paste comprises a one-part, pliable, non-curable, thermally conductive material that has low electrical conductivity;

the contact paste makes contact with the top-side components of the heat source PCB and the bottom surface of the thermally conductive plate covering the heat source PCB; and the contact paste creates a low thermal impedance conduction path from the top-side components of the heat source PCB to the thermally conductive plate covering the heat source PCB through the contact paste.

This general system summary may be augmented by the various elements described herein to produce a wide variety of invention embodiments consistent with this overall design description.

Thermal Enhancement Plate Combined System Summary

The present invention as embodied in a thermal enhancement plate assembly combined system anticipates a wide variety of variations in the basic theme of construction but can be generalized as a thermal management system comprising:

(a) heat source PCB;
(b) thermal enhancement plate;
(c) contact paste; and
(d) phase change material;
wherein
the thermal enhancement plate comprises a thermally conductive electrically insulating solid material;
the contact paste comprises a one-part, pliable, non-curable, thermally conductive material that has low electrical conductivity;
the contact paste is placed between and contacts the heat source PCB and the thermal enhancement plate;
the contact paste creates a low thermal impedance conduction path from the heat source PCB to the thermal enhancement plate;
the phase change material is placed between and contacts the thermal enhancement plate and a heat sink PCB;
the phase change material creates a low thermal impedance conduction path from the thermal enhancement plate to the heat sink PCB; and
the thermal enhancement plate, when making contact with the thermal paste and the phase change material, creates a low thermal impedance conduction path from the heat source PCB to the heat sink PCB.

This general system summary may be augmented by the various elements described herein to produce a wide variety of invention embodiments consistent with this overall design description.

Thermal Enhancement Plate Alternative System Summary

The present invention as embodied in a thermal enhancement plate assembly alternative system anticipates a wide variety of variations in the basic theme of construction but can be generalized as a thermal management system comprising:
(a) heat source PCB;
(b) thermal enhancement plate; and
(c) contact paste;
wherein
the thermal enhancement plate comprises a thermally conductive solid material;
the contact paste comprises a one-part, pliable, non-curable, thermally conductive material that has low electrical conductivity;
the contact paste is placed between and contacts the heat source PCB and the thermal enhancement plate;
the contact paste creates a low thermal impedance conduction path from the heat source PCB to the thermal enhancement plate; and
the thermal enhancement plate, when making contact with the thermal paste and the surface of a heat sink PCB, creates a low thermal impedance conduction path from the heat source PCB to the heat sink PCB.

This general system summary may be augmented by the various elements described herein to produce a wide variety of invention embodiments consistent with this overall design description.

Thermal Enhancement Plate Phase Change System Summary

The present invention as embodied in a thermal enhancement plate assembly phase change alternative system anticipates a wide variety of variations in the basic theme of construction but can be generalized as a thermal management system comprising:
(a) heat source PCB; and
(b) phase change material;
wherein
the phase change material makes contact with the surface of a heat sink PCB;
the phase change material makes contact with the surface of the heat source PCB or components on the surface of the heat source PCB; and
the phase change material creates a low thermal impedance conduction path from the heat source PCB to the heat sink PCB.

This general system summary may be augmented by the various elements described herein to produce a wide variety of invention embodiments consistent with this overall design description.

Method Summary

The present invention method anticipates a wide variety of variations in the basic theme of implementation but can be generalized as a thermal management method, the method operating in conjunction with a thermal management system comprising:
(a) support pin;
(b) spacer pad; and
(c) contact paste;
wherein
the support pin comprises metal;
the spacer pad comprises low electrical conductivity material;
the contact paste comprises a thermally conductive pliable material that has low electrical conductivity;
the support pin comprises a cylindrical shaft further comprising:
(a) top heat source PCB insertion shaft further comprising a top registration chamfer;
(b) bottom heat sink PCB insertion shaft further comprising a bottom registration chamfer; and
(c) center support shaft section further comprising:
top and bottom self-centering inclined peripheral edges, and
one or more longitudinal gassing vents;
the top and bottom self-centering inclined peripheral edges of the support pin, when making contact with the surface of a heat source PCB and a heat sink PCB, create a low thermal impedance conduction path from the heat source PCB to the heat sink PCB through the support pin;
the spacer pad, when making contact with the bottom-side components attached to the heat source PCB and the top-side components attached to the heat sink PCB, create a low thermal impedance conduction path from the heat source PCB to the heat sink PCB through the bottom-side and the top-side components through the spacer pad;
the spacer pad, when making contact with the bottom-side components attached to the heat source PCB and the top-side components attached to the heat sink PCB, fixes the minimum distance between the bottom-side components attached to the heat source PCB and the top-side components attached to the heat sink PCB;
the spacer pad, when making contact with the bottom-side components attached to the heat source PCB and the top-side components attached to the heat sink PCB, sets the total height of the heat source PCB above the heat sink PCB; and the contact paste, when making contact with the top-side components of the heat source PCB and the bottom surface of a thermally conductive plate covering the heat source PCB, creates a low thermal impedance conduction path from the top-side components of the heat source PCB to the thermally conductive plate covering the heat source PCB through the contact paste;
wherein the method comprises the steps of:
(1) inserting the bottom heat sink PCB insertion shaft into a hole in the heat sink PCB;
(2) soldering the bottom heat sink PCB insertion shaft to an electrical contact on the surface of the heat sink PCB.

This general method may be modified heavily depending on a number of factors with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

System/Method Variations

The present invention anticipates a wide variety of variations in the basic theme of construction. The examples presented previously do not represent the entire scope of possible usages. They are meant to cite a few of the almost limitless possibilities.

This basic system and method may be augmented with a variety of ancillary embodiments, including but not limited to:

An embodiment wherein the heat source PCB and the heat sink PCB are attached via one or more of the support pins using a soldering process selected from a group consisting of: reflow soldering, wave soldering, and hand soldering.

An embodiment wherein the thermally conductive plate creates a low thermal impedance conduction path from the heat source PCB to the thermally conductive plate through a thermally conductive fastener connecting the conductive plate to the heat source PCB.

An embodiment wherein the thermally conductive plate creates a low thermal impedance conduction path from the heat source PCB to the thermally conductive plate through a thermally conductive fastener connecting the conductive plate to the heat source PCB.

An embodiment wherein the spacer pad, when making contact with the bottom-side components attached to the heat source PCB and the top-side components attached to the heat sink PCB, creates a positive contact pressure thermal conduction path between the bottom-side components attached to the heat source PCB and the top-side components attached to the heat sink PCB.

An embodiment wherein the metal is selected from a group consisting of: copper, copper alloy, C11000 copper alloy, C11000 half-hard copper alloy, tin-plated-copper, tin-plated-copper-alloy, tin-over-nickel plated C11000 half-hard copper alloy, gold-over-nickel plated C11000 half-hard copper alloy, copper-tellurium alloy, and brass alloy.

An embodiment wherein the spacer pad is thermally conductive.

An embodiment wherein the spacer pad foam comprises adhesive surfaces.

An embodiment wherein the one or more longitudinal gassing vents extend the entire length of the cylindrical center support shaft comprising the support pin.

An embodiment wherein the one or more longitudinal gassing vents extend a portion of the length of the cylindrical center support shaft comprising the support pin.

An embodiment wherein the one or more longitudinal gassing vents are V-shaped.

An embodiment wherein the one or more longitudinal gassing vents are V-shaped at an angle greater than zero (0) degrees and less than or equal to 180 degrees with respect to the longitudinal axis of the cylindrical shaft.

An embodiment wherein the one or more longitudinal gassing vents are V-shaped and positioned at 90-degree angles surrounding the periphery of the cylindrical shaft.

An embodiment wherein the one or more longitudinal gassing vents are V-shaped and positioned at 120-degree angles surrounding the periphery of the cylindrical shaft.

An embodiment wherein the one or more longitudinal gassing vents are U-shaped.

An embodiment wherein the one or more longitudinal gassing vents are U-shaped and positioned at 90-degree angles surrounding the periphery of the cylindrical shaft.

An embodiment wherein the one or more longitudinal gassing vents are U-shaped and positioned at 120-degree angles surrounding the periphery of the cylindrical shaft.

An embodiment wherein the one or more longitudinal gassing vents comprise a single longitudinal gassing vent.

An embodiment wherein the one or more longitudinal gassing vents comprise two longitudinal gassing vents.

An embodiment wherein the one or more longitudinal gassing vents comprise three longitudinal gassing vents.

An embodiment wherein the one or more longitudinal gassing vents comprise four longitudinal gassing vents.

An embodiment wherein the top and bottom self-centering inclined peripheral edges of the support pin comprise an angle between 30 and 60 degrees with respect to the longitudinal axis of the support pin.

An embodiment wherein the top registration chamfer and the bottom registration chamfer comprise an angle between 30 and 60 degrees with respect to the longitudinal axis of the support pin.

An embodiment wherein the assembly distance between the heat source PCB and the heat sink PCB is determined by the hole diameter in the heat sink PCB in which the bottom heat sink PCB insertion shaft rests.

An embodiment wherein the contact paste comprises BERGQUIST COMPANY part number "LF2000" or equivalent.

An embodiment wherein the phase change material comprises BERGQUIST COMPANY part number "HF300G" or equivalent.

An embodiment wherein the thermal enhancement plate comprises an electrically insulating solid material.

An embodiment wherein the surface of the heat source PCB is covered with an insulating material.

An embodiment wherein the thermal enhancement plate directly contacts the surface of the heat sink PCB.

An embodiment wherein the phase change material contacts the surface of the heat sink PCB and either the surface of the heat source PCB or a component on the heat source PCB.

CONCLUSION

A thermal management system/method allowing efficient electrical/thermal attachment of heat sourcing PCBs to heat sinking PCBs using reflow/wave/hand soldering is disclosed. The disclosed system/method may incorporate a combination of support pins, spacer pads, and/or contact paste that mechanically attaches a heat sourcing PCB (and its associated components) to a heat sinking PCB such that thermal conductivity between the two PCBs can be optimized while simultaneously allowing controlled electrical conductivity between the two PCBs. Controlled electrical isolation between the two PCBs is provided for using spacer pads that may also be thermally conductive. Contact paste incorporated in some embodiments permits enhanced conductivity paths between the heat sourcing PCB, a thermally conductive plate mounted over the heat sourcing PCB, and the heat sinking PCB. The use of self-centering support pins incorporating out-gassing vents in some embodiments allows reflow/wave/hand soldering as desired.

What is claimed is:

1. A thermal management system comprising:
   (a) heat source PCB;
   (b) thermal enhancement plate; and
   (c) contact paste;
   wherein:
   said thermal enhancement plate comprises a thermally conductive solid material;
   said contact paste is placed between and contacts said heat source PCB and said thermal enhancement plate;
   said contact paste creates a low thermal impedance conduction path from said heat source PCB to said thermal enhancement plate; and
   said thermal enhancement plate, when making contact with said thermal paste and the surface of a heat sink PCB, creates a low thermal impedance conduction path from said heat source PCB to said heat sink PCB.

2. A thermal management system comprising:
   (a) heat source PCB;
   (b) thermal enhancement plate; and
   (c) contact paste;
   wherein:
   said thermal enhancement plate comprises a thermally conductive solid material;
   said contact paste is placed between and contacts said heat source PCB or components on the surface of said heat source PCB and said thermal enhancement plate;
   said contact paste creates a low thermal impedance conduction path from said heat source PCB or components on the surface of said heat source PCB to said thermal enhancement plate; and
   said thermal enhancement plate, when making contact with said thermal paste and the surface of a heat sink PCB, creates a low thermal impedance conduction path from said heat source PCB to said heat sink PCB.

3. The thermal management system of claim 2 wherein said contact paste comprises a thermally conductive material that has low electrical conductivity.

4. The thermal management system of claim 2 wherein said contact paste comprises a one-part, pliable, non-curable, thermally conductive material having low electrical conductivity.

5. The thermal management system of claim 2 wherein said contact paste comprises BERGQUIST COMPANY part number "LF2000" or equivalent.

6. The thermal management system of claim 2 wherein said contact paste comprises a thermally conductive liquid filling material that sets when cured.

7. The thermal management system of claim 2 wherein said contact paste comprises BERGQUIST COMPANY part number Gap Filler 2000 "GF2000" or equivalent material supplied as a two-component curing system that produces a soft elastomer having low electrical conductivity.

8. The thermal management system of claim 2 wherein said contact paste mechanically attaches said heat source PCB to said thermal enhancement plate.

9. The thermal management system of claim 2 wherein said contact paste mechanically attaches said heat source PCB to said heat sink PCB.

10. The thermal management system of claim 2 wherein said thermal enhancement plate comprises an electrically insulating solid material.

11. The thermal management system of claim 2 wherein said thermal enhancement plate comprises an electrically conducting solid material.

12. The thermal management system of claim 2 wherein said thermal enhancement plate comprises an electrically conducting solid material electrically isolated with an insulating covering.

13. The thermal management system of claim 2 wherein said heat source PCB and said heat sink PCB are attached via one or more support pins using a soldering process selected from a group consisting of: reflow soldering, wave soldering, and hand soldering.

14. The thermal management system of claim 2 further comprising phase change material wherein:
   said phase change material is placed between and contacts said thermal enhancement plate and said heat sink PCB; and
   said phase change material creates a low thermal impedance conduction path from said thermal enhancement plate to said heat sink PCB.

15. The thermal management system of claim 14 wherein said phase change material comprises BERGQUIST COMPANY part number "HF300G" or equivalent.

16. The thermal management system of claim 2 further comprising phase change material wherein:
   said phase change material makes contact with the surface of said heat sink PCB;
   said phase change material makes contact with the surface of said heat source PCB; and
   said phase change material creates a low thermal impedance conduction path from said heat source PCB to said heat sink PCB.

17. The thermal management system of claim 2 further comprising phase change material wherein:
   said phase change material makes contact with the surface of said heat sink PCB;
   said phase change material makes contact with the surface of said heat source PCB or components on the surface of said heat source PCB; and
   said phase change material creates a low thermal impedance conduction path from said heat source PCB or components on the surface of said heat source PCB to said heat sink PCB.

18. The thermal management system of claim 17 wherein said phase change material comprises BERGQUIST COMPANY part number "HF300G" or equivalent.

19. The thermal management system of claim 18 wherein said heat source PCB and said heat sink PCB are attached via one or more support pins using a soldering process selected from a group consisting of: reflow soldering, wave soldering, and hand soldering.

20. A thermal management system comprising:
   (a) heat source PCB;
   (b) thermal enhancement plate; and
   (c) contact paste;
   wherein:
   said thermal enhancement plate comprises a thermally conductive solid material;

said contact paste is placed between and contacts said heat source PCB or components on the surface of said heat source PCB and said thermal enhancement plate;

said contact paste creates a low thermal impedance conduction path from said heat source PCB or components on the surface of said heat source PCB to said thermal enhancement plate; and said thermal enhancement plate, when making contact with said thermal paste and the surface of a heat sink PCB, creates a low thermal impedance conduction path from said heat source PCB to said heat sink PCB;

said heat source PCB and said heat sink PCB are attached via one or more support pins wherein:

said one or more support pins comprises metal;

said one or more support pins each comprises a unitary solid cylindrical shaft further comprising:
(a) solid top heat source PCB insertion shaft further comprising a top registration chamfer;
(b) solid bottom heat sink PCB insertion shaft further comprising a bottom registration chamfer; and
(c) solid center support shaft section further comprising:
  top and bottom self-centering inclined peripheral edges; and
  one or more longitudinal gassing vents formed only on the outer surface of said solid center support shaft;

said top heat source PCB insertion shaft and said bottom heat sink PCB insertion shaft have cylindrical diameters less than the diameter of said center support shaft section;

said top heat source PCB insertion shaft, said bottom heat sink PCB insertion shaft, and said center support shaft section form a single solid unitary structure having no voids along their common cylindrical axis;

said top and bottom self-centering inclined peripheral edges of each of said one or more support pins, when making soldered contact with the surface of said heat source PCB and said heat sink PCB, create a low thermal impedance conduction path from said heat source PCB to said heat sink PCB through each of said one or more support pins and soldered connections on said top and bottom self-centering inclined peripheral edges of each of said one or more support pins; and said one or more support pins are configured to float within plated-through holes present on said heat source PCB and said heat sink PCB during a soldering process used to form said soldered contact.

21. A thermal management system comprising:
(a) heat source PCB;
(b) thermal enhancement plate;
(c) contact paste; and
(d) phase change material;
wherein:
said thermal enhancement plate comprises a thermally conductive solid material;

said contact paste is placed between and contacts said heat source PCB or components on the surface of said heat source PCB and said thermal enhancement plate;

said contact paste creates a low thermal impedance conduction path from said heat source PCB or components on the surface of said heat source PCB to said thermal enhancement plate; and said thermal enhancement plate, when making contact with said thermal paste and the surface of a heat sink PCB, creates a low thermal impedance conduction path from said heat source PCB to said heat sink PCB;

said phase change material makes contact with the surface of said heat sink PCB;

said phase change material makes contact with the surface of said heat source PCB or components on the surface of said heat source PCB; and said phase change material creates a low thermal impedance conduction path from said heat source PCB or components on the surface of said heat source PCB to said heat sink PCB;

said heat source PCB and said heat sink PCB are attached via one or more support pins wherein:

said one or more support pins comprises metal;

said one or more support pins each comprises a unitary solid cylindrical shaft further comprising:
(a) solid top heat source PCB insertion shaft further comprising a top registration chamfer;
(b) solid bottom heat sink PCB insertion shaft further comprising a bottom registration chamfer; and
(c) solid center support shaft section further comprising:
  top and bottom self-centering inclined peripheral edges; and
  one or more longitudinal gassing vents formed only on the outer surface of said solid center support shaft;

said top heat source PCB insertion shaft and said bottom heat sink PCB insertion shaft have cylindrical diameters less than the diameter of said center support shaft section;

said top heat source PCB insertion shaft, said bottom heat sink PCB insertion shaft, and said center support shaft section form a single solid unitary structure having no voids along their common cylindrical axis;

said top and bottom self-centering inclined peripheral edges of each of said one or more support pins, when making soldered contact with the surface of said heat source PCB and said heat sink PCB, create a low thermal impedance conduction path from said heat source PCB to said heat sink PCB through each of said one or more support pins and soldered connections on said top and bottom self-centering inclined peripheral edges of each of said one or more support pins; and said one or more support pins are configured to float within plated-through holes present on said heat source PCB and said heat sink PCB during a soldering process used to form said soldered contact.

* * * * *